(12) United States Patent
Naito

(10) Patent No.: US 10,418,441 B2
(45) Date of Patent: Sep. 17, 2019

(54) SEMICONDUCTOR DEVICE AND METHOD FOR MANUFACTURING THE SEMICONDUCTOR DEVICE

(71) Applicant: FUJI ELECTRIC CO., LTD., Kawasaki-shi (JP)

(72) Inventor: Tatsuya Naito, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/071,185

(22) Filed: Mar. 15, 2016

(65) Prior Publication Data

US 2016/0197143 A1 Jul. 7, 2016

Related U.S. Application Data

(63) Continuation of application No. PCT/JP2014/079995, filed on Nov. 12, 2014.

(30) Foreign Application Priority Data

Dec. 16, 2013 (JP) ................................. 2013-259649
Feb. 17, 2014 (JP) ................................. 2014-027896

(51) Int. Cl.
*H01L 29/06* (2006.01)
*H01L 29/36* (2006.01)
(Continued)

(52) U.S. Cl.
CPC .... *H01L 29/0696* (2013.01); *H01L 21/26513* (2013.01); *H01L 29/063* (2013.01);
(Continued)

(58) Field of Classification Search
CPC ............. H01L 29/0696; H01L 29/0649; H01L 21/26513; H01L 29/0619; H01L 29/063;
(Continued)

(56) References Cited

U.S. PATENT DOCUMENTS 5,329,142 A 7/1994 Kitagawa et al.
5,751,024 A 5/1998 Takahashi
(Continued)

FOREIGN PATENT DOCUMENTS

CN 1052342 C 5/2000
JP H05-243561 A 9/1993
(Continued)

*Primary Examiner* — Allen L Parker
*Assistant Examiner* — Charles N Ausar-El
(74) *Attorney, Agent, or Firm* — Rabin & Berdo, P.C.

(57) ABSTRACT

A plurality of trenches is provided in a stripe shape extending in a direction parallel to a substrate front surface to a predetermined depth in a depth direction. A gate electrode is provided inside each trench, with a gate insulating film interposed there between. In mesa regions separated by the trenches, p-Type base regions at an emitter potential are provided over the entire surface layer on the substrate front surface side. Inside the p-type base regions, $n^+$-type emitter regions are provided dispersedly at a predetermined interval in the longitudinal direction of the trenches. A p-type collector layer and an $n^+$-type buffer layer are provided in this order on the surface layer of the substrate back surface. The thickness of the $n^+$-type buffer layer is substantially equal to or larger than the thickness of an $n^-$-type drift layer. As a result, switching losses are reduced while maintaining an ON voltage.

18 Claims, 37 Drawing Sheets

(51) Int. Cl.
*H01L 29/739* (2006.01)
*H01L 29/66* (2006.01)
*H01L 21/265* (2006.01)
*H01L 29/08* (2006.01)
*H01L 29/167* (2006.01)
*H01L 29/40* (2006.01)
*H01L 29/423* (2006.01)
*H01L 29/78* (2006.01)

(52) U.S. Cl.
CPC ...... *H01L 29/0619* (2013.01); *H01L 29/0865* (2013.01); *H01L 29/167* (2013.01); *H01L 29/36* (2013.01); *H01L 29/402* (2013.01); *H01L 29/4236* (2013.01); *H01L 29/66348* (2013.01); *H01L 29/66734* (2013.01); *H01L 29/7397* (2013.01); *H01L 29/7811* (2013.01); *H01L 29/7813* (2013.01); *H01L 29/0847* (2013.01)

(58) Field of Classification Search
CPC ... H01L 29/0865; H01L 29/167; H01L 29/36; H01L 29/402; H01L 29/4236; H01L 29/66348; H01L 29/66734; H01L 29/7397; H01L 29/7811; H01L 29/7813
See application file for complete search history.

(56) References Cited

U.S. PATENT DOCUMENTS

| | | | |
|---|---|---|---|
| 5,977,570 A * | 11/1999 | Takahashi | H01L 29/0692 257/135 |
| 6,040,599 A * | 3/2000 | Takahashi | H01L 29/0696 257/139 |
| 6,211,018 B1 * | 4/2001 | Nam | H01L 29/66348 257/E21.384 |
| 6,441,406 B1 * | 8/2002 | Nakanishi | H01L 29/0696 257/119 |
| 6,482,681 B1 | 11/2002 | Francis et al. | |
| 6,610,572 B1 | 8/2003 | Takei et al. | |
| 6,737,705 B2 * | 5/2004 | Momota | H01L 29/7397 257/139 |
| 6,815,767 B2 * | 11/2004 | Nakamura | H01L 29/0696 257/330 |
| 7,514,750 B2 | 4/2009 | Mauder et al. | |
| 7,999,314 B2 * | 8/2011 | Tsuzuki | H01L 21/26586 257/335 |
| 8,084,814 B2 * | 12/2011 | Nemoto | H01L 29/32 257/330 |
| 8,133,785 B2 * | 3/2012 | Kaneko | H01L 29/0696 438/270 |
| 8,507,945 B2 | 8/2013 | Nakamura | |
| 8,686,493 B2 * | 4/2014 | Thorup | H01L 29/7806 257/328 |
| 9,666,046 B2 * | 5/2017 | Lim | G08B 13/19619 |
| 2001/0054738 A1 | 12/2001 | Momota et al. | |
| 2002/0048915 A1 | 4/2002 | Reznik | |
| 2002/0117712 A1 * | 8/2002 | Matsudai | H01L 29/66333 257/330 |
| 2006/0163649 A1 | 7/2006 | Otsuki | |
| 2006/0211189 A1 * | 9/2006 | Siemieniec | H01L 21/263 438/212 |
| 2006/0214221 A1 * | 9/2006 | Challa | H01L 21/3065 257/328 |
| 2007/0120181 A1 | 5/2007 | Ruething et al. | |
| 2008/0001257 A1 * | 1/2008 | Schulze | H01L 29/7396 257/565 |
| 2009/0014754 A1 * | 1/2009 | Yoshikawa | H01L 29/7397 257/139 |
| 2009/0035900 A1 * | 2/2009 | Thorup | H01L 29/66727 438/237 |
| 2011/0204485 A1 * | 8/2011 | Momota | H01L 29/41766 257/621 |
| 2012/0049902 A1 * | 3/2012 | Corona | H01L 21/02381 327/109 |
| 2012/0267681 A1 * | 10/2012 | Nemoto | H01L 21/263 257/139 |
| 2012/0313139 A1 | 12/2012 | Matsuura et al. | |
| 2013/0001681 A1 * | 1/2013 | Sin | H01L 29/7813 257/330 |
| 2013/0037853 A1 * | 2/2013 | Onozawa | H01L 29/0661 257/139 |
| 2013/0049105 A1 * | 2/2013 | Omori | H01L 21/26586 257/330 |
| 2013/0306983 A1 * | 11/2013 | Nakano | H01L 29/0623 257/76 |
| 2014/0217464 A1 | 8/2014 | Higuchi et al. | |
| 2014/0246750 A1 * | 9/2014 | Takishita | H01L 21/263 257/493 |
| 2014/0246755 A1 * | 9/2014 | Yoshimura | H01L 29/32 257/617 |
| 2014/0299915 A1 | 10/2014 | Kouno et al. | |
| 2014/0374793 A1 * | 12/2014 | Miyazaki | H01L 21/265 257/139 |
| 2017/0098700 A1 * | 4/2017 | Yamashita | H01L 29/407 |
| 2017/0330877 A1 * | 11/2017 | Hikasa | H01L 29/7841 |

FOREIGN PATENT DOCUMENTS

| | | |
|---|---|---|
| JP | H08-316479 A | 11/1996 |
| JP | H11-345969 A | 12/1999 |
| JP | 2001-160559 A | 6/2001 |
| JP | 2001-217419 A | 8/2001 |
| JP | 2001-308327 A | 11/2001 |
| JP | 2002-261282 A | 9/2002 |
| JP | 2002-532885 A | 10/2002 |
| JP | 2003-347549 A | 12/2003 |
| JP | 3684962 B2 | 8/2005 |
| JP | 2006-173297 A | 6/2006 |
| JP | 2006-210547 A | 8/2006 |
| JP | 2007-134714 A | 5/2007 |
| JP | 2007-258363 A | 10/2007 |
| JP | 4128777 B2 | 7/2008 |
| JP | 2012-256628 A | 12/2012 |
| JP | 2013-084922 A | 5/2013 |
| JP | 2013-138172 A | 7/2013 |
| WO | WO 2009-122486 A1 | 10/2009 |
| WO | WO 2013-046578 A1 | 4/2013 |

* cited by examiner

SEMICONDUCTOR DEVICE AND METHOD FOR MANUFACTURING THE SEMICONDUCTOR DEVICE

CROSS-REFERENCE TO RELATED APPLICATION(S)

This non-provisional application for a U.S. patent is a Continuation of International Application PCT/JP2014/079995 filed Nov. 12, 2014, which claims priority from JP PA 2013-259649 filed Dec. 16, 2013, and JP PA 2014-027896 filed Feb. 17, 2014, the entire contents of all of which are hereby incorporated by reference.

BACKGROUND OF THE INVENTION

1. Field of the Invention

The present invention relates to a semiconductor device and to a method for manufacturing a semiconductor device.

2. Background of the Related Art

In the process of developing electric power converters with reduced electric power consumption, power devices that play a key role in the electric power converters are expected to exhibit reduced electric power consumption. Among the power devices, the use of IGBTs (Insulated Gate Bipolar Transistors) of a voltage drive type, which realize a low ON voltage by a conductivity modulation effect and can be easily current-controlled with a voltage applied to the insulated gate, has already been established.

Due to a large number of modifications that have been introduced, the performance of IGBTs has been improved. The performance of IGBTs, as referred to herein, is the ability to hold a voltage and entirely cut off a current when switched OFF, and also the ability to function as a switch that allows a current to flow with as small a voltage drop as possible (that is, with as low an ON resistance as possible) when switched ON. Characteristics of IGBTs are described hereinbelow.

Initially, the trade-off in IGBT performance will be explained. There is an antimony relationship (that is, a trade-off relationship) between the maximum voltage that can be held by an IGBT, that is, the value of a breakdown voltage, and a voltage drop (ON voltage) when the transistor is switched ON, and the ON voltage increases in the IGBT with a high breakdown voltage. Critical values of such tradeoff relationship are eventually determined by physical properties of silicon. Design improvements, such as prevention of the occurrence of local electric field concentration during voltage holding, are needed to maximize the trade-off.

The trade-off relationship between the ON voltage and the switching losses (in particular, turn-off losses) is another important indicator representing the performance of IGBTs. Since the IGBT is a switching device, ON-to-OFF and OFF-to-ON operations are performed. Large losses occur at the instant of such a switching operation. In the IGBTs with a low ON voltage, the turn-off is typically delayed and, therefore, the turn-off losses are large. The IGBT performance can be enhanced by improving the aforementioned trade-off relationships. The turn-on losses also strongly depend on the characteristics of a reflux diode which is used in combination with the IGBT.

Optimizing the internal excess carrier distribution when the IGBT is in the ON state is an effective method for optimizing the trade-off relationship between the ON voltage and turn-off losses (referred to hereinbelow as an ON voltage-turn-off losses relationship). The excess carrier amount may be increased to lower the resistance value of a drift layer in order to reduce the ON voltage. However, at the time of turn-off, all of the excess carriers need to be swept out to the outside of the device, or annihilated by electron-hole recombination. For this reason, where the excess carrier amount is increased, the turn-off losses increase. Therefore, the turn-off losses may be minimized at the same ON voltage in order to optimize this trade-off relationship.

In order to realize the optimum trade-off, the ratio of carrier concentration at the emitter side and collector side may be set to about 1:5 by decreasing the carrier concentration on the collector side and also increasing the carrier concentration on the emitter side. Furthermore, the average carrier concentration in the drift layer may be increased by maintaining as high a carrier lifetime in the drift layer as possible.

When the IGBT is turned off, the depletion layer expands from the pn junction on the emitter side into the drift layer and advances toward the collector layer on the back side. At this time, the holes, from among the excess carriers in the drift layer, are drawn by an electric field from the depletion layer end. An electron excess state is thus obtained, and the excess electrons are injected into the p-type collector layer through a neutral region. Further, since the pn junction of the collector side is somewhat biased forward, holes are reverse injected in response to the injected electrons. Those reverse injected holes merge with the aforementioned holes drawn by the electric field and enter the depletion layer.

In macroscopic consideration based on the device terminal voltage, the contribution of the current flowing before the voltage-emitter voltage stops rising, that is, while the voltage rises, to losses represented by a product of voltage and current (=voltage×current) is less than that of the electric current flowing after the voltage stops rising. It follows from above that the turn-off losses are less with the carrier distribution which has been shifted to the emitter side by the below-described IE (Injection Enhancement) effect than with the carrier distribution shifted to the collector side under the conditions of a large ratio of carriers drawn by a low voltage and the same ON voltage.

The total amount of impurities in the collector layer may be reduced to lower the carrier concentration on the collector side. This is, by itself, not particularly difficult. However, in an IGBT with a low rated breakdown voltage, such as 600 V, a wafer with a thickness of about 100 μm or less needs to be handled in the manufacturing process in order to reduce the total amount of impurities in the collector layer, which is difficult from the standpoint of production technology. Meanwhile, the mechanism for increasing the carrier concentration on the emitter side is called the IE effect.

A HiGT (High Conductivity IGBT) structure in which a high-concentration n-type region has been inserted such as to surround a p-type base region of a planar gate structure has been suggested as an emitter structure (cell) with a strong IE effect (see, for example, Japanese Patent Application Publication No. 2003-347549 (Patent Literature 1) and Japanese Translation of PCT Application No. 2002-532885 (Patent Literature 2). Further, a CSTBT (Carrier Stored Trench-Gate Bipolar Transistor) structure and an IEGT (Injection Enhanced Gate Transistor) structure in which n-type regions with a concentration higher than that of an n$^-$-type drift layer are inserted in mesa regions separated by trenches (referred to hereinbelow as the mesa regions between the trenches) in the surface layer on the substrate front surface side in a trench-gate structure (see, for example, Japanese Patent Application Publication No. H08-316479 (Patent Literature 3) and Japanese Patent Application Publication No. H05-243561 (Patent Literature 4). The IE effect is typically stronger in a trench-gate device than in a planar-gate device.

The IE effect is described, for example, in Patent Literature 4, and it is well known that this effect makes it possible to realize an optimum carrier distribution shifted to the emitter side due to the IEGT structure, thereby realizing a limit characteristic close to a diode ON voltage. The IEGT structure, as referred to herein, is a structure in which partial surfaces of the $n^+$-type emitter regions and p-type base regions are covered with an insulating film, thereby reducing the surface area of contact (electric contact portion) of the $n^+$-type emitter regions and p-type base regions with the emitter electrode. Thus, a p-type base region (referred to hereinbelow as floating p-region) which is not connected to the emitter electrode and has a floating potential is provided in the mesa region between the trenches.

The operation of IEGT is basically the same as that of the trench-gate IGBT, but the ON voltage of the IEGT can be reduced with respect to that of the usual trench-gate IGBT. In the IEGT, holes present close to the p-type base region inside the $n^-$-type drift layer are difficult to eject to the emitter electrode in a portion where the emitter electrode is not in contact with the $n^+$-type emitter region and p-type base region. Therefore, holes are accumulated in this portion. As a result, the amount of electrons injected to the $n^-$-type drift layer relatively increases and the carrier concentration distribution in the $n^-$-type drift layer can be close that of a diode.

However, in a power device, a high-speed switching characteristic is also required in addition to a low ON voltage, and the improvement of a high-speed switching characteristic is also an important problem. A device has also been suggested in which the width of the mesa region between the trenches (the width in the arrangement direction of the trenches; referred to hereinbelow simply as "width") is reduced, the p-type base region inside the mesa region is divided into a plurality of regions to reduce the occupation ratio of the base region in the cell pitch, and a certain limited region inside the mesa region is taken as an emitter structure to reduce switching losses while maintaining the IE effect (see, for example, Patent Literature 5).

In Japanese Patent Application Publication No. 2006-210547 (Patent Literature 5), although no floating p region is provided in the mesa region between the trenches, a sufficient breakdown voltage is obtained by optimizing the cell pitch. Further, since the floating p region is not provided, the problem of the controllability of current variation rate (di/dt) of the collector current being degraded by the increase in potential of the floating p region at the turn-on time is eliminated. The structure of the conventional trench-gate IGBT described in Patent Literature 5 will be explained hereinbelow with reference to FIG. 24. FIG. 24 is a perspective view illustrating the structure of the conventional trench-gate IGBT. FIG. 24 corresponds to FIG. 1 in Patent Literature 5.

As depicted in FIG. 24, p-type base regions 103 are selectively provided in the surface layer on the front surface (surface on an $n^-$-type drift layer 102 side) of a semiconductor substrate constituted by a $p^+$-type collector layer 101 and the $n^-$-type drift layer 102. Further, $n^+$-type emitter regions 104 are selectively provided inside the p-type base regions 103. Trenches 105 reaching the $n^-$-type drift layer 102 through the $n^+$-type emitter regions 104 and the p-type base regions 103 are provided in the depth direction (vertical direction) from the substrate front surface. In the mesa regions between the trenches 105, the p-type base regions 103 are dispersedly arranged in the direction (referred to hereinbelow as longitudinal direction) perpendicular to the arrangement direction of the trenches 105, and the p-type base regions 103 and the $n^-$-type drift layer 102 appear alternately.

A gate electrode 107 is provided inside each trench 105, with a gate insulating film 106 interposed therebetween. An interlayer insulating film (not depicted in the figure) is covered on the surface of the gate electrodes 107 and the $n^-$-type drift layer 102 of the mesa regions. A plurality of contact holes that expose a plurality of p-type base regions 103 and are arranged at a predetermined interval in the longitudinal direction of the trenches 105 is provided in the interlayer insulating film. An emitter electrode (not depicted in the figure) is connected to the $n^+$-type emitter regions 104 and the p-type base regions 103 through the contact holes of the interlayer insulating film. Hatched portions denoted by the reference numeral 108 are contacts of the $n^+$-type emitter regions 104 and the p-type base regions 103 with the emitter electrode. A collector electrode 109 is provided on a substrate back surface (surface on the $p^+$-type collector layer 101 side).

In a planar gate structure, the ON voltage decreases when the occupation ratio of the base region in the cell pitch is decreased, as indicated in Patent Literature 5. This is apparently due to a strong effect in which, in addition to the increase in the ratio of a pin (p-intrinsic-n) diode region, the current density in the transverse direction (direction perpendicular to the depth direction) close to the front surface rises and voltage drop increases, thereby increasing the forward bias of the $n^+/n^-$ junction. The reason for the increase in the forward bias of the $n^+/n^-$ junction is that because the $n^+$ layer has a low resistance, the electric potential thereof is close to the emitter potential, but since the $n^-$ layer has a high resistance, the electric potential thereof is lifted by a large current.

Likewise, in a trench-gate structure, the IE effect can be increased by decreasing the ratio of pnp-BJT regions. For example, a p-type base region may be provided in a floating state in some of mesa regions in order to decrease the ratio of pnp-BJT regions. The IE effect is also increased when the trenches are made deeper and the trench bottoms are withdrawn from the pn junction between the p-type base region and the $n^-$-type drift layer. Another option for increasing the IE effect is to reduce the width of the mesa region. All of those results can be attributed to the increase in the density of hole current flowing in the mesa regions and strengthening of the forward bias of the $n^+/n^-$ junction created by voltage drop.

The pin diode region, as referred to herein, is a region between the base regions in which the $n^-$-type drift layer and p-type collector layer are arranged in this order in the depth direction from the front surface. A pin diode constituted by an $n^+$ electron accumulation layer (cathode) induced in the region enclosed between the p-type base regions in the $n^-$-type drift layer in the ON state, the $n^-$-type drift layer, and a p-type collector layer (anode) on the back side is formed in the pin diode region. The $n^+/n^-$ junction, as referred to herein, is a junction between the $n^+$ electron accumulation layer and the $n^-$-type drift layer constituting the pin diode. The pnp-BJT region, as referred to herein, is a region in which the p-type base region, $n^-$-type drift layer, and p-type collector layer are arranged in this order in the depth direction from the front surface.

The electron concentration on the emitter side increases exponentially according to the forward bias applied to the $n^+/n^-$ junction. As mentioned hereinabove, a voltage drop caused by a large current can be used as a means for increasing the forward bias amount. As indicated in Patent Literature 1 to 3, the forward bias amount can be also increased by increasing the $n^+$ concentration. However, since the HiGT structure described in Patent Literature 1 and 2 is a planar gate structure, where the concentration of impurities in the $n^+$-type buffer layer on the front surface side becomes too high, the forward breakdown voltage is greatly decreased.

Meanwhile, in the CSTBT structure described in Patent Literature 3, the $n^+$-type buffer layer (high-concentration n-type region provided in the mesa region) on the front surface side is enclosed between gate insulating films of trench side walls and connected to a polysilicon potential through the gate insulating film. As a result, when the forward voltage is held, that is, in a blocking mode, the $n^+$-type buffer layer on the front surface side is depleted not only by the pn junction between the buffer layer and the p-type base region, but also from the interface with the gate insulating films of the trench side walls on both sides, and therefore entirely depleted at a low forward bias. Therefore, although the $n^+$-type buffer layer on the front surfaced side has a high impurity concentration, the electric field inside thereof is relaxed. Even when the forward bias is further increased, the electric field in the mesa region between the trenches is relaxed. As a result, a local peak field is unlikely to appear.

Thus, the characteristic feature of the CSTBT structure is that the forward breakdown voltage is unlikely to decrease even when the IE effect is increased. The reason therefor is that the $n^+$-type buffer layer on the front surface side forms a diffusion potential with the $n^-$-type drift layer and serves as a potential barrier for holes, thereby increasing the concentration of holes in the $n^-$-type drift layer. Another reason is that since a forward bias is applied between the $n^+$-type buffer layer and the $n^-$-drift layer on the front surface side, electrons are injected from the $n^+$-type buffer layer. Thus, where the $n^+$ layer has a high impurity concentration, the electron injection efficiency in the $n^+/n^-$ junction increases, and therefore the ratio of the electron current injected into the $n^-$-type layer to the hole current entering the $n^+$-type layer is increased.

Further, a device in which a p-type base region is separated by a plurality of trenches into portions in which $n^+$-type source regions have been provided and portions in which $n^+$-type source regions have not been provided, and an emitter electrode is short circuited to obtain an emitter potential in the portions of the p-type base region in which $n^+$-type source regions have not been provided has been suggested as a device in which the floating p region is not provided in the mesa regions between the trenches, see, for example, FIG. 7 of Japanese Patent Application Publication No. 2001-308327 (Patent Literature 6).

Further, the following device in which the occupation ratio of the base regions in the cell pitches is reduced has also been suggested. A region between the adjacent trench gates (gate electrodes provided inside the trenches) has an effective region corresponding to an emitter layer serving as an electron injection source for a drift layer and an ineffective region where no charge injection source is produced. The effective region is divided at a predetermined interval in the longitudinal direction of the trench gate, see, for example, Japanese Patent Application Publication No. 2013-084922 (Patent Literature 7).

In another suggested device, an n-type emitter layer and a p-type collector layer with a high impurity concentration are formed alternately along the longitudinal direction (channel width direction) of the trenches in contact with the side walls of the trenches inside the p-type base layer provided in the mesa regions between the trenches (see, for example, Japanese Patent Application Publication No. H11-345969 (Patent Literature 8). In yet another suggested device, $n^+$-type emitter layers are provided along the longitudinal direction of trenches in contact with the side walls of the trenches in mesa region between the adjacent trenches, see, for example, FIG. 1 of Japanese Patent Application Publication No. 2001-217419 (Patent Literature 9).

An IGBT (FS-IGBT) in which a FS (Field Stop) layer (buffer layer) with an impurity concentration higher than that in the drift layer is provided on the collector side inside the drift layer is well known as an IGBT with another structure with improved trade-off relationship between the ON voltage and switching losses (see, for example, Japanese Patent No. 3684962 (Patent Literature 10), Japanese Patent Application Publication No. 2001-160559 (Patent Literature 11), and Japanese Patent Application Publication No. 2007-134714 (Patent Literature 12). Patent Literature 10 and 11 disclose an FS-IGBT structure in which a field stop layer is arranged at a position in contact with the collector layer inside the drift layer. Patent Literature 12 discloses an FS-IGBT structure in which a field stop layer is arranged at a position set apart from the collector layer.

In the FS-IGBT, since the field stop layer is provided, the injection of carriers from the collector side into the drift layer can be controlled. Therefore, the breakdown voltage can be maintained even when the thickness of the drift layer (wafer thickness) is reduced (made thinner). Further, the expansion of the depletion layer extending from the emitter side to the collector side at the time of turn-off can be suppressed and the number of carriers remaining on the collector side can be increased. Therefore, oscillations of voltage-current waveform at the time of turn-off can be suppressed. The structure of the conventional FS-IGBT is explained hereinbelow.

FIG. 25 is a cross-sectional view of the structure of the conventional FS-IGBT. FIG. 26 is a characteristic diagram illustrating the impurity concentration distribution in the depth direction of the FS-IGBT depicted in FIG. 25. FIG. 26 depicts the impurity concentration distribution in the case in which the thickness (total thickness of a $p^+$-type collector layer 101, a field stop layer 110, and an $n^-$-type drift layer 102) D of a semiconductor substrate (silicon (Si) chip) is 60 μm. The conventional FS-IGBT depicted in FIG. 25 differs from the conventional trench-gate IGBT depicted in FIG. 24 in that the $n^+$-type field stop layer doped with phosphorus (P) (referred to hereinbelow as phosphorus-doped FS layer) 110 is provided at a position which is deeper than the $p^+$-type collector layer 101, as measured from the substrate back surface, on the $p^+$-type collector 101 side inside the $n^-$-type drift layer 102.

FIG. 27 is a cross-sectional view illustrating another structure of the conventional FS-IGBT. FIG. 28 is a characteristic diagram illustrating the impurity concentration distribution in the depth direction of the FS-IGBT depicted in FIG. 27. FIG. 28 depicts the impurity concentration distribution in the case in which the thickness (total thickness of the $p^+$-type collector layer 101, a field stop layer 120, and an $n^-$-type drift layer 102, that is, silicon thickness) D of a semiconductor substrate is 60 μm. The FS-IGBT depicted in FIG. 27 differs from the FS-IGBT depicted in FIG. 25 in that the $n^+$-type field stop layer 120 doped with selenium (Se) (referred to hereinbelow as selenium-doped FS layer) is provided instead of the phosphorus-doped FS layer 110. The thickness of the selenium-doped FS layer 120 is larger than the thickness of the phosphorus-doped FS layer 110 of the FS-IGBT depicted in FIG. 25.

A method for manufacturing the conventional FS-IGBT will be explained below with respect to the case in which the FS-IGBT depicted in FIG. 27 is fabricated (manufactured). FIGS. 29 to 32 are cross-sectional views illustrating states in the process of manufacturing the conventional FS-IGBT. Initially, as depicted in FIG. 29, a trench-gate MOS gate (insulated gate constituted by a metal, an oxide film, and a semiconductor) structure is formed by a typical method on the front surface side of an n⁻-type semiconductor wafer serving as the n⁻-type drift layer 102. Then, an interlayer insulating film 111 is formed on the front surface of the semiconductor wafer, and then collector holes are formed to expose the n⁺-type emitter region 104 and a p⁺-type contact region 113.

Then, as depicted in FIG. 30, the semiconductor wafer is polished from the back surface side to a position corresponding to a product thickness for use as a semiconductor device. Then, as depicted in FIG. 31, selenium and boron are ion implanted from the back surface of the semiconductor wafer and heat treatment (annealing) is thereafter performed to form the selenium-doped FS layer 120 and p⁺-type collector layer 101 on the surface layer of the polished back surface of the semiconductor wafer. Then, as depicted in FIG. 32, the emitter layer 112 is formed on the front surface of the semiconductor wafer, and a collector electrode 109 is thereafter formed on the back surface of the semiconductor wafer, thereby completing the fabrication of the semiconductor device depicted in FIG. 27.

In the aforementioned FS-IGBT depicted in FIG. 25, the phosphorus-doped FS layer 110 is formed at a small depth of about 2 μm or less from the substrate back surface (chip back surface). The resultant problem is that defects are caused by the adverse effect of particles or scratches occurring on the wafer back surface in the manufacturing process. Meanwhile, in the FS-IGBT depicted in FIG. 27, the selenium-doped FS layer 120 is formed by ion implantation of selenium which is higher in a diffusion coefficient with respect to silicon than phosphorus. The depth of the selenium-doped FS layer 120 is larger than that of the phosphorus-doped FS layer 110 and is about 20 μm from the substrate back surface. Therefore, the occurrence of defects caused by particles or scratches occurring on the wafer back surface can be suppressed.

Patent Literature 10 and 11 disclose a method for forming a field stop layer by implanting protons (H⁺) from the wafer back surface as another method for forming a field stop layer at a depth from the wafer back surface which is larger than the depth of the phosphorus-doped FS layer. Another method for forming a field stop layer has also been suggested in which field stop layers at a plurality of stages that differ in depth from the chip back surface are formed by multiple implantation (multistage implantation) of protons at different dose amounts, see, for example, U.S. Pat. No. 7,514,750 (Patent Literature 13) and Japanese Patent No. 4128777 (Patent Literature 14).

A two-layer field stop structure including a phosphorus-doped field stop layer (phosphorus-doped FS layer) and a proton-doped field stop layer (referred to hereinbelow as proton-doped FS layer) has been also suggested as another field stop structure, see, for example, Japanese Patent Application Publication No. 2013-138172 (Patent Literature 15) and Japanese Patent Application Publication No. 2012-256628 (Patent Literature 16). In Patent Literature 15, as a result of providing the phosphorus-doped FS layer, it is possible to reduce the impurity concentration of the proton-doped FS layer by comparison with that in the field stop structure including only the proton-doped FS layer. Therefore, productivity can be increased, a breakdown voltage can be ensured due to electric field relaxation, and a surge voltage can be suppressed.

However, a portion (a portion where the p-type base regions 103 are not provided) of the n⁻-type drift layer 102 which is enclosed between the p-type base regions 103, as in the configuration described in Patent Literature 5, is electrically insulated from the emitter electrode and becomes a floating region (referred to hereinbelow as "floating n⁻ region"). In such floating n⁻ region, carriers (holes) are easily accumulated in the ON state, and a portion of the gate insulating film 106 (provided on the side wall of the trench 105) which is in contact with the floating n⁻ region becomes a gate-collector capacity $C_{GC}$. The resultant problem is that although the ON voltage is maintained by dividing the p-type base region 103 into a plurality of regions and taking a limited region present in the mesa region of a unit cell as an emitter structure, the gate-collector capacity $C_{GC}$ rises and the switching losses increase.

It is an objective of the present invention to provide a semiconductor device which makes it possible to maintain the ON potential and reduce the switching losses and to provide a method for manufacturing a semiconductor device such that the above-described problems inherent to the conventional techniques are resolved.

SUMMARY OF THE INVENTION

In order to resolve the above-described problems and attain the objective of the present invention, the semiconductor device in accordance with the present invention has the following features. A plurality of trenches is provided in a stripe shape extending in a direction parallel to one surface of a first semiconductor layer of a first conductivity type, to a predetermined depth in a depth direction from the one surface of the first semiconductor layer. First semiconductor regions of a second conductivity type are provided over an entire surface layer on the one surface of the first semiconductor layer to a depth which is less than that of the trenches, in mesa regions separated by the trenches in the surface layer on the one surface of the first semiconductor layer. Second semiconductor regions of the first conductivity type are selectively provided inside the first semiconductor regions. A first electrode is provided inside each trench, with a gate insulting film interposed therebetween. A second semiconductor layer of the first conductivity type is provided in a surface layer on the other surface of the first semiconductor layer and has an impurity concentration higher than that of the first semiconductor layer. A third semiconductor layer of the second conductivity type is provided in contact with the second semiconductor layer at a position shallower than the second semiconductor layer in the surface layer on the other surface of the first semiconductor layer. A second electrode is provided in contact with the first semiconductor regions and the second semiconductor regions. A third electrode is provided in contact with the third semiconductor layer. Further, a thickness of the second semiconductor layer is larger than a thickness of a portion of the first semiconductor layer that is enclosed by each of the first semiconductor regions and the second semiconductor layer.

The semiconductor device in accordance with the present invention is also characterized in that in the above-described invention, the second semiconductor regions are provided at a predetermined interval in a first direction in which the trenches extend in a stripe shape; and portions of the first semiconductor regions that are enclosed between the second semiconductor regions adjacent in the first direction are covered with an insulating layer that covers the one surface of the first semiconductor layer.

The semiconductor device in accordance with the present invention is also characterized in that in the above-described invention, there are further included third semiconductor regions of the second conductivity type which are selectively provided inside the first semiconductors regions and have an impurity concentration higher than that of the first semiconductor regions; and the second electrode is electrically connected to the first semiconductor regions through the third semiconductor regions.

The semiconductor device in accordance with the present invention is also characterized in that in the above-described invention, the second semiconductor regions which are in contact with the trenches and portions in which the second semiconductor regions are not provided between the trenches appear alternately in a second direction, which is a direction parallel to the one surface of the first semiconductor layer and perpendicular to the first direction, in the adjacent mesa regions enclosing the trenches.

The semiconductor device in accordance with the present invention is also characterized in that in the above-described invention, a sum total of a thickness of the first semiconductor region, a thickness of a portion of the first semiconductor layer which is enclosed by the first semiconductor region and the second semiconductor layer, a thickness of the second semiconductor layer, and a thickness of the third semiconductor layer is 35 µm (inclusive) to 60 µm (inclusive).

The semiconductor device in accordance with the present invention is also characterized in that in the above-described invention, a thickness of the second semiconductor layer is 15 µm (inclusive) to 30 µm (inclusive).

In order to resolve the above-described problems and attain the objective of the present invention, the method for manufacturing a semiconductor device in accordance with the present invention has the following features. Initially, a first step is performed for forming a plurality of trenches in a stripe shape extending in a direction parallel to one surface of a first semiconductor layer of a first conductivity type, to a predetermined depth in a depth direction from the one surface of the first semiconductor layer. Then a second step is performed for forming a first electrode inside each trench, with a gate insulting film interposed therebetween. Then, a third step is performed for forming first semiconductor regions of a second conductivity type over an entire surface layer on the one surface of the first semiconductor layer to a depth which is less than that of the trenches, in mesa regions separated by the trenches in the surface layer on the one surface of the first semiconductor layer. Then, a fourth step is performed for forming second semiconductor regions of the first conductivity type selectively inside the first semiconductor regions. Then, a fifth step is performed for forming a second semiconductor layer of the first conductivity type, which has an impurity concentration higher than that of the first semiconductor layer, on a surface layer on the other surface of the first semiconductor layer. Then, a sixth step is performed for forming a third semiconductor layer of a second conductivity type that is in contact with the second semiconductor layer at a position shallower than the second semiconductor layer in the surface layer on the other surface of the first semiconductor layer. In the fifth step, a thickness of the second semiconductor layer is made larger than a thickness of a portion of the first semiconductor layer that is enclosed by each of the first semiconductor regions and the second semiconductor layer.

In order to resolve the above-described problems and attain the objective of the present invention, the semiconductor device in accordance with the present invention has the following features. A plurality of trenches is provided in a stripe shape extending in a direction parallel to one surface of a first semiconductor layer of a first conductivity type, to a predetermined depth in a depth direction from the one surface of the first semiconductor layer. First semiconductor regions of a second conductivity type are provided over an entire surface layer on the one surface of the first semiconductor layer to a depth which is less than that of the trenches, in mesa regions separated by the trenches in the surface layer on the one surface of the first semiconductor layer. Second semiconductor regions of the first conductivity type are selectively provided inside the first semiconductor regions. A first electrode is provided inside each trench, with a gate insulting film interposed therebetween. A second semiconductor layer of the first conductivity type is provided on a surface layer on the other surface of the first semiconductor layer and has an impurity concentration higher than that of the first semiconductor layer. A third semiconductor layer of the second conductivity type is provided in contact with the second semiconductor layer at a position shallower than the second semiconductor layer in the surface layer on the other surface of the first semiconductor layer. A second electrode is provided in contact with the first semiconductor regions and the second semiconductor regions. A third electrode is provided in contact with the third semiconductor layer. The second semiconductor layer has a first first conductivity type-semiconductor layer and a second first conductivity type-semiconductor layer. The first first conductivity type-semiconductor layer is disposed at a position apart from the third semiconductor layer. The first first conductivity type-semiconductor layer has an impurity concentration lower than that of the third semiconductor layer. The second first conductivity type-semiconductor layer is disposed between the third semiconductor layer and the first first conductivity type-semiconductor layer. The second first conductivity type-semiconductor layer has an impurity concentration lower than that of the third semiconductor layer and higher than that of the first first conductivity type-semiconductor layer.

The semiconductor device in accordance with the present invention is also characterized in that in the above-described invention, the first first conductivity type-semiconductor layer is doped with protons.

The semiconductor device in accordance with the present invention is also characterized in that in the above-described invention, the first first conductivity type-semiconductor layer is disposed such as to include a region at a depth of at least 2.0 µm (inclusive) to 8.0 µm (inclusive) from an interface between the third semiconductor layer and the third electrode.

The semiconductor device in accordance with the present invention is also characterized in that in the above-described invention, the second first conductivity type-semiconductor layer is doped with phosphorus.

The semiconductor device in accordance with the present invention is also characterized in that in the above-described invention, the second first conductivity type-semiconductor layer is disposed within a depth range of 0.5 µm (inclusive) to 3.0 µm (inclusive) from an interface between the third semiconductor layer and the third electrode.

The semiconductor device in accordance with the present invention is also characterized in that in the above-described invention, a sum total of a thickness of the first semiconductor region, a thickness of a portion of the first semiconductor layer which is enclosed by the first semiconductor region and the second semiconductor layer, a thickness of the second semiconductor layer, and a thickness of the third semiconductor layer is 60 µm or less.

In order to resolve the above-described problems and attain the objective of the present invention, the method for manufacturing a semiconductor device in accordance with the present invention has the following features. Initially, a first step is performed for forming a plurality of trenches in a stripe shape extending in a direction parallel to one surface of a first semiconductor layer of a first conductivity type, to a predetermined depth in a depth direction from the one surface of the first semiconductor layer. Then, a second step is performed for forming a first electrode inside each trench, with a gate insulting film interposed therebetween. Then, a third step is performed for forming first semiconductor regions of a second conductivity type over an entire surface layer on the one surface of the first semiconductor layer to a depth which is less than that of the trenches, in mesa regions separated by the trenches in the surface layer on the one surface of the first semiconductor layer. Then, a fourth step is performed for forming second semiconductor regions of the first conductivity type selectively inside the first semiconductor regions. Then, a fifth step is performed for forming a second semiconductor layer of the first conductivity type, which has an impurity concentration higher than that of the first semiconductor layer, on a surface layer on the other surface of the first semiconductor layer. Then, a sixth step is performed for forming a third semiconductor layer of the second conductivity type that is in contact with the second semiconductor layer at a position shallower than the second semiconductor layer in the surface layer on the other surface of the first semiconductor layer. In the fifth step, a first formation step is initially performed for forming a first first conductivity type-semiconductor layer at a position apart from the third semiconductor layer, the first semiconductor layer having an impurity concentration lower than that of the third semiconductor layer. Then, a second formation step is performed for forming a second first conductivity type-semiconductor layer between the third semiconductor layer and the first first conductivity type-semiconductor layer, the second first conductivity type-semiconductor layer having an impurity concentration lower than that of the third semiconductor layer and higher than that of the first first conductivity type-semiconductor layer.

The method for manufacturing a semiconductor device in accordance with the present invention is also characterized in that in the above-described invention, in the first formation step, the first first conductivity type-semiconductor layer is formed by proton irradiation from the other surface of the first semiconductor layer.

The method for manufacturing a semiconductor device in accordance with the present invention is also characterized in that in the above-described invention, a dose amount of the proton irradiation is $1.0 \times 10^{13}/cm^2$ (inclusive) to $1.0 \times 10^{15}/cm^2$ (inclusive).

The method for manufacturing a semiconductor device in accordance with the present invention is also characterized in that in the above-described invention, an accelerating voltage of the proton irradiation is 400 keV (inclusive) to 1.5 MeV (inclusive).

The method for manufacturing a semiconductor device in accordance with the present invention is also characterized in that in the above-described invention, in the first formation step, annealing at a temperature of 330° C. (inclusive) to 450° C. (inclusive) is performed after the proton irradiation.

The method for manufacturing a semiconductor device in accordance with the present invention is also characterized in that in the above-described invention, in the second formation step, the second first conductivity type-semiconductor layer is formed by ion implantation of phosphorus from the other surface of the first semiconductor layer.

The method for manufacturing a semiconductor device in accordance with the present invention is also characterized in that in the above-described invention, a dose amount of phosphorus in the ion implantation is $5.0 \times 10^{11}/cm^2$ (inclusive) to $1.0 \times 10^{13}/cm^2$ (inclusive).

The method for manufacturing a semiconductor device in accordance with the present invention is also characterized in that in the above-described invention, an accelerating voltage of the ion implantation is 100 keV (inclusive) to 900 keV (inclusive).

The method for manufacturing a semiconductor device in accordance with the present invention is also characterized in that in the above-described invention, in the second formation step, laser annealing or annealing at a temperature of 330° C. (inclusive) to 450° C. (inclusive) is performed after the ion implantation.

The semiconductor device in accordance with the present invention is also characterized in that in the above-described invention, there are further included, in the first semiconductor regions, third semiconductor regions of the second conductivity type which are provided linearly in a first direction in which the trenches extend in a stripe shape and which have an impurity concentration higher than that of the first semiconductor regions.

The semiconductor device in accordance with the present invention is also characterized in that in the above-described invention, the third semiconductor regions are provided linearly through the second semiconductor regions on the first semiconductor layer side.

The semiconductor device in accordance with the present invention is also characterized in that in the above-described invention, the second semiconductor regions are provided between the adjacent trenches at a predetermined interval in the first direction and so as to face the third semiconductor regions in the depth direction.

The semiconductor device in accordance with the present invention is also characterized in that in the above-described invention, a depth of the third semiconductor regions is 0.5 µm or more.

The semiconductor device in accordance with the present invention is also characterized in that in the above-described invention, a depth of the third semiconductor regions is equal to a depth of the second semiconductor regions or greater than the depth of the second semiconductor regions; and a difference between the depth of the third semiconductor regions and the depth of the second semiconductor regions is 0.0 µm (inclusive) to 0.3 µm (inclusive).

According to the above-described invention, by forming a structure in which the first semiconductor regions which are at the same potential as the second electrode are arranged over the entire surface layer on the substrate front surface side in the mesa regions between the trenches, the channel density on the substrate front surface side is increased, and the injection amount of a large number of carriers into the first semiconductor layer is increased, it is possible to reduce the ON voltage. Further, according to the above-described invention, the contact surface area of the gate insulating film and the first semiconductor layer is decreased by arranging the first semiconductor regions with the emitter potential over the entire surface layer on the substrate front surface side in the mesa regions between the trenches. Therefore, the switching losses can be reduced.

Further, according to the above-described invention, as a result of providing the first first conductivity type-semiconductor layer as the second semiconductor layer, it is possible to suppress the occurrence of defects caused by particles or scratches appearing on the wafer back surface in the manufacturing process, in the same manner as in the conventional configuration, and also it is possible to increase the number of carriers remaining on the third semiconductor layer side and suppress oscillations of voltage-current waveform at the time of turn-off. Therefore, the wafer can be reduced in thickness, thereby making it possible to reduce the ON voltage and lower the switching losses.

Further, according to the above-described invention, as a result of providing the second first conductivity type-semiconductor layer as the second semiconductor layer at a position which is shallower, with respect to the substrate back surface, than the first first conductivity type-semiconductor layer, it is possible to prevent the decrease in breakdown voltage occurring because the depletion layer extending from the second semiconductor region side at the time of turn-off punches through the third semiconductor layer, and also to suppress the injection of carriers from the third semiconductor layer side into the drift layer. As a result, the wafer can be further reduced in thickness, and therefore, the ON voltage and switching losses can be further reduced.

The effects demonstrated by the semiconductor device and the method for manufacturing a semiconductor device in accordance with the present invention are that the ON voltage can be maintained and the switching losses can be reduced.

DETAILED DESCRIPTION OF THE INVENTION

Figure 1:
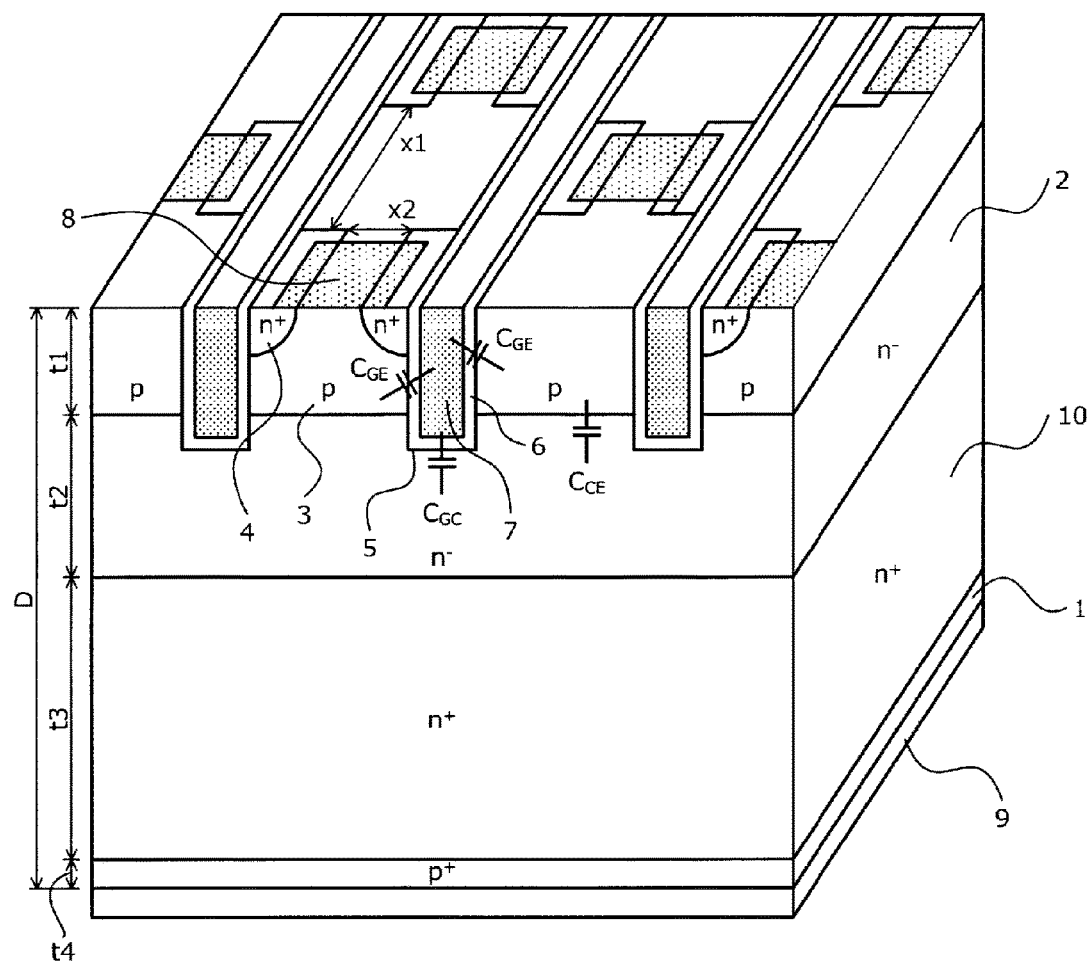
FIG. 1 is a perspective view illustrating the structure of the semiconductor device according to Embodiment 1.

The preferred embodiments of the semiconductor device and the method for manufacturing a semiconductor device according to the present invention will be explained hereinbelow in greater detail with reference to the appended drawings. In the description and appended drawings, the layers and regions assigned with symbols n and p are meant to include a large number of electrons and holes, respectively, as carriers. Where n and p are assigned with a sign (+) or (−), it means that the impurity concentration is higher or lower than that in the layer or region to which the sign is not assigned. In the explanation of the embodiments and appended drawings hereinbelow, like components are assigned with like reference numerals and the redundant explanation thereof is herein omitted.

Embodiment 1

The structure of the semiconductor device according to Embodiment 1 is explained below. FIG. 1 is a perspective view illustrating the structure of the semiconductor device according to Embodiment 1. FIG. 1 depicts the structure of the active region of the semiconductor device according to Embodiment 1, and a voltage-resistant structural part (not depicted in the figure) surrounding the periphery of the active region may be also arranged. The active region is a region where an electric current flows in the ON state. The voltage-resistant structural part is a region that relaxes the electric field on the substrate front surface side of the n$^-$-type drift layer (first semiconductor layer) 2 and holds the breakdown voltage. For example, it has a voltage-resistant structure in which a guard ring, a field plate, and a RESURF structure are combined together.

As depicted in FIG. 1, in the semiconductor device according to Embodiment 1, first p-type base regions (first semiconductor regions) 3 are provided in the surface layer on the front surface of an n$^-$-type semiconductor substrate (semiconductor chip) serving as an n$^-$-type drift layer 2. Further, n$^+$-type emitter regions (second semiconductor regions) 4 are selectively provided in the surface layer on the substrate front surface side inside the p-type base regions 3. Trenches 5 reaching the n$^-$-type drift layer 2 through the n$^+$-type emitter regions 4 and the p-type base regions 3 are provided in the depth direction from the substrate front surface. The plurality of trenches 5 has a stripe-shaped planar layout in the direction (in FIG. 1, the depthwise direction of the paper sheet; taken hereinbelow as the longitudinal direction (first direction: lengthwise direction) of the trenches 5) parallel to the substrate front surface. A gate insulating film 6 is provided along an inner wall of each trench 5 inside the trench 5, and a gate electrode (first electrode) 7 is provided on the inner side of each gate insulating film 6.

The p-type base regions 3 are provided, such as to be exposed over the entire substrate front surface, in the mesa regions (mesa regions between the trenches 5) separated by the trenches 5 in the surface layer on the substrate front surface side. Thus, the p-type base regions 3 have a linear planar layout extending in the longitudinal direction of the trenches 5 in the mesa regions between the trenches 5.

Further, in the mesa regions between the trenches 5, the n$^+$-type emitter regions 4 provided inside the p-type base regions 3 are arranged dispersedly at a predetermined distance ×1 from each other in the longitudinal direction of the trenches 5. Thus, in the mesa regions between the trenches 5, a portion in which the n$^+$-type emitter region 4 that is in contact with the trench 5 is provided and which forms an emitter structure (cell) and a portion in which no n$^+$-type emitter regions 4 is provided between the trenches 5 are arranged repeatedly and alternately in the longitudinal direction of the trenches 5. In the same mesa region, the n$^+$-type emitter regions 4 which are in contact with the respective gate insulating films 6 provided on the side walls of the adjacent trenches 5 face each other at a predetermined distance ×2 from each other in the arrangement direction of the trenches 5, that is, the direction (in FIG. 1, the transverse direction of the paper sheet; taken hereinbelow as the short-side direction (second direction: transverse direction of the trenches 5)) perpendicular to the longitudinal direction of the trenches 5.

The n$^+$-type emitter regions 4 provided in the adjacent mesa regions enclosing the trenches 5 are arranged such as not to face each other in the short-side direction of the trenches 5. Thus, in the adjacent mesa regions enclosing the trenches 5, a portion of the p-type base region 3 in which the n$^+$-type emitter region 4 is provided and a portion in which the n$^+$-type emitter region 4 is not provided appear alternately in the short-side direction of the trenches 5. The width of the mesa region between the trenches 5 in the short-side direction of the trenches 5 (referred to hereinbelow simply as "width") is preferably as small as allowed by design. This is because the occupation ratio of the n$^+$-type emitter regions 4 in the mesa region increases, a channel density can be increased and the ON voltage can be reduced in addition to the below-described effects of the present invention. The surface of the gate electrodes 7, n$^+$-type emitter regions 4, and p-type base regions 3 is covered by an interlayer insulating film (insulating layer: not depicted in the figure).

Contact holes are selectively provided in the interlayer insulating film at a predetermined interval in the longitudinal direction of the trenches 5. An emitter electrode (second electrode: not depicted in the figure) is connected to the n$^+$-type emitter regions 4 and the p-type base regions 3 through the contact holes of the interlayer insulating film. Thus, the contacts (electric contact portions) 8 of the n$^+$-type emitter regions 4 and the p-type base regions 3 with the emitter electrode are selectively provided in the longitudinal direction of the trenches 5. Portions of the p-type base regions 3 which are enclosed between the n$^+$-type emitter regions 4 adjacent in the longitudinal direction of the trenches 5 are covered by the interlayer insulating film. On the upper surface in the perspective view in FIG. 1, the hatched portions are contacts 8 of the n$^+$-type emitter regions 4 and the p-type base regions 3 with the emitter electrode, and the portions which are not hatched are covered by the interlayer insulating film. The entire surface layer of the mesa regions on the substrate front surface side is at an emitter potential as a result of arranging the p-type base regions 3 continuously in the longitudinal direction of the trenches 5 inside the mesa regions.

A p$^+$-type collector layer (third semiconductor layer) 1 is provided on the surface layer of the back surface of the n$^-$-type semiconductor substrate. A collector electrode (third electrode) 9 forming an ohmic junction with the p$^+$-type collector layer 1 is provided on the substrate back surface. An n$^+$-type buffer layer (second semiconductor layer) 10 is provided on the surface layer of the back surface of the n⁻-type semiconductor substrate at a position deeper from the substrate back surface than the p⁺-type collector layer 1. Thus, the n⁺-type buffer layer 10 is disposed between the p⁺-type collector layer 1 and the n⁻-type drift layer 2 in contact with the p⁺-type collector layer 1 and the n⁻-type drift layer 2. An impurity concentration distribution is obtained in which the impurity concentration in the n⁺-type buffer layer 10 is lower on the n⁻-type drift layer 2 side than on the p⁺-type collector layer 1 side and increases from the n⁻-type drift layer 2 side toward the p⁺-type collector layer 1 side.

The thickness t3 of the n⁺-type buffer layer 10 is substantially the same as the thickness (thickness of a portion of the n⁻-type drift layer 2 that is enclosed by the p-type base region 3 and the n⁺-type buffer layer 10) t2 of the n⁻-type drift layer 2, or larger than the thickness t2 of the n⁻-type drift layer 2. More specifically, the rated voltage is, for example, 600 V or less, and the sum total of the thickness t1 of the p-type base region 3, thickness t2 of the n⁻-type drift layer 2, thickness t3 of the n⁺-type buffer layer 10, and thickness t4 of the p⁺-type collector layer 1 (that is, the thickness of the semiconductor substrate (silicon thickness) D) is 60 μm or less. The thickness t3 of the n⁺-type buffer layer 10 is set, for example, within a range of about 15 μm (inclusive) to 30 μm (inclusive) on the basis of the rated voltage. As a result of providing the n⁺-type buffer layer 10 satisfying the above-described conditions, a configuration is obtained in which a depletion layer extending from the pn junction between the p-type base region 3 and the n⁻-type drift layer 2 at the time of regular switching punches through the n⁺-type buffer layer 10.

Figure 2:
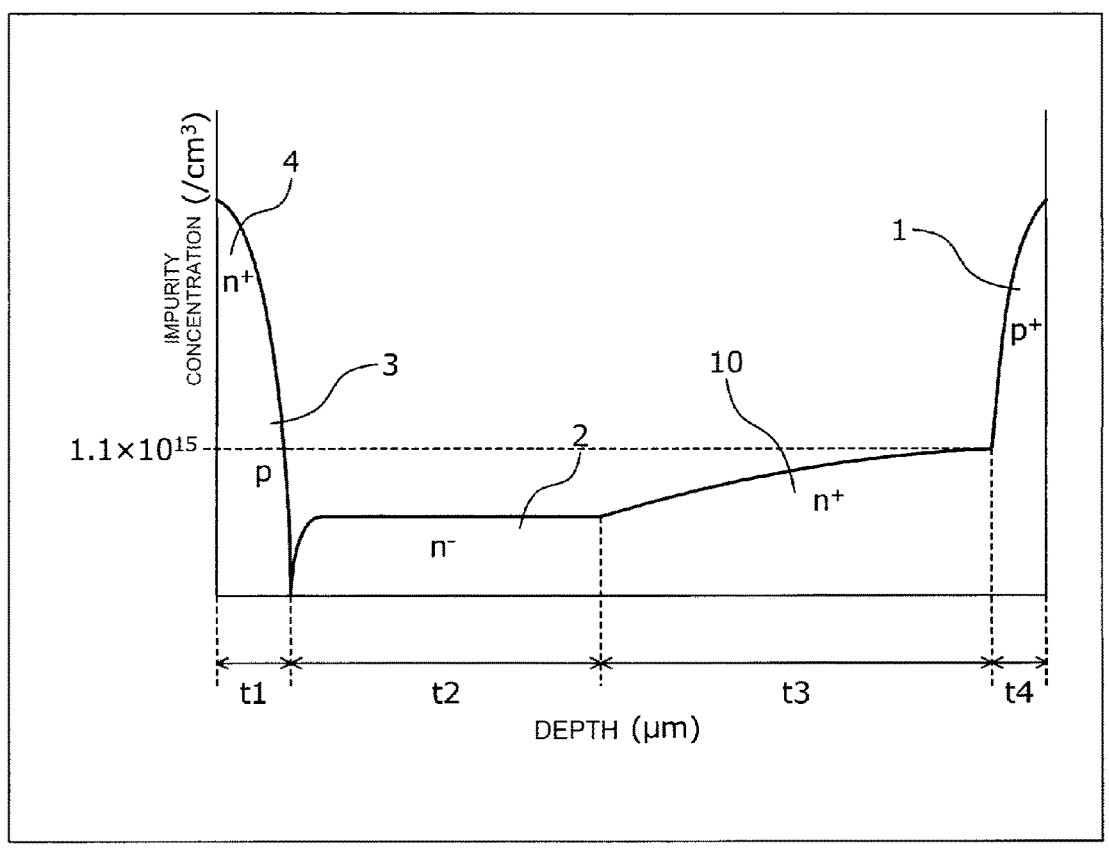
FIG. 2 is a characteristic diagram illustrating the impurity concentration distribution in the depth direction of a semiconductor device with a rated voltage of 600 V.

The dimensions and impurity concentrations in each part of the semiconductor device according to Embodiment 1 will be explained hereinbelow. For example, when the rated voltage is 600 V, the breakdown voltage is about 700 V and the dimensions and impurity concentrations in each part have the following values. FIG. 2 shows the impurity concentration distribution in the thickness direction of the semiconductor device with the rated voltage of 600 V. FIG. 2 shows the impurity concentration distribution in a region including the n⁺-type emitter region 4, p-type base region 3, n⁻-type drift layer 2, n⁺-type buffer layer 10, and p⁺-type collector layer 1 in the depth direction from the interface (depth=0 μm) of the emitter electrode and the n⁺-type emitter region 4 of the semiconductor device depicted in FIG. 1 (similar distributions are also depicted in FIGS. 3, 10, 16, 18, 20, and 22). The thickness D of the semiconductor substrate is 60 μm. The thickness t1 of p-type base region 3 is 2.8 μm. The impurity concentration in the p⁺-type collector layer 1 is $3.0 \times 10^{17}/\text{cm}^3$ (inclusive) to $3.6 \times 10^{18}/\text{cm}^3$ (inclusive), and the thickness t4 thereof is 1.0 μm. The depth from the interface between the emitter electrode and the n⁺-type emitter region 4 to the interface between the n⁻-type drift layer 2 and the n⁺-type buffer layer 10 is 30 μm. Thus, the thickness t2 of the n⁻-type drift layer 2 is 27.2 μm and the thickness t3 of the n⁺-type buffer layer 10 is 29 μm. The specific resistance of the n⁻-type drift layer 2 is 23 Ωcm (inclusive) to 26 Ωcm (inclusive). The peak concentration (impurity concentration on the collector side) of the n⁺-type buffer layer 10 is $1.1 \times 10^{15}/\text{cm}^3$. In this case, the element breakdown voltage is about 700 V. Where it is assumed that a voltage of 300 V (half of the rated voltage) is applied during the regular switching, the depletion layer expands to a depth of about 36 μm from the interface between the emitter electrode and the n⁺-type emitter region 4. Thus, the penetration amount of the depletion layer from the interface between the n⁻-type drift layer 2 and the n⁺-type buffer layer 10 into the n⁺-type buffer layer 10 is about 6 μm. An IGBT with a rated voltage of 600 V is used, for example, for inverter control of an air conditioner.

Figure 3:
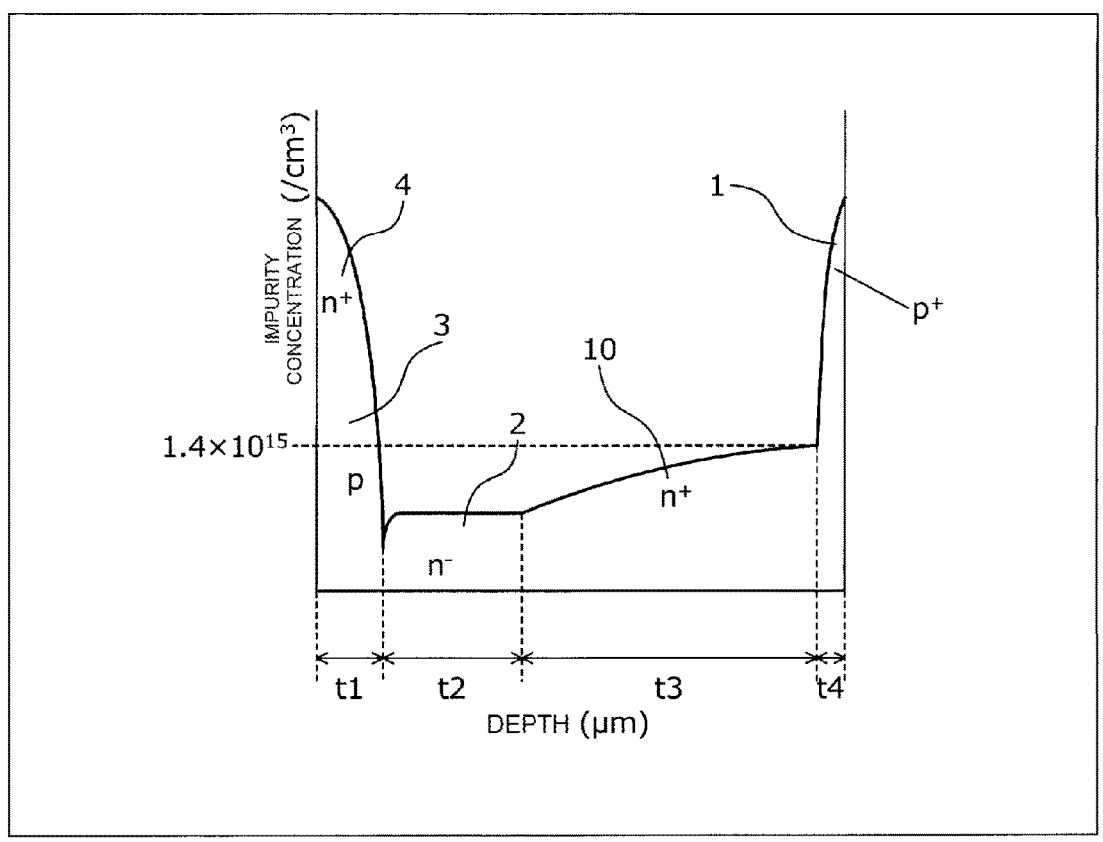
FIG. 3 is a characteristic diagram illustrating the impurity concentration distribution in the depth direction of a semiconductor device with a rated voltage of 350 V.

Further, for example, where the rated voltage is 350 V, the breakdown voltage is taken as about 370 V, and the following dimensions of parts and impurity concentrations are selected. FIG. 3 is a characteristic diagram illustrating the impurity concentration distribution in the depth direction of a semiconductor device with a rated voltage of 350 V. The thickness D of a semiconductor substrate is 37 μm. The thickness t1 of the p-type base region 3 is 2.8 μm. The impurity concentration in the p⁺-type collector layer 1 is $4.2 \times 10^{17}/\text{cm}^3$ (inclusive) to $6.0 \times 10^{18}/\text{cm}^3$ (inclusive) and the thickness t4 of this layer is 1.0 μm. The depth from the interface between the emitter layer and the n⁺-type emitter region 4 to the interface between the n⁻-type drift layer 2 and the n⁺-type buffer layer 10 is 19 μm. Thus, the thickness t2 of the n⁻-type drift layer 2 is 16.2 μm, and the thickness t3 of the n⁺-type buffer layer 10 is 17 μm. The specific resistance of the n⁻-type drift layer 2 is 17 Ωcm. The peak concentration in the n⁺-type buffer layer 10 is $1.4 \times 10^{15}/\text{cm}^3$. In this case, the element breakdown voltage is, for example, about 370 V, and when it is assumed that a voltage of 150 V (half of the rated voltage) is applied during the regular switching, the depletion layer expands to a depth of about 28 μm from the interface between the emitter layer and the n⁺-emitter region 4. Thus, the penetration amount of the depletion layer from the interface between the type drift layer 2 and the n⁺-type buffer layer 10 into the n⁺-type buffer layer 10 is about 9 μm. IGBTs with a rated voltage of about 300 V (inclusive) to 400 V (inclusive) are used, for example, in motor parts (BAS: Belted Alternator Starter) of HEVs (Hybrid Electric Vehicles).

Figure 24:
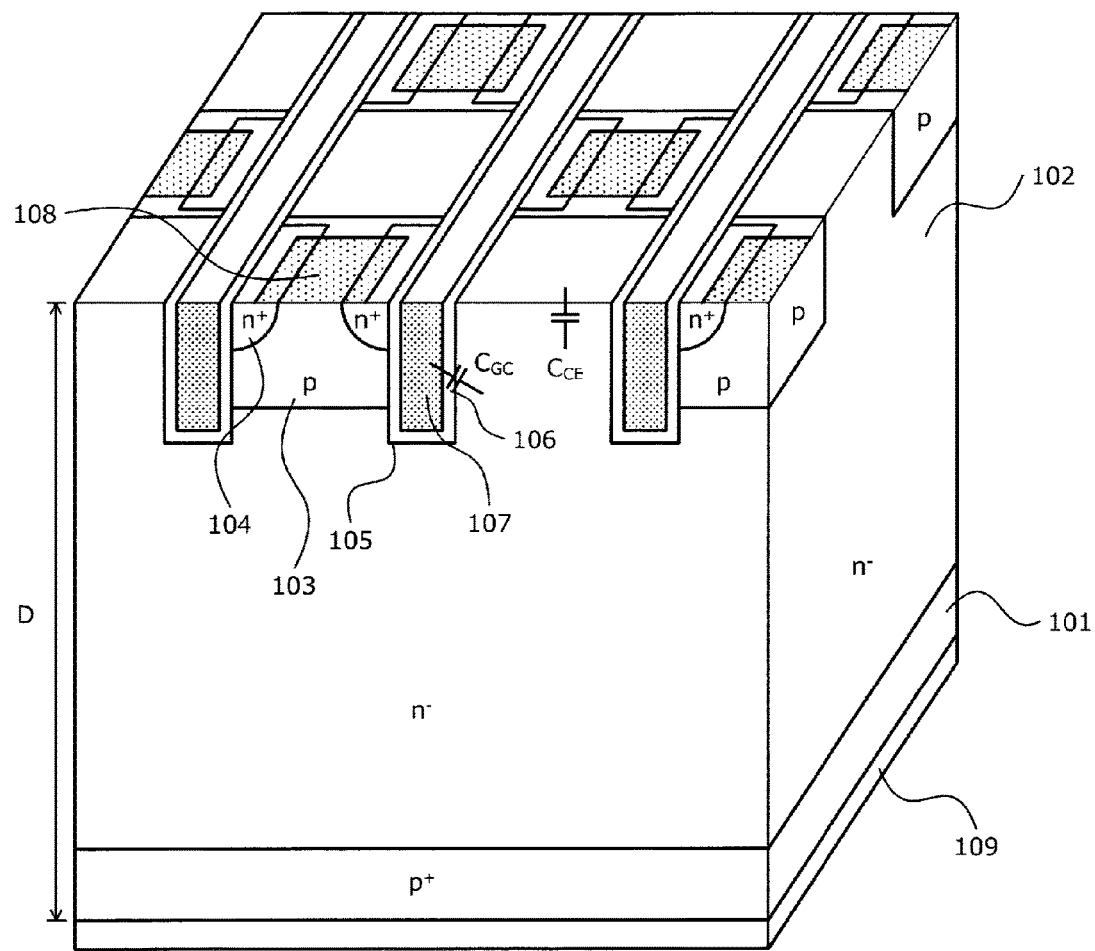
FIG. 24 is a perspective view illustrating the structure of a conventional trench gate IGBT.
Figure 25:
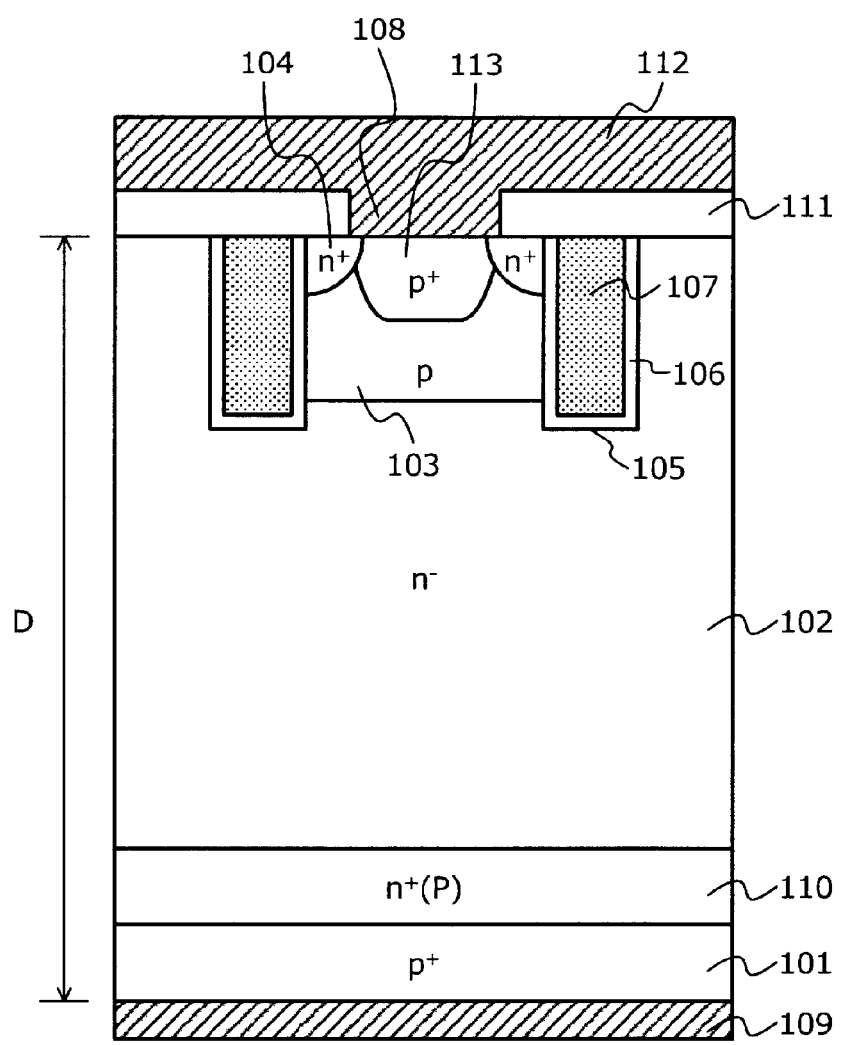
FIG. 25 is a cross-sectional view illustrating the structure of a conventional FS-IGBT.
Figure 26:
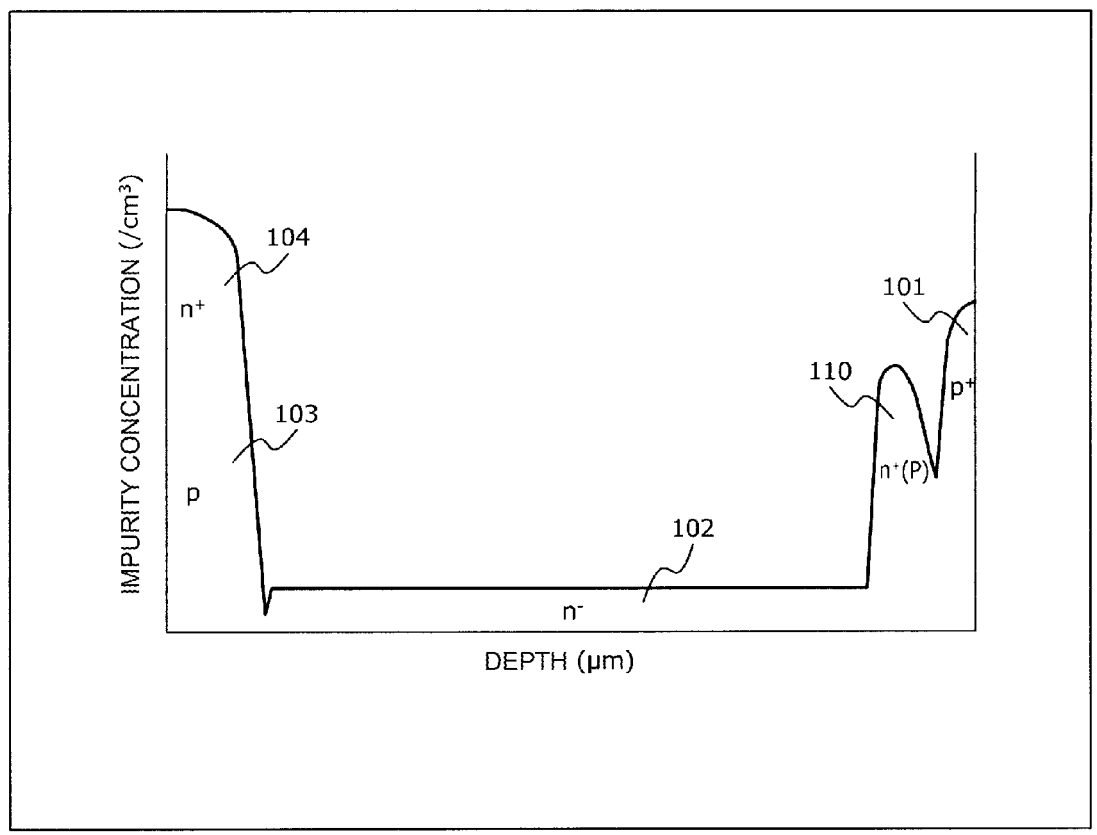
FIG. 26 is a characteristic diagram illustrating the impurity concentration distribution in the depth direction of the FS-IGBT depicted in FIG. 25.

Thus, in the present invention, the thickness t3 of the n⁺-type buffer layer 10 is made substantially equal to the thickness t2 of the n⁻-type drift layer 2 or larger than the thickness t2 of the n⁻-type drift layer 2, the rated voltage is made 600 V or less (the thickness D of the semiconductor substrate is 60 μm or less), and the p-type base regions 3 with the emitter potential are arranged over the entire surface layer on the substrate front surface side in the mesa portions between the trenches 5. As a result, the increase in ON voltage caused by drawing of the holes from the p-type base region 3 to the emitter electrode is small. Meanwhile, in the conventional structure in which the IE effect is maintained by arranging a plurality of p-type base regions 103 at a predetermined interval in the longitudinal direction of the trenches 105 inside the mesa regions between the trenches 105 (for example, the conventional structure (FIG. 24) corresponding to the technique disclosed in Patent Literature 5), when the thickness D of the semiconductor substrate is as small as 60 μm or less, the resistance of the n⁻-type drift layer 102 decreases. Therefore, holes are unlikely to accumulate in the portion (floating n⁻ region) of the n⁻-type drift layer 102 which is enclosed by the p-type base regions 103, and the IE effect decreases. Therefore, when the rated voltage is 600 V or less, it is better to use the structure in which the channel density is raised and the injection amount of electrons into the n⁻-type drift layer 2 is increased by arranging the p-type base regions 3 with the emitter potential over the entire surface layer on the substrate front surface side in the mesa regions between the trenches 5, as in the present invention, instead of the structure in which the IE effect is maintained in the conventional manner.

In the configuration in which the p-type base regions 3 with the emitter potential are arranged over the entire surface layer on the substrate front surface side in the mesa regions between the trenches 5, as in the present invention, for example, when the rated voltage is 1200 V or higher, holes are drawn from the p-type base regions 3 into the emitter electrode. As a result, the IE effect is reduced and the ON voltage is increased. Therefore, in order to realize a low ON voltage, it is preferred that the rated voltage be about 600 V or less. Further, since the entire surface layer on the substrate front surface side of the mesa regions between the trenches 5 is configured as the p-type base regions 3 with the emitter potential, a larger portion of each gate insulating film 6 provided on the side wall of the trench 5 becomes the gate-emitter capacity $C_{GE}$. Since the contact surface area of the gate insulating film 6 and the n⁻-type drift layer 2 decreases, the gate-collector capacity $C_{GC}$ decreases with respect to that in the conventional structure (FIG. 24) in which the p-type base region inside the mesa region is divided into a plurality of regions and a limited region present inside the mesa region of a unit cell is taken as an emitter structure, thereby making it possible to reduce the switching losses. Further, since the entire surface layer on the substrate front surface side in each mesa region between the trenches 5 is made the p-type base region 3 with the emitter potential, no mask is needed during ion implantation for forming the p-type base region 3. Therefore, the number of masks to be used in the manufacturing process can be reduced.

A method for manufacturing the semiconductor device according to Embodiment 1 will be explained hereinbelow. Initially, for example, an type semiconductor wafer serving as an n⁻-type drift layer 2 is prepared as a starting wafer. Then, a plurality of trenches 5 of a predetermined depth is formed from the front surface of the semiconductor wafers. The depth of the trenches 5 is such that the trenches do not reach the n⁺-type buffer layer 10 which is to be formed on the substrate back surface side in the below-described process. A gate insulating film 6 is then formed along the side wall of the trench 5 inside each trench 5. Then, a gate electrode 7 is formed on the inside of the gate insulating film 6 inside each trench 5. Then, p-type base regions 3 are formed to a depth less than that of the trenches 5 over the entire surface layer on the substrate front surface side in the mesa regions between the trenches 5, by ion implantation of p-type impurities from, for example, the substrate front surface side.

Then, n⁺-type emitter regions 4 are selectively formed inside the p-type base regions 3 by ion implanting n-type impurities from the substrate front surface side by using a mask with open portions corresponding to the formation regions of the n⁺-type emitter regions 4. The remaining front surface element structure such as an interlayer insulating film and emitter electrode is formed on the front surface of the semiconductor wafer by a typical method. In this case, contact holes are selectively formed at a predetermined interval in the longitudinal direction of the trenches 5 in the interlayer insulating film. Then, the n⁺-type buffer layer 10 of a predetermined thickness is formed in the surface layer on the back surface of the semiconductor wafer by ion implanting selenium (Se), for example, at about 1×10¹⁴/cm² from the back surface of the semiconductor wafer and then performing heat treatment (annealing) for about 2 h at a temperature of about 900° C. As a result, the n⁻-type layer remaining between the n⁺-type buffer layer 10 and the p-type base layer 3 becomes the n⁻-type drift layer 2.

The n⁺-type buffer layer 10 may be also formed by implanting a plurality of times (multistage implantation) protons (H⁺) at different dose amounts instead of ion implantation of selenium. As a result of forming the n⁺-type buffer layer 10 by ion implantation of selenium or multistage implantation of protons, the impurity concentration distribution is obtained in which the impurity concentration in the n⁺-type buffer layer 10 increases from the n⁻-type drift layer 2 side toward the p⁺-type collector layer 1 side. Further, for example, when the n⁺-type buffer layer 10 is formed by ion implantation of phosphorus (P), since the diffusion coefficient with respect to silicon is small, a deep diffusion region is difficult to obtain, but a deep diffusion region can be obtained by forming the n⁺-type buffer layer 10 by ion implantation of selenium which has a high diffusion coefficient.

Then, the p⁺-type collector layer 1 is formed with a thickness less than that of the n⁺-type buffer layer 10 in the surface layer (that is, the surface layer of the n⁺-type buffer layer 10) on the back surface of the semiconductor wafer by ion implantation of p-type impurities at a dose amount of, for example, 1.0×10¹³/cm² (inclusive) to 4.0×10¹³/cm² (inclusive) from the wafer back surface. It is undesirable that the dose amount of the p⁺-type collector layer 1 be less than 1.0×10¹³/cm², because an ohmic junction with the collector electrode 9 cannot be formed. Then, the manufacture of the semiconductor device depicted in FIG. 1 is completed by forming the collector electrode 9 on the back surface of the semiconductor wafer by a typical method. In the above-described method for manufacturing a semiconductor device, where the thickness of the original wafer is larger than that of the product, the semiconductor wafer may be polished from the back surface side to a position corresponding to the thickness of the product to be used in the semiconductor device, for example, before the n⁺-type buffer layer 10 is formed.

As explained hereinabove, according to Embodiment 1, a structure is obtained in which the p-type base regions at the emitter potential are arranged over the entire surface layer on the substrate front surface side in the mesa regions between the trenches, the channel density on the emitter side is increased, and the amount of electrons injected into the n⁻-type drift layer is increased. Further, since the thickness of the n⁺-type buffer layer is made substantially equal to the thickness of the n⁻-type drift layer or made larger than the thickness of the n⁻-type drift layer, the ON voltage can be reduced when the rated voltage is 600 V or less. Furthermore, in accordance with Embodiment 1, since the p-type base regions at the emitter potential are arranged over the entire surface layer on the substrate front surface side in the mesa regions between the trenches, the contact surface area of the gate insulating film and the n⁻-type drift layer is decreased. Therefore, the gate-collector capacity is lowered and the switching losses can be reduced. Further, in accordance with Embodiment 1, since the p-type base regions at the emitter potential are arranged over the entire surface layer on the substrate front surface side in the mesa regions between the trenches, no mask is needed during ion implantation for forming the p-type base regions. As a result, the number of masks used in the production process can be reduced. In addition, in accordance with Embodiment 1, because of a low breakdown voltage (the rated voltage is 600 V or less), the ON voltage does not rise correspondingly to the value of the breakdown voltage. Therefore, the breakdown voltage can be maintained and a low ON voltage can be realized.

Embodiment 2

Figure 4:
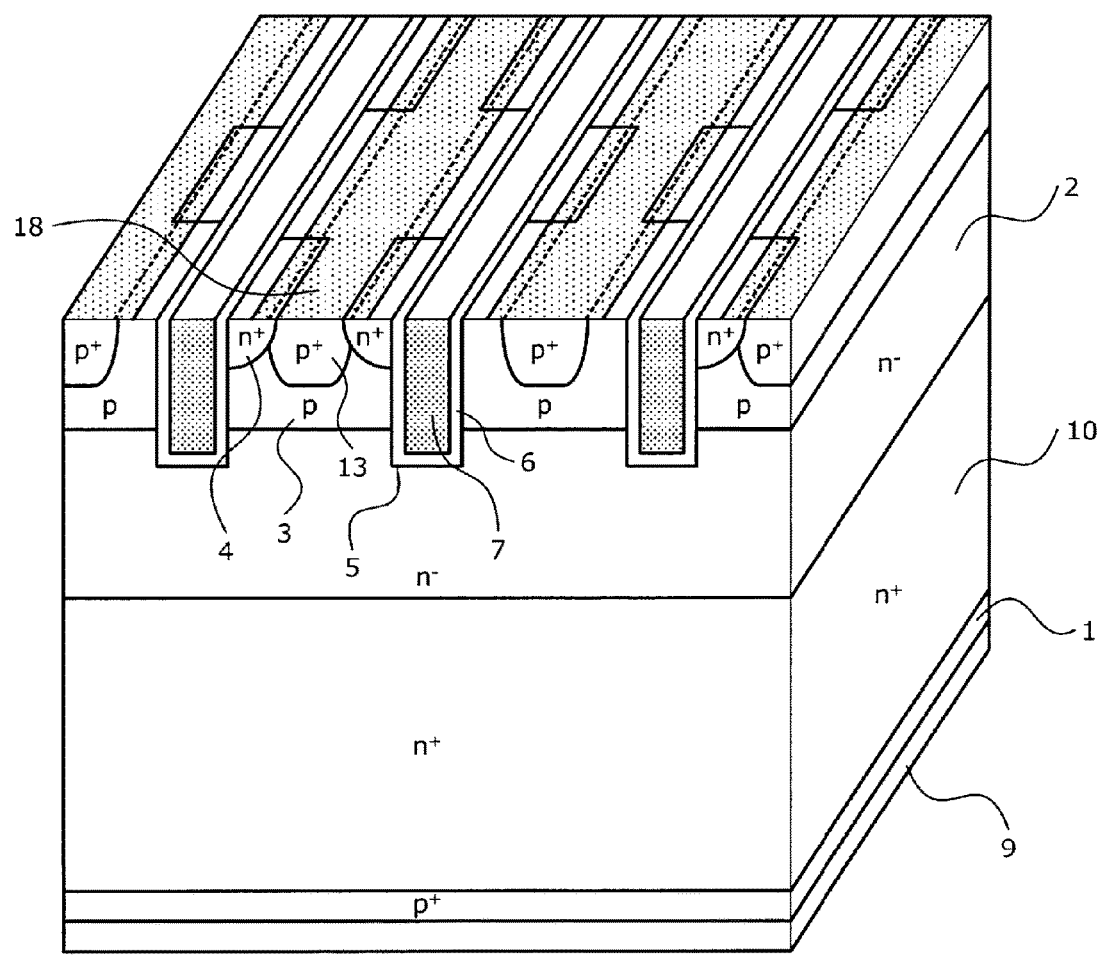
FIG. 4 is a perspective view illustrating the structure of the semiconductor device according to Embodiment 2.

The structure of the semiconductor device according to Embodiment 2 will be explained hereinbelow. FIG. 4 is a perspective view illustrating the structure of the semiconductor device according to Embodiment 2. The semiconductor device according to Embodiment 2 differs from the semiconductor device according to Embodiment 1 in that a $p^+$-type contact region (third semiconductor region) 13 in a stripe shape extending in the longitudinal direction of the trenches 5 is provided inside each p-type base region 3, and a contact 18 with the emitter electrode is provided in a stripe shape extending in the longitudinal direction of the trenches 5. On the top surface in the perspective view in FIG. 4, the hatched portions are contacts 18 of the $n^+$-type emitter regions 4, $p^+$-contact regions 13, and p-type base regions 3 with the emitter electrode, and portions that are not hatched are the portions that are covered by an interlayer insulating film (the same is true with respect to FIG. 5). A portion between two dot lines extending in the longitudinal direction of the trenches 5 inside each mesa region is the $p^+$-type contact region 13 (the same is true with respect to FIG. 5).

More specifically, as depicted in FIG. 4, inside the p-type base region 3, the $p^+$-type contact region 13 is provided between the $n^+$-type emitter regions 4 adjacent in the short-side direction of the trenches 5 within the same mesa region. The $p^+$-type contact region 13 is provided in a stripe shape extending in the longitudinal direction of the trenches 5 in the surface layer on the substrate front surface side. Thus, the $p^+$-type contact region 13 is provided in the portion of the p-type base region 3 that forms the emitter structure (cell) and is also provided in the portion of the p-type base region 3 where the $n^+$-type emitter regions 4 are not provided (portion enclosed in the emitter structure).

The $p^+$-type contact region 13 may also be in contact with the gate insulating film 6 on the side wall of the trench 5 in the portion of the p-type base region 3 where the $n^+$-type emitter regions 4 are not provided. In this case, the $p^+$-type contact region 13 is formed by a production process or under design conditions such that make it possible to avoid an increase in the threshold voltage Vth and maintain the impurity concentration in the $n^+$-type emitter regions 4. Contact holes in a stripe shape extending in the longitudinal direction of the trenches 5 are provided in the interlayer insulating film. An emitter electrode (not depicted in the figure) is connected to the $n^+$-type emitter regions 4, $p^+$-type contact regions 13, and p-type base regions 3 through the contact holes of the interlayer insulating film.

A method for manufacturing the semiconductor device according to Embodiment 2 can be realized, for example, by adding a step for forming the $p^+$-type contact regions 13 after forming the p-type base regions 3 to the method for manufacturing the semiconductor device according to Embodiment 1 and forming the contact holes in the interlayer insulating film in a stripe shape extending in the longitudinal direction of the trenches 5. In the formation of the $p^+$-type contact regions 13, for example, the $p^+$-type contact regions 13 may be formed by using a mask with open portions corresponding to the formation regions of the $p^+$-type contact regions 13 and performing ion implantation of p-type impurities from the substrate front surface side. Other features of the method for manufacturing the semiconductor device according to Embodiment 2 are the same as those of the method for manufacturing the semiconductor device according to Embodiment 1.

As explained hereinabove, according to Embodiment 2, the effect same as that of Embodiment 1 can be obtained. Further, according to Embodiment 2, by providing the $p^+$-type contact regions, it is possible to control the operation of a parasitic pnpn thyristor constituted by the $p^+$-collector layer, $n^+$-type buffer layer, $n^-$-type drift layer, p-type base regions, and $n^+$-type emitter regions and prevent the occurrence of latch-up.

Embodiment 3

Figure 5:
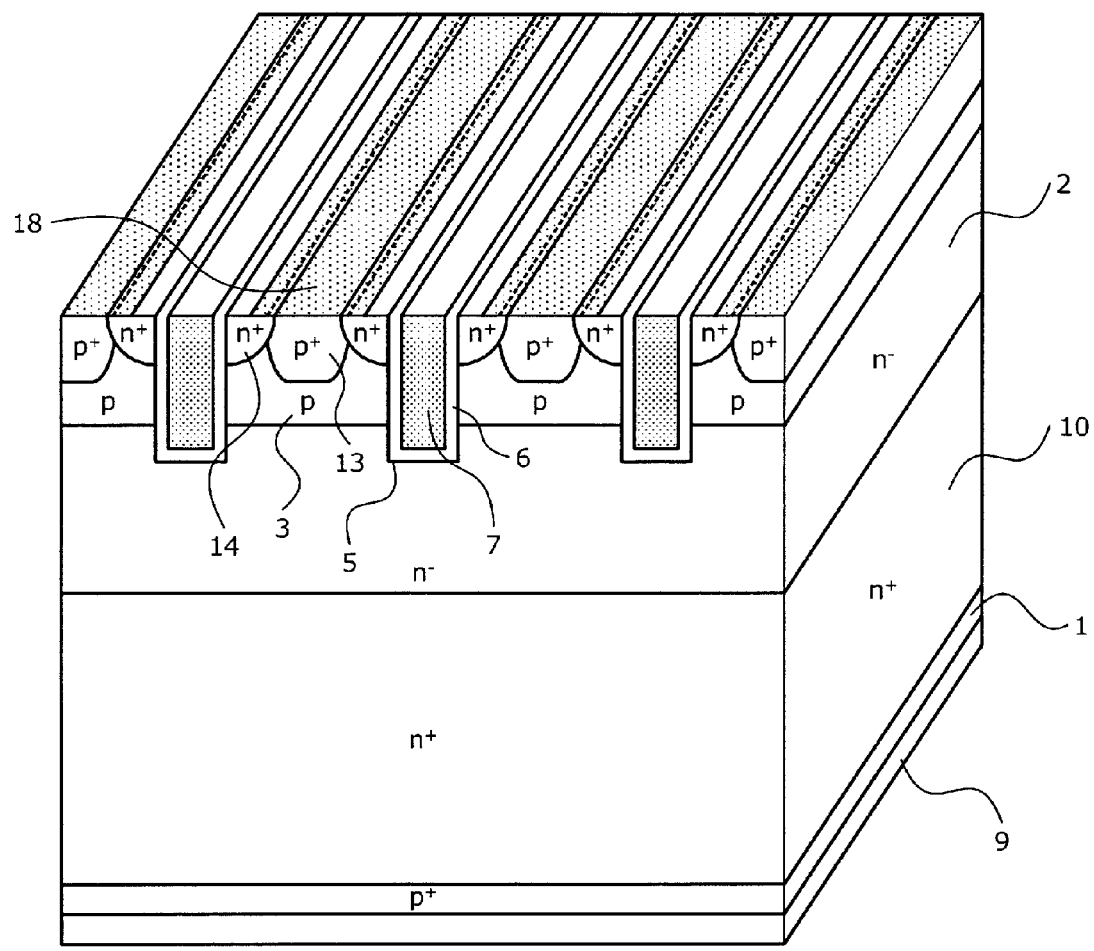
FIG. 5 is a perspective view illustrating the structure of the semiconductor device according to Embodiment 3.

The structure of the semiconductor device according to Embodiment 3 will be explained hereinbelow. FIG. 5 is a perspective view illustrating the structure of the semiconductor device according to Embodiment 3. The semiconductor device according to Embodiment 3 differs from the semiconductor device according to Embodiment 2 in that $n^+$-type emitter regions 14 are provided in a stripe shape extending in the longitudinal direction of the trenches 5. Thus, the emitter structure (cell) is formed continuously in the longitudinal direction of the trenches 5. An emitter electrode (not depicted in the figure) is connected to the $n^+$-type emitter regions 14 and $p^+$-type contact regions 13 through contact holes in an interlayer insulating film and electrically connected to the p-type base regions 3 through the $p^+$-type contact regions 13.

A method for manufacturing the semiconductor device according to Embodiment 3 may be realized by the method for manufacturing the semiconductor device according to Embodiment 2 in which the opening pattern of the mask used for ion implantation for forming the $n^+$-type emitter regions 14 is formed in a stripe shape extending in the longitudinal direction of the trenches 5. Other features of the method for manufacturing the semiconductor device according to Embodiment 3 are the same as those of the method for manufacturing the semiconductor device according to Embodiment 2.

As explained hereinabove, according to Embodiment 3, the effect same as that of Embodiments 1 and 2 can be obtained. Further, according to Embodiment 3, by providing the $n^+$-type emitter regions in a stripe shape extending in the longitudinal direction of the trenches, it is possible to increase the occupation ratio of the $n^+$-type emitter regions in the mesa regions and further increase the channel density. As a result, the ON voltage can be further decreased.

Embodiment 4

Figure 6:
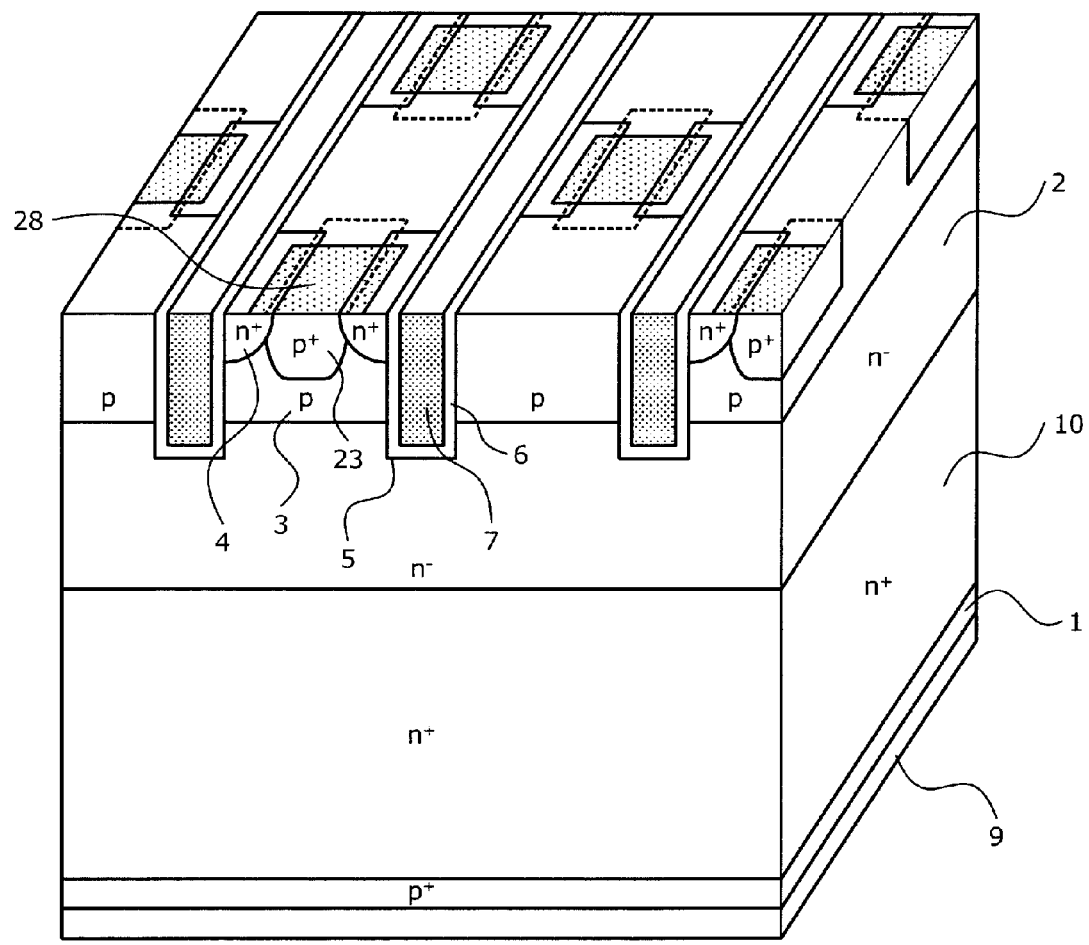
FIG. 6 is a perspective view illustrating the structure of the semiconductor device according to Embodiment 4.

The structure of the semiconductor device according to Embodiment 4 will be explained hereinbelow. FIG. 6 is a perspective view illustrating the structure of the semiconductor device according to Embodiment 4. The semiconductor device according to Embodiment 4 differs from the semiconductor device according to Embodiment 1 in that $p^+$-type contact regions 23 are provided at a predetermined interval in the longitudinal direction of the trenches, and an emitter electrode (not depicted in the figure) and the p-type base regions 3 are electrically connected to each other through the $p^+$-type contact regions 23. On the upper surface in the perspective view in FIG. 6, the hatched portions are contacts 28 of the $n^+$-type emitter regions 4, $p^+$-type contact regions 23, and the p-type base regions 3 with the emitter electrode, and the portions which are not hatched are covered by the interlayer insulating film. The portions surrounded by dot lines are the $p^+$-type contact regions 23.

More specifically, as depicted in FIG. 6, inside each p-type base region 3, the $p^+$-type contact regions 23 are selectively provided at the predetermined interval in the longitudinal direction of the trenches 5 in the surface layer on the substrate front surface side. The $p^+$-type contact regions 23 are provided between the $n^+$-emitter regions 4 adjacent in the short-side direction of the trenches 5 in the same mesa region. Contact holes are selectively provided at a predetermined interval in the longitudinal direction of the trenches 5 in the interlayer insulating film. The emitter electrode is connected to the n$^+$-type emitter regions 4 and the p$^+$-type contact regions 23 through the contact holes of the interlayer insulating film, and electrically connected to the p-type base regions 3 through the p$^+$-type contact regions 23.

A method for manufacturing the semiconductor device according to Embodiment 4 can be realized, for example, by adding a step for forming the p$^+$-type contact regions 23 after forming the p-type base regions 3 to the method for manufacturing the semiconductor device according to Embodiment 1. In the formation of the p$^+$-type contact regions 23, for example, the p$^+$-type contact regions 23 may be formed by using a mask with open portions corresponding to the formation regions of the p$^+$-type contact regions 23 and performing ion implantation of p-type impurities from the substrate front surface side. Other features of the method for manufacturing the semiconductor device according to Embodiment 4 are the same as those of the method for manufacturing the semiconductor device according to Embodiment 1.

As explained hereinabove, according to Embodiment 4, the effect same as that of Embodiment 1 can be obtained.

Example 1

Figure 7:
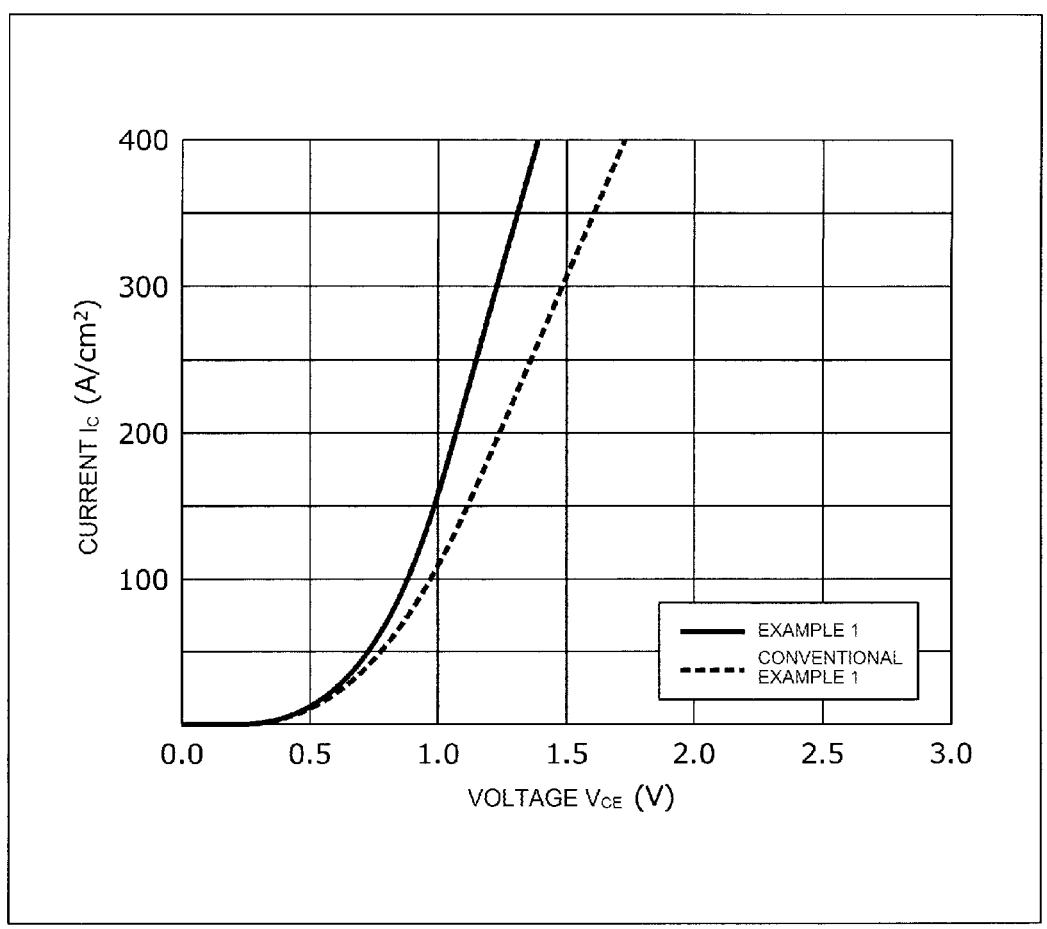
FIG. 7 is a characteristic diagram illustrating the output characteristic of the semiconductor device according to Embodiment 1.

The output characteristic of the semiconductor device in accordance with the present invention will be explained hereinbelow. FIG. 7 is a characteristic diagram illustrating the output characteristic (collector-emitter voltage $V_{CE}$-collector current $I_C$ characteristic) of the semiconductor device according to Embodiment 1. The output characteristic of the semiconductor device according to the above-described Embodiment 1 (referred to hereinbelow as "Example 1") is depicted in FIG. 7. For comparison, FIG. 7 also depicts the output characteristic of the conventional semiconductor device (see FIG. 24; referred to hereinbelow as Conventional Example 1) in which the p-type base regions 103 are selectively provided at a predetermined interval in the longitudinal direction of the trenches 105, thereby providing a limited region present inside a mesa region as an emitter structure and increasing the IE effect. Features of Conventional Example 1 other than the p-type base regions 103 are the same as in Example 1. The results depicted in FIG. 7 confirm that in Example 1, the collector-emitter saturation voltage is lower and the switching operation is faster than those in Conventional Example 1.

Example 2

Figure 8:
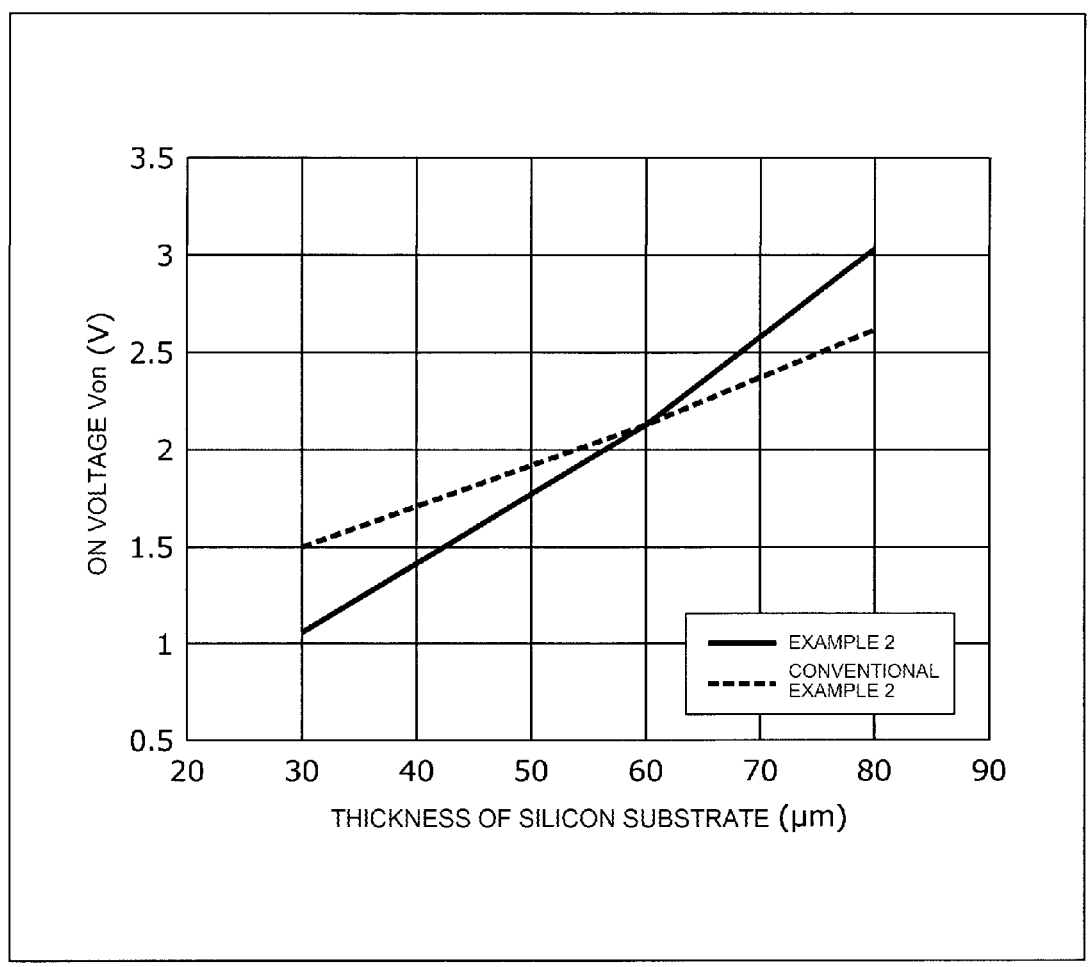
FIG. 8 is a characteristic diagram illustrating the relationship between the ON voltage and thickness of semiconductor substrate in the semiconductor device according to Embodiment 2.

The relationship between the ON voltage Von and the thickness D of the semiconductor substrate will be described hereinbelow. FIG. 8 is a characteristic diagram illustrating the relationship between the ON voltage and the thickness of the semiconductor substrate in the semiconductor device according to Example 2. Thus, FIG. 8 shows the results obtained when the ON voltage of the semiconductor device according to Embodiment 1 (referred to hereinbelow as "Example 2") was inspected with respect to the thickness D of the semiconductor substrate (silicon substrate) of 30 µm to 80 µm. For comparison, FIG. 8 also shows the ON voltage obtained with the thickness of the semiconductor substrate which is the same as in Example 2 for the conventional semiconductor device (see FIG. 24; referred to hereinbelow as "Conventional Example 2") in which the p-type base regions 103 are selectively provided at a predetermined interval in the longitudinal direction of the trenches 105, thereby providing a limited region present inside a mesa region as an emitter structure and increasing the IE effect. Features of Conventional Example 2 other than the p-type base regions 103 are the same as in Example 2.

The results depicted in FIG. 8 have confirmed that in Example 2, the ON voltage Von could be reduced with respect to that in Conventional Example 2 when the thickness D of the semiconductor substrate was 60 µm or less (that is, a rated voltage of 600 V or less). This is because in the structure in which the IE effect is increased in the conventional manner, when the thickness D of the semiconductor substrate is 60 µm or less, the thickness of the n$^-$-type drift layer 102 is too small, and therefore the carriers are unlikely to accumulate on the emitter side and the IE effect is difficult to obtain. Therefore, it has been confirmed that when an IGBT with a rated voltage, for example of 300 V to 600 V is configured with the thickness D of the semiconductor substrate of 60 µm or less, it is preferred to increase the channel density on the emitter side and increase the amount of electrons injected into the n$^-$-type drift layer 2, as in the present invention, than to use the structure in which the IE effect is increased in the conventional manner.

Embodiment 5

Figure 9:
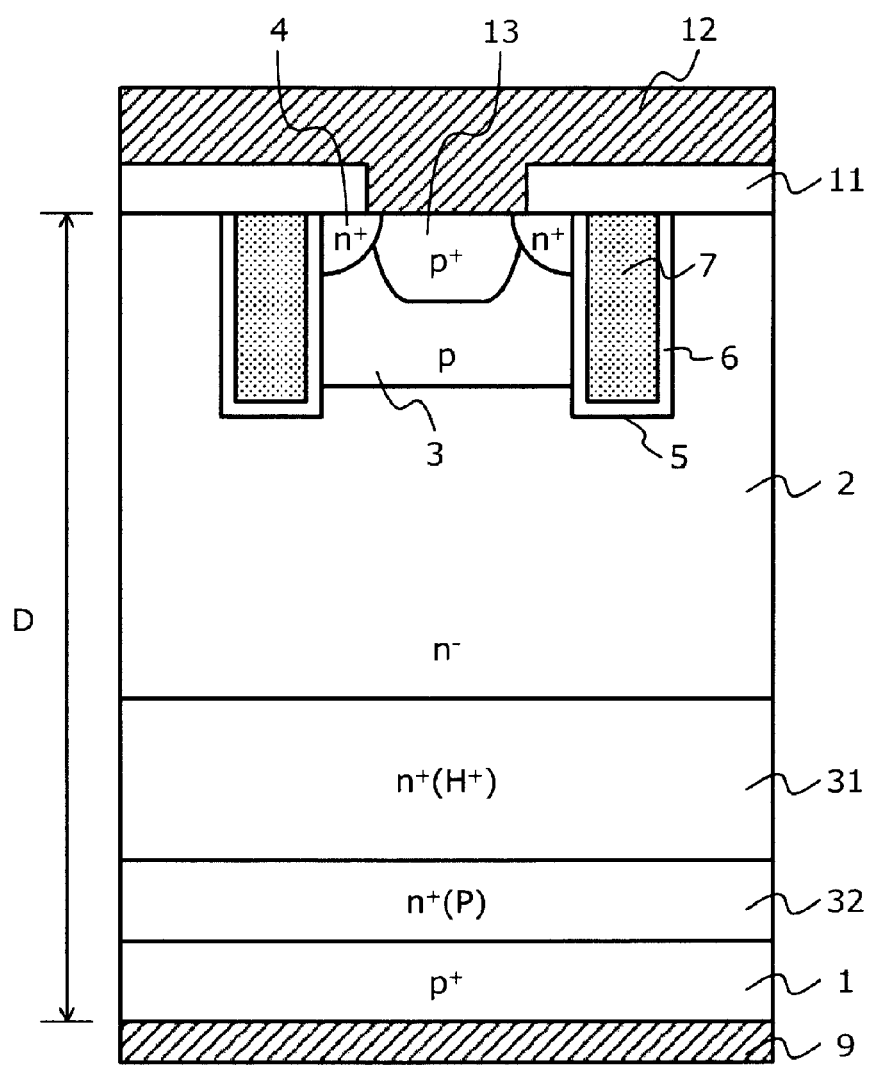
FIG. 9 is a cross-sectional view illustrating the structure of the semiconductor device according to Embodiment 5.
Figure 10:
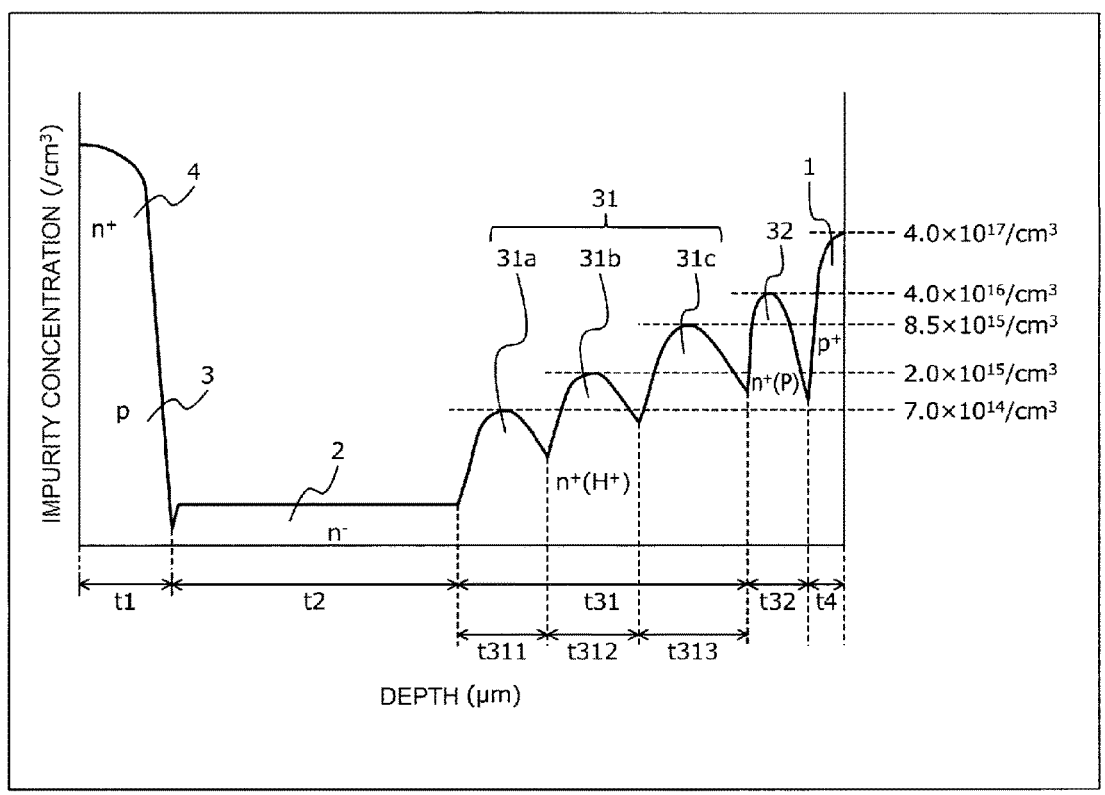
FIG. 10 is a characteristic diagram illustrating the impurity concentration distribution in the depth direction of the semiconductor device depicted in FIG. 9.

The structure of the semiconductor device according to Embodiment 5 will be explained hereinbelow. FIG. 9 is a cross-sectional view illustrating the structure of the semiconductor device according to Embodiment 5. FIG. 10 is a characteristic diagram illustrating the impurity density distribution in the depth direction of the semiconductor device depicted in FIG. 9. The semiconductor device according to Embodiment 5 differs from the semiconductor device according to Embodiment 1 in that a buffer layer is included which has a two-layer structure constituted by a buffer layer (referred to hereinbelow as "proton-doped buffer layer" (first first conductivity type-semiconductor layer)) 31 which has been doped with protons and a buffer layer (referred to hereinbelow as "phosphorus-doped buffer layer" (second first conductivity type-semiconductor layer)) 32 which has been doped with phosphorus. Thus, the sum total of the thickness t1 of the p-type base region 3, thickness t2 of the n$^-$-type drift layer 2, thickness t31 of the proton-doped buffer layer 31, thickness t32 of the phosphorus-doped buffer layer 32, and thickness t4 of the p$^+$-type collector layer 1 is the thickness (silicon thickness) D of the semiconductor substrate. In Embodiment 5, the sum total of the thickness t31 of the proton-doped buffer layer 31 and the thickness t32 of the phosphorus-doped buffer layer 32 is substantially equal to the thickness t2 of the n$^-$-type drift layer 2 or larger than the thickness t2 of the n$^-$-type drift layer 2.

In FIGS. 9 and 10, the conductivity type of the proton-doped buffer layer 31 is represented as n$^+$ (H$^+$) and the conductivity type of the phosphorus-doped buffer layer 32 is represented as n$^+$ (P) (the same in FIGS. 14 to 22). More specifically, as depicted in FIGS. 9 and 10, the proton-doped buffer layer 31 is provided at a position deeper than the phosphorus-doped buffer layer 32 from the substrate back surface and is in contact with the phosphorus-doped buffer layer 32 and the n$^-$-type drift layer 2. Thus, the proton-doped buffer layer 31 is disposed between the phosphorus-doped buffer layer 32 and the n$^-$-type drift layer 2. More specifically, it is preferred that the proton-doped buffer layer 31 be arranged such as to include a region at a depth of at least about 2.0 µm (inclusive) to 8.0 µm (inclusive). The reason therefor is that it is an optimum depth for leaving carriers on the collector side at the time of turn-off and suppressing oscillations while maintaining the breakdown voltage. Further, the proton-doped buffer layer 31 is constituted by buffer layers of a plurality of stages which are formed at different depths from the substrate back surface. The buffer layers constituting the proton-doped buffer layer 31 are disposed, for example, such that the layers adjacent in the depth direction are in contact with each other. FIG. 10 illustrates the case in which the proton-doped buffer layer 31 is constituted by buffer layers (referred to hereinbelow as "first to third proton-doped buffer layers") 31a to 31c of three stages.

The impurity concentration in each of the first to third proton-doped buffer layers 31a to 31c decreases from the position of the impurity concentration peak toward the n$^+$-type emitter region 4 side and p$^+$-type collector layer 1 side. The peak concentration (impurity concentration in the impurity concentration peak) of the first to third proton-doped buffer layers 31a to 31c decreases with the depth from the substrate back surface. More specifically, the peak concentration of the first proton-doped buffer layer 31a disposed at the deepest position from the substrate back surface is lower than the peak concentrations of the second and third proton-doped buffer layers 31b and 31c. The peak concentration of the second proton-doped buffer layer 31b which is the second deepest from the substrate back surface is lower than the peak concentration of the third proton-doped buffer layer 31c arranged at the shallowest position from the substrate back surface. The thickness t31 of the proton-doped buffer layer 31 (that is, the sum total of the thicknesses of the first to third proton-doped buffer layers 31a to 31c) is greater than the thickness t32 of the phosphorus-doped buffer layer 32.

The phosphorus-doped buffer layer 32 is disposed between the p$^+$-type collector layer 1 and the proton-doped buffer layer 31 and is in contact with the p$^+$-type collector layer 1 and the proton-doped buffer layer 31. Thus, the phosphorus-doped buffer layer 32 is provided at a position deeper than the p$^+$-type collector layer 1 from the substrate back surface and shallower than the proton-doped buffer layer 31 from the substrate back surface. More specifically, it is preferred than the phosphorus-doped buffer layer 32 be disposed within a depth range of about 0.5 µm (inclusive) to 3.0 µm (inclusive) from the substrate back surface. The impurity concentration of the phosphorus-doped buffer layer 32 decreases from the position of the impurity concentration peak toward the n$^+$-type emitter region 4 side and the p$^+$-type collector layer 1 side. Further, the peak concentration of the phosphorus-doped buffer layer 32 is lower than the impurity concentration of the p$^+$-type collector layer 1 and higher than the impurity concentration of the third proton-doped buffer layer 31c that is in contact with the phosphorus-doped buffer layer 32. Further, p$^+$-type contact regions 13 (23) may be provided, in the same manner as in Embodiments 2 to 4, inside the p-type base regions 3.

An example of dimensions and impurity concentrations in various parts of the semiconductor device according to Embodiment 5 will be described hereinbelow. For example, when the rated voltage is 600 V, the breakdown voltage is about 700 V and the dimensions and impurity concentrations in various parts take the following values. The thickness D of the semiconductor substrate and the thickness t1 of the p-type base region 3 are the same as in Embodiment 1. The thickness t2 of the n$^-$-type drift layer 2 is 28.2 µm, and the specific resistance thereof is the same as in Embodiment 1.

The peak concentration of the first proton-doped buffer layer 31a is $7.0 \times 10^{14}/cm^3$, and the thickness t311 thereof is 9.0 µm. The peak concentration of the second proton-doped buffer layer 31b is $2.0 \times 10^{15}/cm^3$, and the thickness t312 thereof is 9.0 µm. The peak concentration of the third proton-doped buffer layer 31c is $8.5 \times 10^{15}/cm^3$, and the thickness t313 thereof is 9.5 µm. The peak concentration of the phosphorus-doped buffer layer 32 is $4.0 \times 10^{16}/cm^3$, and the thickness t32 thereof is 1.0 µm. The impurity concentration of the p$^+$-type collector layer 1 is $4.0 \times 10^{17}/cm^3$, and the thickness t4 thereof is 0.5 µm. Thus, the sum total of the thickness t31 of the proton-doped buffer layer 31 and the thickness t32 of the phosphorus-doped buffer layer 32 is 28.5 µm.

Figure 11:
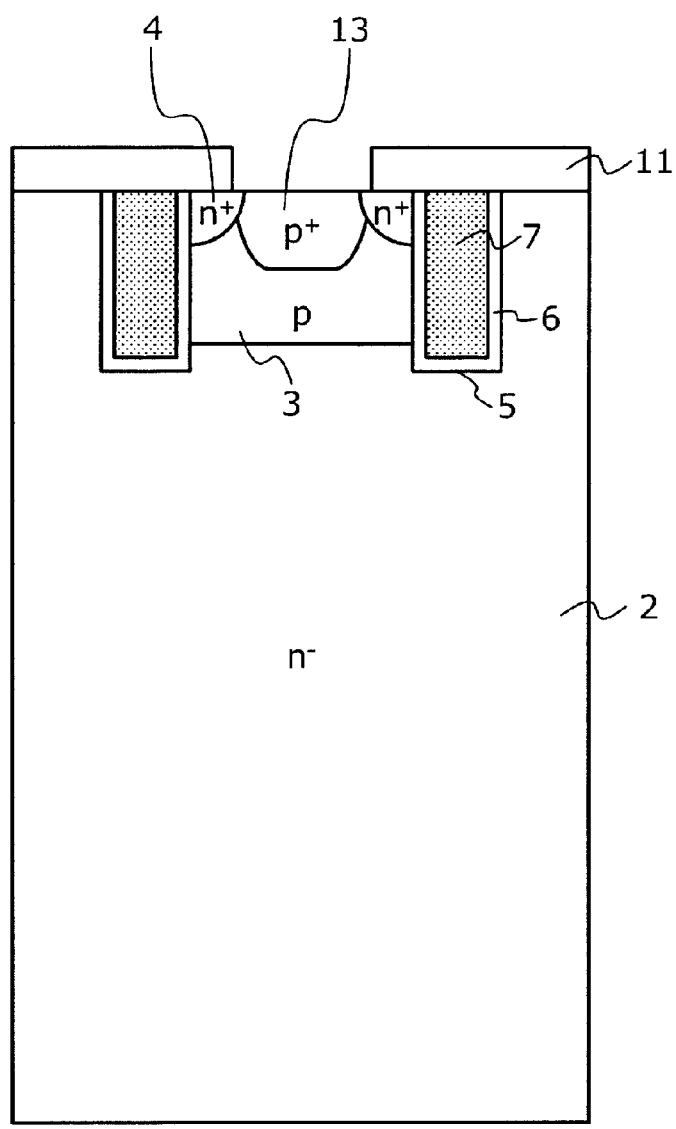
FIG. 11 is a cross-sectional view illustrating states in the process of manufacturing the semiconductor device according to Embodiment 5.

A method for manufacturing the semiconductor device according to Embodiment 5 will be described hereinbelow. FIGS. 11 to 14 are cross-sectional views illustrating states in the process of manufacturing the semiconductor device according to Embodiment 5. Initially, as depicted in FIG. 11, for example, an n$^-$-type semiconductor wafer serving as the n$^-$-type drift layer 2 is prepared as the original wafer. Then, a trench-gate MOS gate structure constituted by the p-type base regions 3, n$^+$-type emitter regions 4, trenches 5, gate insulating films 6, and gate electrodes 7 is formed in the same manner as in Embodiment 1 on the front surface side of the semiconductor wafer. The interlayer insulating film 11 is then formed on the front surface side of the semiconductor wafer, contact holes passing through the interlayer insulating film 11 in the depth direction is then formed in the same manner as in Embodiment 1, and the n$^+$-type emitter regions 4 and p-type base regions 3 are exposed. In this case, where the p$^+$-type contact regions 13 (23) are formed as a MOS gate structure, the p$^+$-type contact regions 13 (23) or contact holes may be formed in the same manner as in Embodiments 2 to 4. The case in which the p$^+$-type contact regions 13 are formed is explained hereinbelow by way of example.

Figure 12:
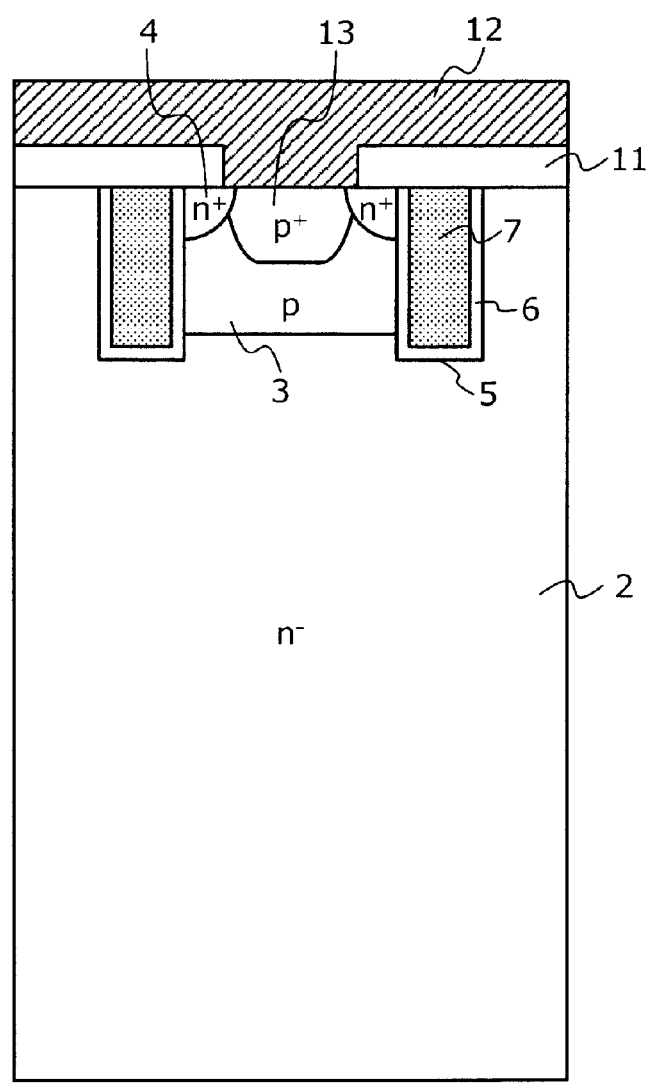
FIG. 12 is a cross-sectional view illustrating states in the process of manufacturing the semiconductor device according to Embodiment 5.
Figure 13:
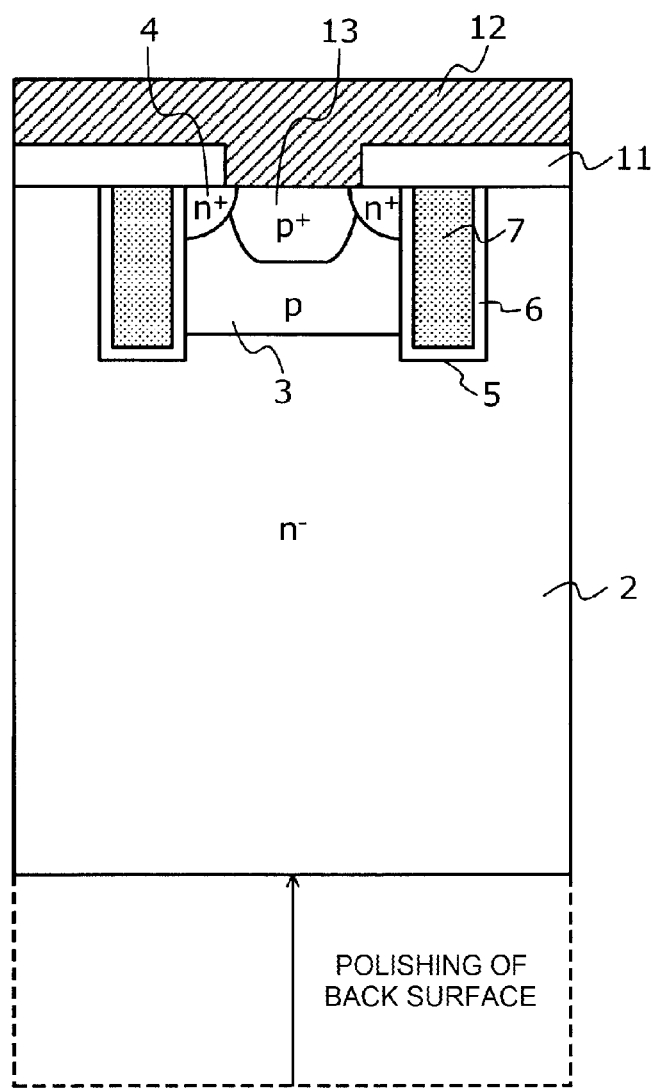
FIG. 13 is a cross-sectional view illustrating states in the process of manufacturing the semiconductor device according to Embodiment 5.
Figure 14:
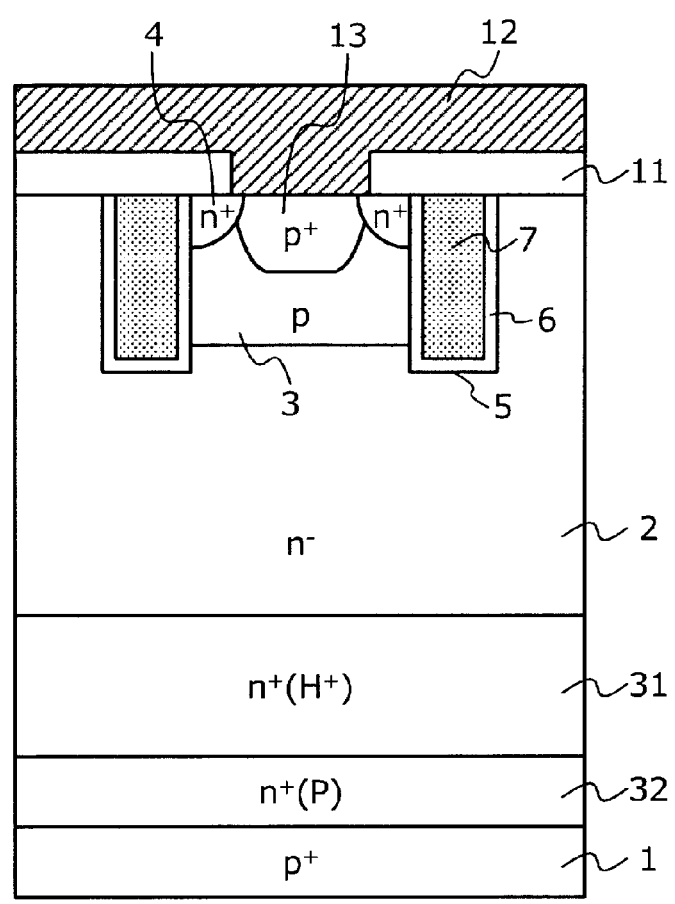
FIG. 14 is a cross-sectional view illustrating states in the process of manufacturing the semiconductor device according to Embodiment 5.

Then, as depicted in FIG. 12, an emitter electrode 12 that is in contact with the n$^+$-type emitter regions 4 and the p$^+$-type contact regions 13 through the contact holes in the interlayer insulating film 11 is formed on the front surface of the semiconductor wafer. Then, as depicted in FIG. 13, the semiconductor wafer is polished from the rear surface side to a position corresponding to the thickness of the product to be used as the semiconductor device. The thickness of the product, as referred to herein, is the above-described thickness D of the semiconductor substrate. Then, as depicted in FIG. 14, multistage implantation of protons is performed from the back surface of the semiconductor wafer and heat treatment (annealing) is thereafter performed at a temperature of, for example, 330° C. (inclusive) to 450° C. (inclusive), thereby forming the proton-doped buffer layer 31 at a predetermined position on the back surface side after polishing the semiconductor substrate. The multistage implantation of protons for forming the proton-doped buffer layer 31 is performed, for example, under the following conditions: the accelerating voltage within a range of 400 keV (inclusive) to 1.5 MeV (inclusive) and the dose amount is within a range of $1.0 \times 10^{13}/cm^2$ (inclusive) to $1.0 \times 10^{15}/cm^2$. It is preferred that the proton implantation be performed in a plurality of stages that differ in the accelerating voltage and does amount from each other.

More specifically, for example, where a semiconductor device with the aforementioned rated voltage of 600 V is fabricated (manufactured), the following proton multistage implantation conditions and heat treatment conditions are used for forming the three-stage buffer layers (first to third proton-doped buffer layers 31a to 31c) serving as the proton-doped buffer layer 31. The proton implantation conditions for forming the first proton-doped buffer layer 31a may be, for example, an accelerating voltage of 1.4 MeV and a dose amount of $2.0 \times 10^{13}$/cm². The proton implantation conditions for forming the second proton-doped buffer layer 31b may be, for example, an accelerating voltage of 1.0 MeV and a dose amount of $5.0 \times 10^{13}$/cm². The proton implantation conditions for forming the third proton-doped buffer layer 31c may be, for example, an accelerating voltage of 750 keV and a dose amount of $2.0 \times 10^{14}$/cm². The proton-doped buffer layer 31 of the predetermined thickness t31 is formed at a depth indicted hereinabove by way of example by forming the first to third proton-doped buffer layers 31a to 31c under such conditions. The order of forming the first to third proton-doped buffer layers 31a to 31c can be variously changed. The heat treatment is performed for about 2 h at a temperature of about 350° C.

Then, ion implantation of phosphorus is performed from the back surface of the semiconductor wafer, and the phosphorus-doped buffer layer 32 is formed. It is preferred that the ion implantation of phosphorus for forming the phosphorus-doped buffer layer 32 be performed, for example, under the conditions of an accelerating voltage of 100 keV (inclusive) to 900 keV (inclusive) and a dose amount of $5.0 \times 10^{11}$/cm² (inclusive) to $1.0 \times 10^{13}$/cm² (inclusive). More specifically, where a semiconductor device with the aforementioned rated voltage of 600 V is fabricated, the ion implantation of phosphorus for forming the phosphorus-doped buffer layer 32 may be performed under the conditions of an accelerating voltage of 700 keV and a dose amount of $1.0 \times 10^{12}$/cm². As a result, the phosphorus-doped buffer layer 32 with the predetermined thickness t32 is formed at a position shallower than that of the proton-doped buffer layer 31 with respect to the substrate back surface. Ion implantation of p-type impurities, for example, boron, is then performed from the back surface of the semiconductor wafer to form the p$^+$-type collector layer 1. The ion implantation of, for example, boron for forming the p$^+$-type collector layer 1 may be performed under the conditions of an accelerating voltage of 45 keV and a dose amount of $1.0 \times 10^{13}$/cm². The phosphorus-doped buffer layer 32 and the p$^+$-collector layer 1 are then activated by performing laser annealing or annealing at a temperature of about 330° C. (inclusive) to 450° C. (inclusive). The fabrication of the semiconductor device depicted in FIG. 9 is then completed by forming the collector electrode 9 on the back surface of the semiconductor wafer.

As described hereinabove, according to Embodiment 5, by providing the continuous proton-doped buffer layer constituted by a plurality of buffer layers at a deep position from the substrate back surface, it is possible to suppress the decrease in breakdown voltage occurring because the depletion layer extending from the emitter side at the time of turn-off punches through the p+-type collector layer (field stop function) and to obtain the effect same as in Embodiment 1. Further, according to Embodiment 5, by providing the proton-doped buffer layer, it is possible to suppress the occurrence of defects such as particles and scratches on the wafer back surface in the manufacturing process, in the same manner as in the conventional configuration, and also increase the number of carriers remaining in the collector and suppress oscillations of the voltage-current waveform at the time of turn-off. As a result, the thickness of the drift layer (wafer thickness) can be reduced (the wafer can be made thinner), and therefore the ON voltage can be reduced and the switching losses can be also reduced.

Further, according to Embodiment 5, by providing the phosphorus-doped buffer layer at a position shallower than that of the proton-doped buffer layer from the substrate back surface, it is possible to prevent the decrease in breakdown voltage occurring because the depletion layer extending from the emitter side at the time of turn-off punches through the p$^+$-type collector layer and suppress the injection of carriers from the collector side into the drift layer. As a result, the wafer can be reduced in thickness, and therefore the ON voltage and switching losses can be further reduced. With a low breakdown voltage which is equal to or lower than the rated voltage of 600 V, although the thickness of the proton-doped buffer layer is larger than that of the semiconductor substrate, by providing the phosphorus-doped buffer layer, it is possible to obtain a better trade-off relationship between the ON voltage and switching losses. Thus, by providing the buffer layer of a two-layer structure constituted by the proton-doped buffer layer and phosphorus-doped buffer layer, it is possible to improve further the trade-off relationship between the ON voltage and switching losses.

Further, according to Embodiment 5, by reducing the thickness of the wafer after forming the front-surface element structure (MOS gate structure or the like) on the wafer front surface side, it is possible to form the front-surface element structure on the wafer front surface in a state with a high mechanical strength of the wafer. As a result, the front-surface element structure can be miniaturized and the ON voltage can be further reduced.

Embodiment 6

Figure 15:
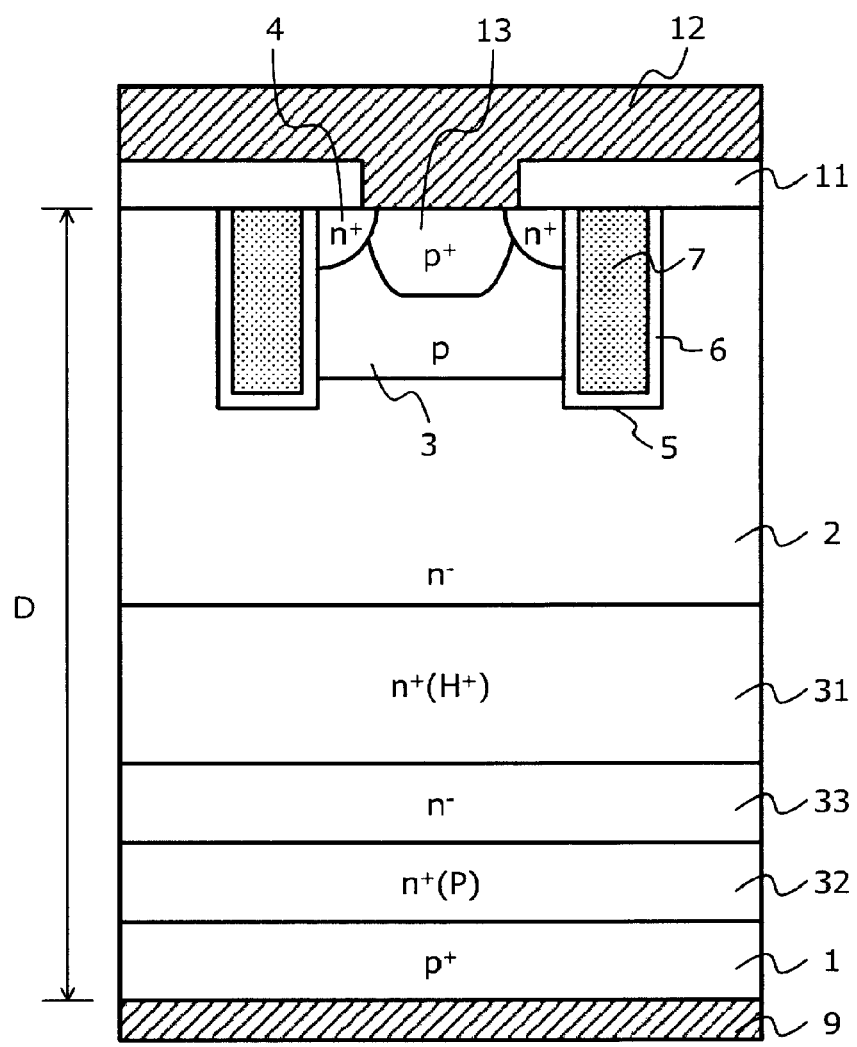
FIG. 15 is a cross-sectional view illustrating the structure of the semiconductor device according to Embodiment 6.
Figure 16:
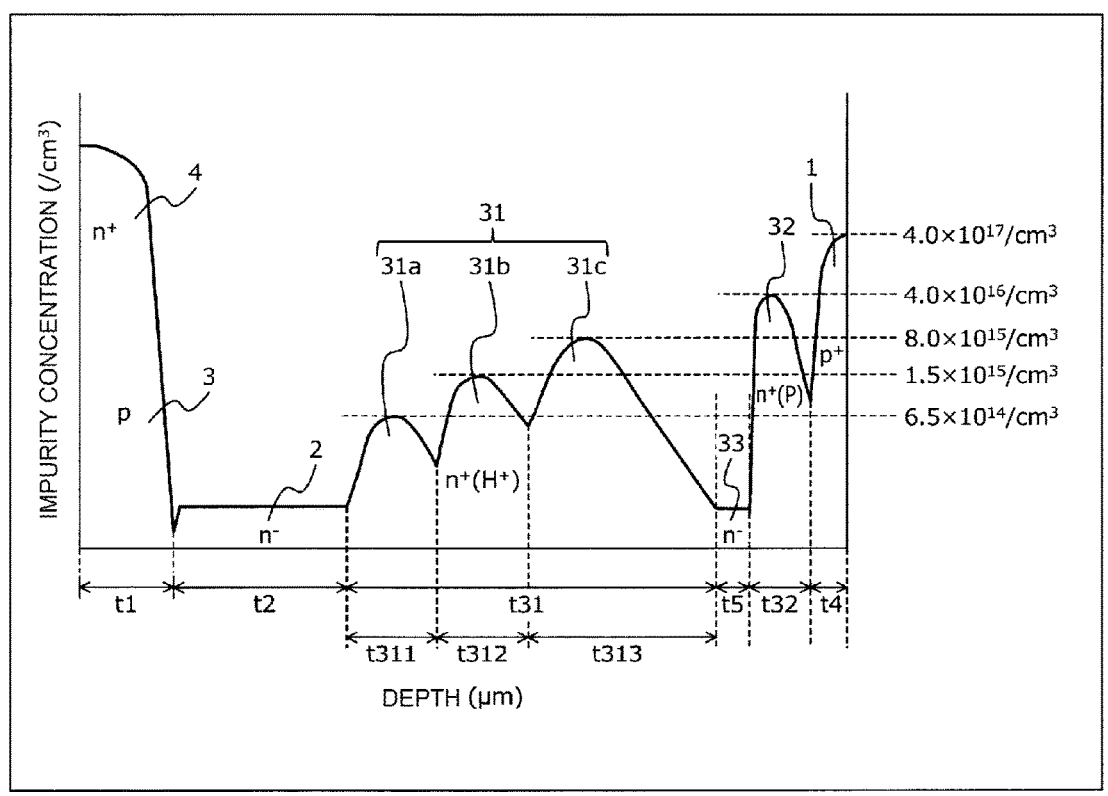
FIG. 16 is a characteristic diagram illustrating the impurity concentration distribution in the depth direction of the semiconductor device depicted in FIG. 15.

The structure of the semiconductor device according to Embodiment 6 will be explained hereinbelow. FIG. 15 is a cross-sectional view illustrating the structure of the semiconductor device according to Embodiment 6. FIG. 16 is a characteristic diagram illustrating the impurity concentration distribution in the depth direction of the semiconductor device depicted in FIG. 15. The semiconductor device according to Embodiment 6 differs from the semiconductor device according to Embodiment 5 in that the proton-doped buffer layer 31 and the phosphorus-doped buffer layer 32 are arranged separately from each other, and the proton-doped buffer layer 31 is provided at a deeper position from the substrate back surface. More specifically, an n$^-$-type layer 33 is provided between the proton-doped buffer layer 31 and the phosphorus-doped buffer layer 32. Thus, the sum total of the thickness t1 of the p-type base region 3, the thickness t2 of the n$^-$-type drift layer 2, the thickness t31 of the proton-doped buffer layer 31, the thickness t5 of the n$^-$-type layer 33, the thickness t32 of the phosphorus-doped buffer layer 32, and the thickness t4 of the p$^+$-type collector layer 1 is the thickness D of the semiconductor substrate. The impurity concentration in the n$^-$-type layer 33 is, for example, the same as the impurity concentration in the n$^-$-drift layer 2.

An example of dimensions and impurity concentration of various parts of the semiconductor device according to Embodiment 6 will be explained hereinbelow. For example, when the rated voltage is 600 V, the breakdown voltage is made about 700 V and the dimensions and impurity concentration of various parts take the following values. The thickness D of the semiconductor substrate and the specific resistance of the n$^-$-type drift layer 2 are the same as in Embodiment 5. The thickness t1 of the p-type base region 3 is the same as in Embodiment 5. The thickness t2 of the n$^-$-type drift layer 2 is 24.7 μm. The peak concentration of the first proton-doped buffer layer 31a is $6.5 \times 10^{14}$/cm³, and the thickness t311 thereof is 9.0 µm. The peak concentration of the second proton-doped buffer layer 31b is $1.5 \times 10^{15}/\text{cm}^3$, and the thickness t312 thereof is 9.0 µm. The peak concentration of the third proton-doped buffer layer 31c is $8.0 \times 10^{15}/\text{cm}^3$, and the thickness t313 thereof is 12.0 µm. Thus, the thickness t31 of the proton-doped buffer layer 31 is 30.0 µm. The thickness t5 of the n⁻-type layer 33 is 1.0 µm. The peak concentration and thickness t32 of the phosphorus-doped buffer layer 32 are the same as in Embodiment 5. The impurity concentration and thickness t4 of the p⁺-type collector layer 1 are the same as in Embodiment 5.

A method for manufacturing the semiconductor device according to Embodiment 6 may be realized, for example, by the method for manufacturing the semiconductor device according to Embodiment 5 in which multistage proton implantation for forming the proton-doped buffer layer 31 is performed such that the n⁻-type region with the substrate concentration which serves as the n⁻-type layer 33 remains between the proton-doped buffer layer 31 and the phosphorus-doped buffer layer 32. More specifically, for example, when a semiconductor device with the aforementioned rated voltage of 600 V is fabricated, the multistage implantation of protons for forming the first to third proton-doped buffer layers 31a to 31c may performed in the following manner. The proton implantation for forming the first proton-doped buffer layer 31a may be performed, for example, under the conditions of an accelerating voltage of 1.5 MeV and a dose amount of $2.0 \times 10^{13}/\text{cm}^2$. The proton implantation for forming the second proton-doped buffer layer 31b may be performed, for example, under the conditions of an accelerating voltage of 1.2 MeV and a dose amount of $5.0 \times 10^{13}/\text{cm}^2$. The proton implantation for forming the third proton-doped buffer layer 31c may be performed, for example, under the conditions of an accelerating voltage of 800 keV and a dose amount of $2.0 \times 10^{14}/\text{cm}^2$.

The effect that can be obtained with Embodiment 6, as described hereinabove, is the same as that of Embodiment 5. Further, according to Embodiment 6, by providing the n⁻-type layer between the proton-doped buffer layer and phosphorus-doped buffer layer, it is possible to arrange the proton-doped buffer layer at a deeper position from the substrate front surface. As a result, the effect of suppressing the oscillations of voltage-current waveform at the time of turn-off is further increased. Further, since the effect of suppressing the oscillations of voltage-current waveform at the time of turn-off is further increased, the thickness of the semiconductor substrate can be further reduced and the trade-off relationship between the ON voltage and switching losses can be further improved.

Embodiment 7

Figure 17:
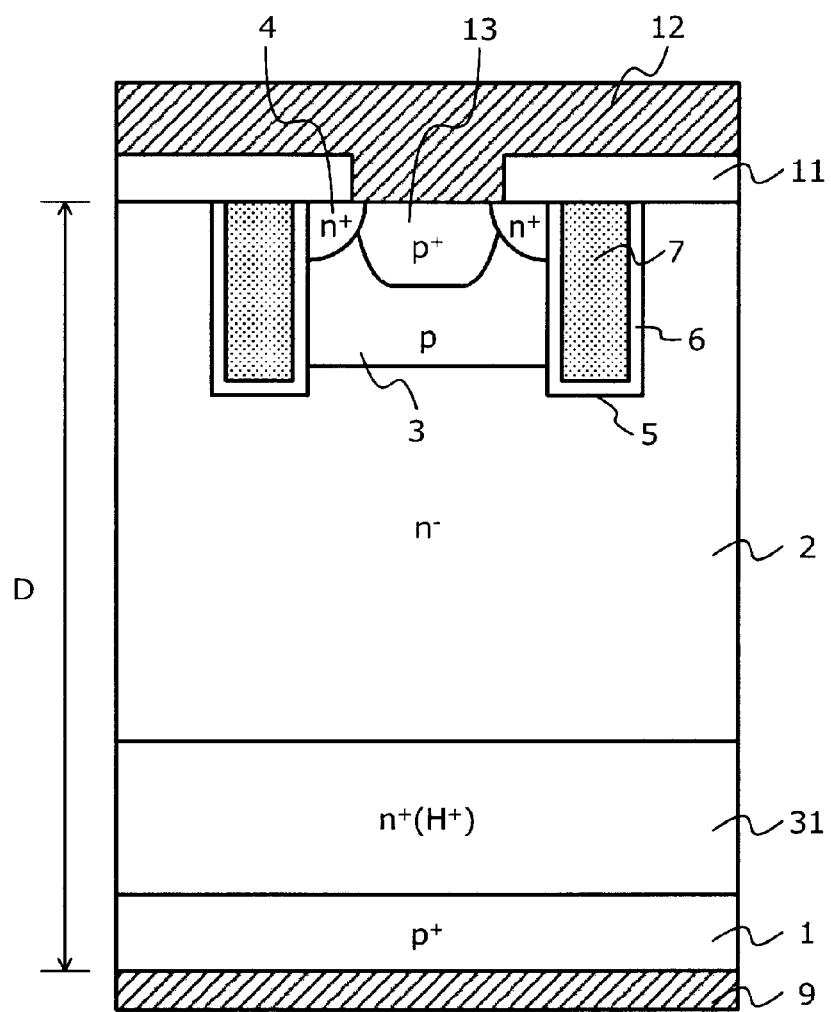
FIG. 17 is a cross-sectional view illustrating the structure of the semiconductor device according to Embodiment 7.
Figure 18:
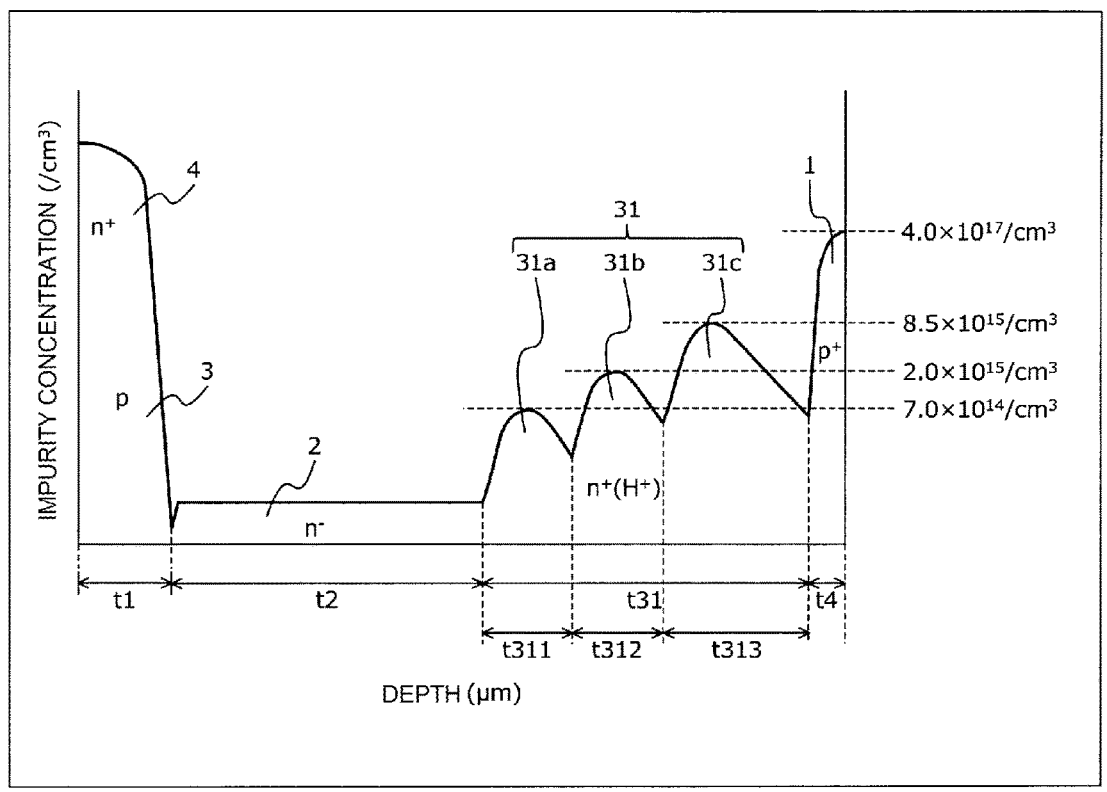
FIG. 18 is a characteristic diagram illustrating the impurity concentration distribution in the depth direction of the semiconductor device depicted in FIG. 17.

The structure of the semiconductor device according to Embodiment 7 will be explained hereinbelow. FIG. 17 is a cross-sectional view illustrating the structure of the semiconductor device according to Embodiment 7. FIG. 18 is a characteristic diagram illustrating the impurity concentration distribution in the depth direction of the semiconductor device depicted in FIG. 17. The semiconductor device according to Embodiment 7 differs from the semiconductor device according to Embodiment 5 in that the phosphorus-doped buffer layer is not provided. Thus, the proton-doped buffer layer 31 is arranged such as to be in contact with the p⁺-type collector layer 1, and the sum total of the thickness t1 of the p-type base region 3, the thickness t2 of the n⁻-type drift layer 2, the thickness t31 of the proton-doped buffer layer 31, and the thickness t4 of the p⁺-type collector layer 1 is the thickness D of the semiconductor substrate. Further, in Embodiment 7, the thickness t31 of the proton-doped buffer layer 31 is substantially equal to the thickness t2 of the type drift layer 2 or larger than the thickness t2 of the n⁻-type drift layer 2. In this case, a configuration in which the depletion layer extending from the emitter side at the time of turn-off does not punch through the p⁺-type collector layer 1 may be obtained, for example, by setting a high dose amount of the proton-doped buffer layer 31. Therefore, the decrease in breakdown voltage caused by the punch-through is eliminated, the manufacturing process can be simplified since the proton-doped buffer layer 31 is not formed as the buffer layer, and the cost is reduced.

An example of dimensions and impurity concentration of various parts of the semiconductor device according to Embodiment 7 will be explained hereinbelow. For example, when the rated voltage is 600 V, the breakdown voltage is made about 700 V and the dimensions and impurity concentration of various parts take the following values. The thickness D of the semiconductor substrate and the thickness t1 of the p-type base region 3 are the same as in Embodiment 5. The thickness t2 of the n⁻-type drift layer 2 is 28.2 µm, and the specific resistance thereof is the same as in Embodiment 5. The peak concentration of the first proton-doped buffer layer 31a and the thickness t311 thereof are the same as in Embodiment 5. The peak concentration of the second proton-doped buffer layer 31b and the thickness t312 thereof are the same as in Embodiment 5. The peak concentration of the third proton-doped buffer layer 31c is the same as in Embodiment 5 and the thickness t313 thereof is 10.5 µm. Thus, the thickness t31 of the proton-doped buffer layer 31 is 28.5 µm. The impurity concentration of the p⁺-type collector layer 1 and the thickness t4 thereof are the same as in Embodiment 5.

A method for manufacturing the semiconductor device according to Embodiment 7 may be realized, for example, by the method for manufacturing the semiconductor device according to Embodiment 5 in which the step for ion implanting phosphorus for forming the phosphorus-doped buffer layer is omitted. In this case, when a semiconductor device with the aforementioned rated voltage of 600 V is fabricated, the multistage implantation of protons for forming the first to third proton-doped buffer layers 31a to 31c may be, for example, the same as in Embodiment 5.

The effect that can be obtained with Embodiment 7, as described hereinabove, is the same as that of Embodiment 5.

Embodiment 8

Figure 19:
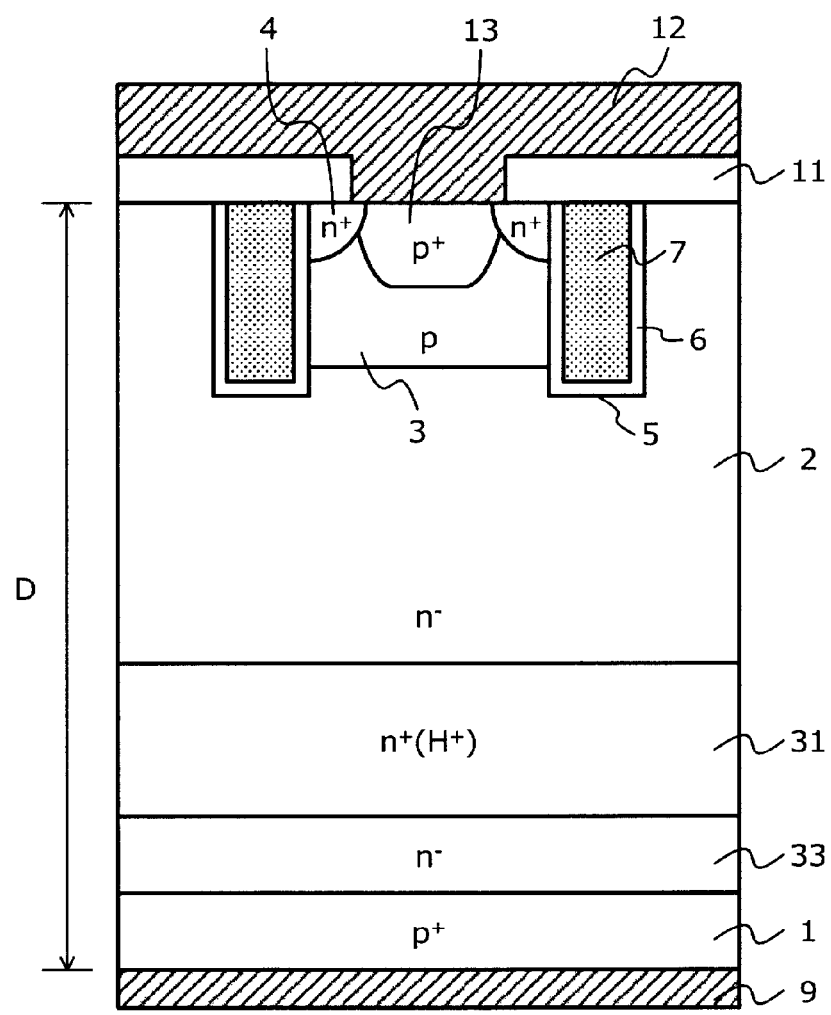
FIG. 19 is a cross-sectional view illustrating the structure of the semiconductor device according to Embodiment 8.
Figure 20:
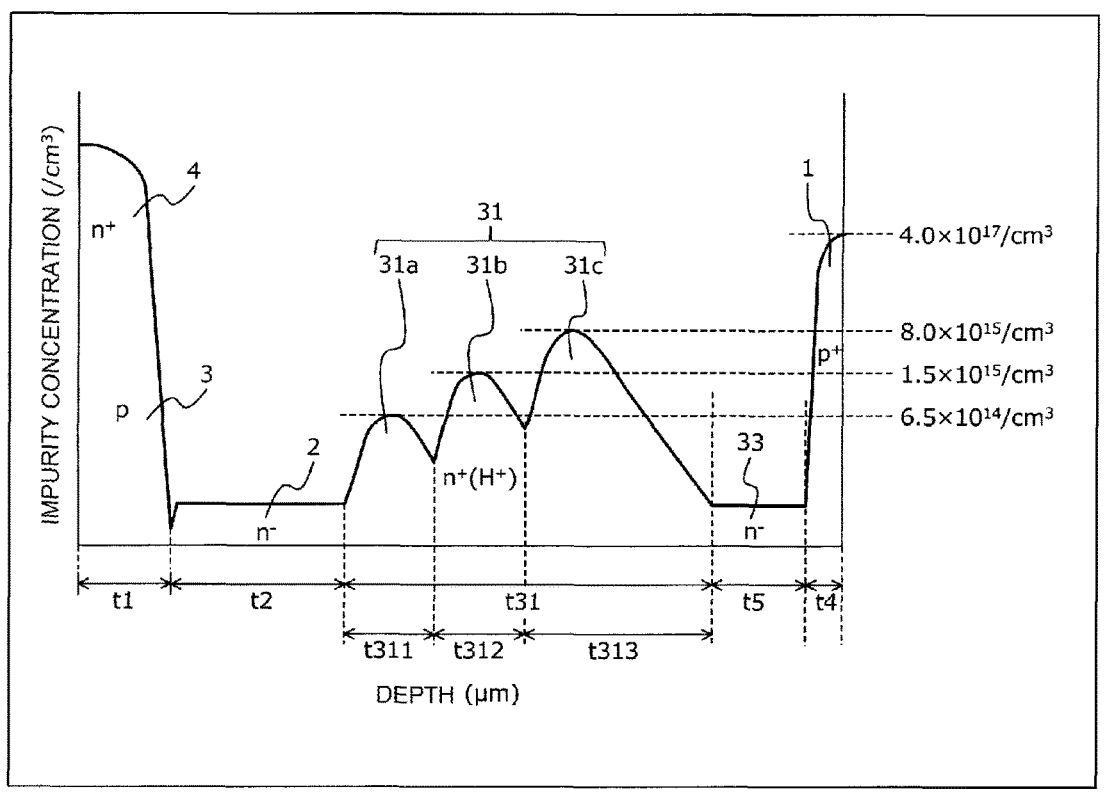
FIG. 20 is a characteristic diagram illustrating the impurity concentration distribution in the depth direction of the semiconductor device depicted in FIG. 19.

The structure of the semiconductor device according to Embodiment 8 will be explained hereinbelow. FIG. 19 is a cross-sectional view illustrating the structure of the semiconductor device according to Embodiment 8. FIG. 20 is a characteristic diagram illustrating the impurity concentration distribution in the depth direction of the semiconductor device depicted in FIG. 19. The semiconductor device according to Embodiment 8 differs from the semiconductor device according to Embodiment 7 in that the proton-doped buffer layer 31 and the p⁺-type collector layer 1 are arranged separately from each other, and the proton-doped buffer layer 31 is provided at a deeper position from the substrate back surface. More specifically, the n⁻-type layer 33 is provided between the proton-doped buffer layer 31 and the p⁺-type collector layer 1. Thus, the sum total of the thickness t1 of the p-type base region 3, the thickness t2 of the n⁻-type drift layer 2, the thickness t31 of the proton-doped buffer layer 31, the thickness t5 of the n⁻-type layer 33, and the thickness t4 of the p$^+$-type collector layer 1 is the thickness D of the semiconductor substrate. The impurity concentration in the n$^-$-type layer 33 is, for example, the same as the impurity concentration in the n$^-$-drift layer 2.

An example of dimensions and impurity concentration of various parts of the semiconductor device according to Embodiment 8 will be explained hereinbelow. For example, when the rated voltage is 600 V, the breakdown voltage is made about 700 V and the dimensions and impurity concentration of various parts take the following values. The thickness D of the semiconductor substrate and the specific resistance of the n$^-$-type drift layer 2 are the same as in Embodiment 7. The thickness t1 of the p-type base region 3 is the same as in Embodiment 7. The thickness t2 of the n$^-$-type drift layer 2 is 24.7 μm. The peak concentration of the first proton-doped buffer layer 31$a$ is 6.5×10$^{14}$/cm$^3$, and the thickness t311 thereof is 9.0 μm. The peak concentration of the second proton-doped buffer layer 31$b$ is 1.5×10$^{15}$/cm$^3$, and the thickness t312 thereof is 9.0 μm. The peak concentration of the third proton-coped buffer layer 31$c$ is 8.0×10$^{15}$/cm$^3$, and the thickness t313 thereof is 12.0 μm. Thus, the thickness t31 of the proton-doped buffer layer 31 is 30.0 μm. The thickness t5 of the n$^-$-type layer 33 is 2.0 μm. The impurity concentration and thickness t4 of the p$^+$-type collector layer 1 are the same as in Embodiment 7.

A method for manufacturing the semiconductor device according to Embodiment 8 may be realized, for example, by the method for manufacturing the semiconductor device according to Embodiment 7 in which multistage proton implantation for forming the proton-doped buffer layer 31 is performed such that the n$^-$-type region with a substrate concentration which serves as the n$^-$-type layer 33 remains between the proton-doped buffer layer 31 and the p$^+$-type collector layer 1. More specifically, for example, when a semiconductor device with the aforementioned rated voltage of 600 V is fabricated, the multistage implantation of protons for forming the first to third proton-doped buffer layers 31$a$ to 31$c$ may performed in the following manner. The proton implantation for forming the first proton-doped buffer layer 31$a$ may be performed, for example, under the conditions of an accelerating voltage of 1.5 MeV and a dose amount of 2.0×10$^{13}$/cm$^2$. The proton implantation for forming the second proton-doped buffer layer 31$b$ may be performed, for example, under the conditions of an accelerating voltage of 1.2 MeV and a dose amount of 5.0×10$^{13}$/cm$^2$. The proton implantation for forming the third proton-doped buffer layer 31$c$ may be performed, for example, under the conditions of an accelerating voltage of 800 keV and a dose amount of 2.0×10$^{14}$/cm$^2$.

The effect that can be obtained with Embodiment 8, as described hereinabove, is the same as that of Embodiment 7. Further, according to Embodiment 8, by providing the n$^-$-type layer between the proton-doped buffer layer and p-type collector layer, it is possible to arrange the proton-doped buffer layer at a deeper position from the substrate front surface. As a result, the effect of suppressing the oscillations of voltage-current waveform at the time of turn-off is further increased. Further, since the effect of suppressing the oscillations of voltage-current waveform at the time of turn-off is further increased, the thickness of the semiconductor substrate can be further reduced and the trade-off relationship between the ON voltage and switching losses can be further improved.

Embodiment 9

Figure 21:
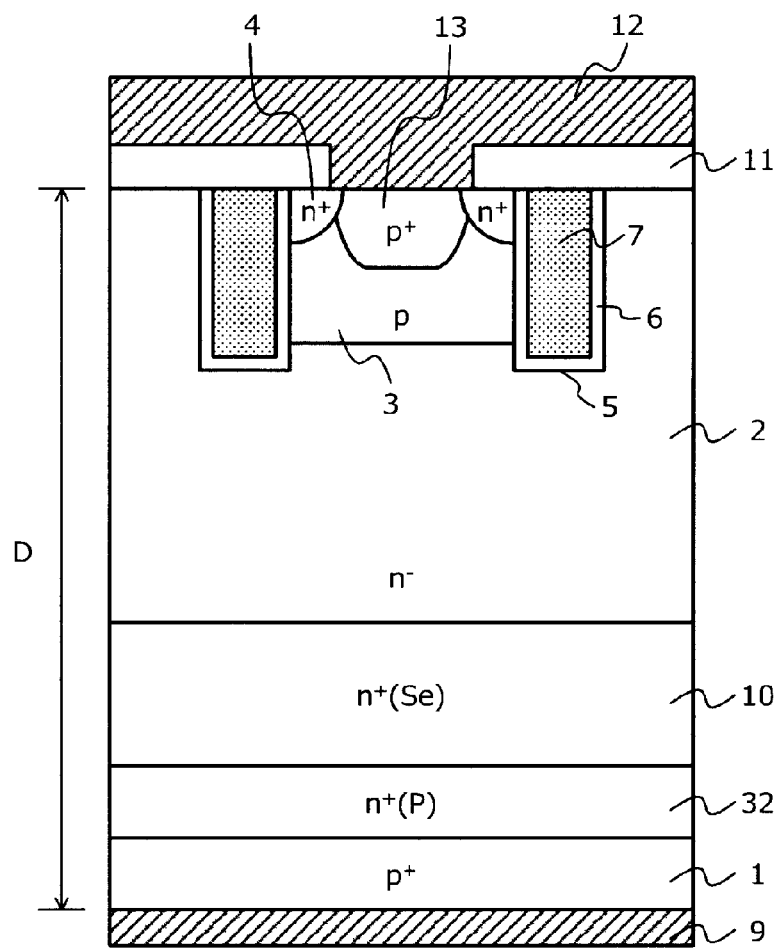
FIG. 21 is a cross-sectional view illustrating the structure of the semiconductor device according to Embodiment 9.
Figure 22:
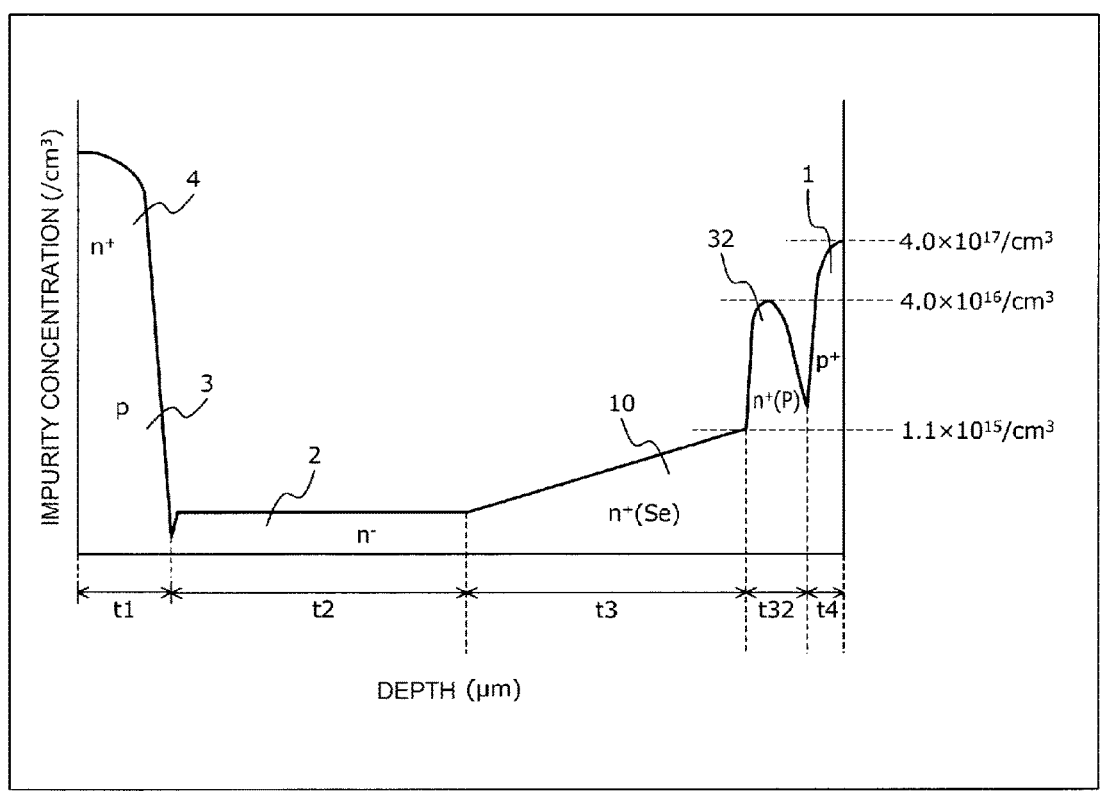
FIG. 22 is a characteristic diagram illustrating the impurity concentration distribution in the depth direction of the semiconductor device depicted in FIG. 21.

The structure of the semiconductor device according to Embodiment 9 will be explained hereinbelow. FIG. 21 is a cross-sectional view illustrating the structure of the semiconductor device according to Embodiment 9. FIG. 22 is a characteristic diagram illustrating the impurity concentration distribution in the depth direction of the semiconductor device depicted in FIG. 21. The semiconductor device according to Embodiment 9 differs from the semiconductor device according to Embodiment 1 in that the phosphorus-doped buffer layer 32 is provided between the n$^+$-type buffer layer (for example, a buffer layer doped with selenium; referred to hereinbelow as "selenium-doped buffer layer") 10 and the p$^+$-type collector layer 1. The phosphorus-doped buffer layer 32 is in contact with the selenium-doped buffer layer 10 and the p$^+$-type collector layer 1. Thus, the sum total of the thickness t1 of the p-type base region 3, the thickness t2 of the n$^-$-type drift layer 2, the thickness t3 of the selenium-doped buffer layer 10, the thickness t32 of the phosphorus-doped buffer layer 32, and the thickness t4 of the p$^+$-type collector layer 1 is the thickness D of the semiconductor substrate. In FIGS. 21 and 22, the conductivity type of the selenium-doped buffer layer 10 is n+ (Se).

An example of dimensions and impurity concentration of various parts of the semiconductor device according to Embodiment 9 will be explained hereinbelow. For example, when the rated voltage is 600 V, the breakdown voltage is made about 700 V and the dimensions and impurity concentration of various parts take the following values. The thickness D of the semiconductor substrate and the thickness t1 of the p-type base region 3 are the same as in Embodiment 1. The thickness t2 and specific resistance of the n$^-$-type drift layer 2 are the same as in Embodiment 1. The peak concentration (impurity concentration on the collector side) of the selenium-doped buffer layer 10 is the same as in Embodiment 1, and the thickness t3 thereof is 28.5 μm. The peak concentration of the phosphorus-doped buffer layer 32 is 4.0×10$^{16}$/cm$^3$, and the thickness t32 thereof is 1.0 μm. The peak concentration of the p$^+$-type collector layer 1 is 4.0×10$^{17}$/cm$^3$, and the thickness t4 thereof is 0.5 μm.

A method for manufacturing the semiconductor device according to Embodiment 9 may be realized, for example, by the method for manufacturing the semiconductor device according to Embodiment 1 which additionally includes a phosphorus ion implantation step for forming the phosphorus-doped buffer layer. The phosphorus ion implantation step for forming the phosphorus-doped buffer layer is, for example, the same as in Embodiment 5.

The effect that can be obtained with Embodiment 9, as described hereinabove, is the same as that of Embodiment 1. Further, according to Embodiment 9, by providing the selenium-doped buffer layer, it is possible to suppress the occurrence of defects caused by particles and scratches appearing on the wafer back surface in the manufacturing process, in the same manner as in the conventional configuration, and also suppress the oscillations of voltage-current waveform at the time of turn-off. As a result, the thickness of the drift layer can be decreased, and therefore the ON voltage and switching losses can be reduced. Further according to Embodiment 9, although the thickness of the selenium-doped buffer layer is larger than that of the semiconductor substrate, the specific resistance of the n$^-$-type drift layer may be increased and the ratio of the impurity concentration in the selenium-doped buffer layer to the impurity concentration in the n$^-$-drift layer may be reduced and the decrease in voltage resistance can be prevented.

Example 3

Figure 23:
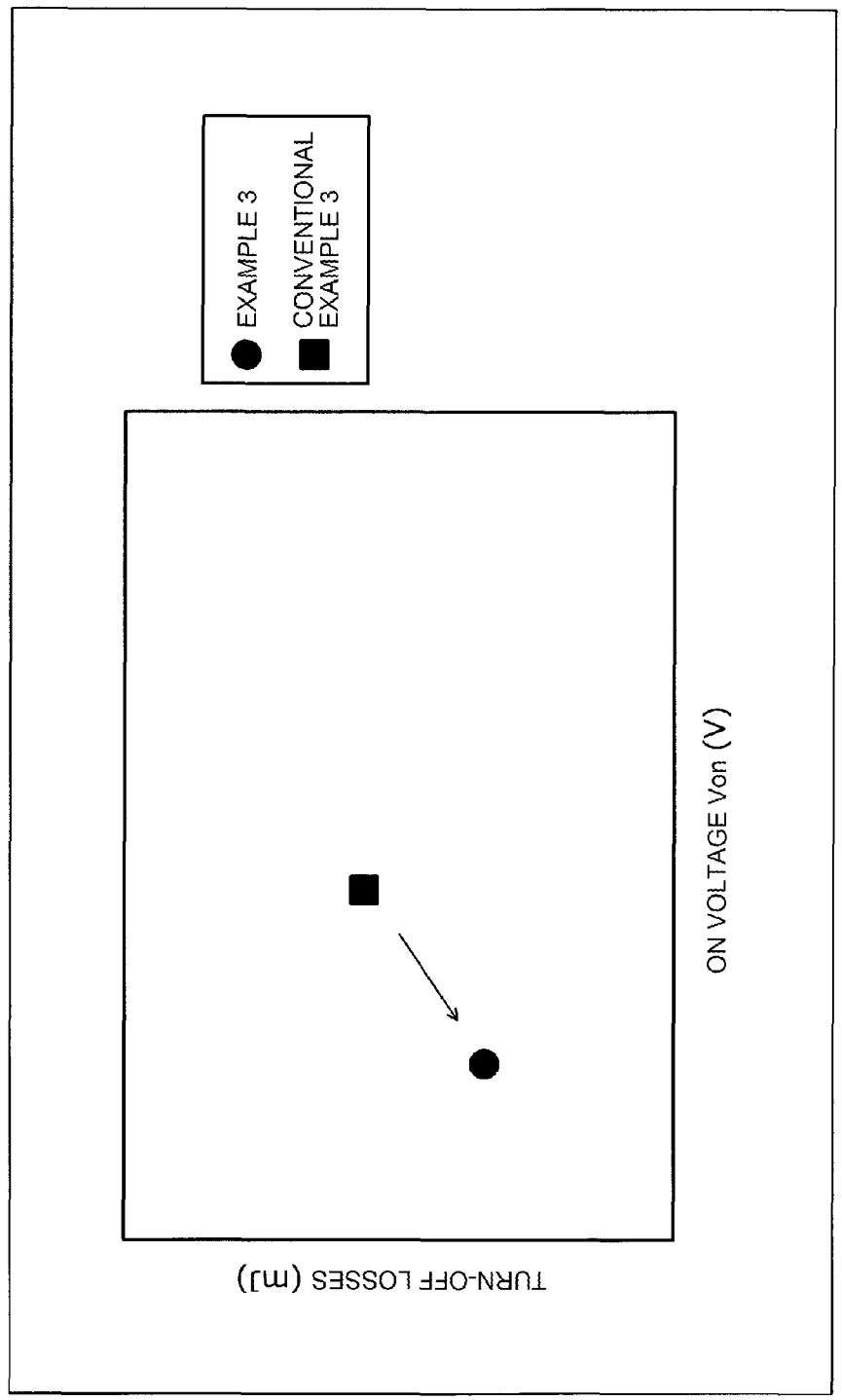
FIG. 23 is a characteristic diagram illustrating the trade-off relationship between the ON voltage and switching losses in the semiconductor device according to Embodiment 3.
Figure 27:
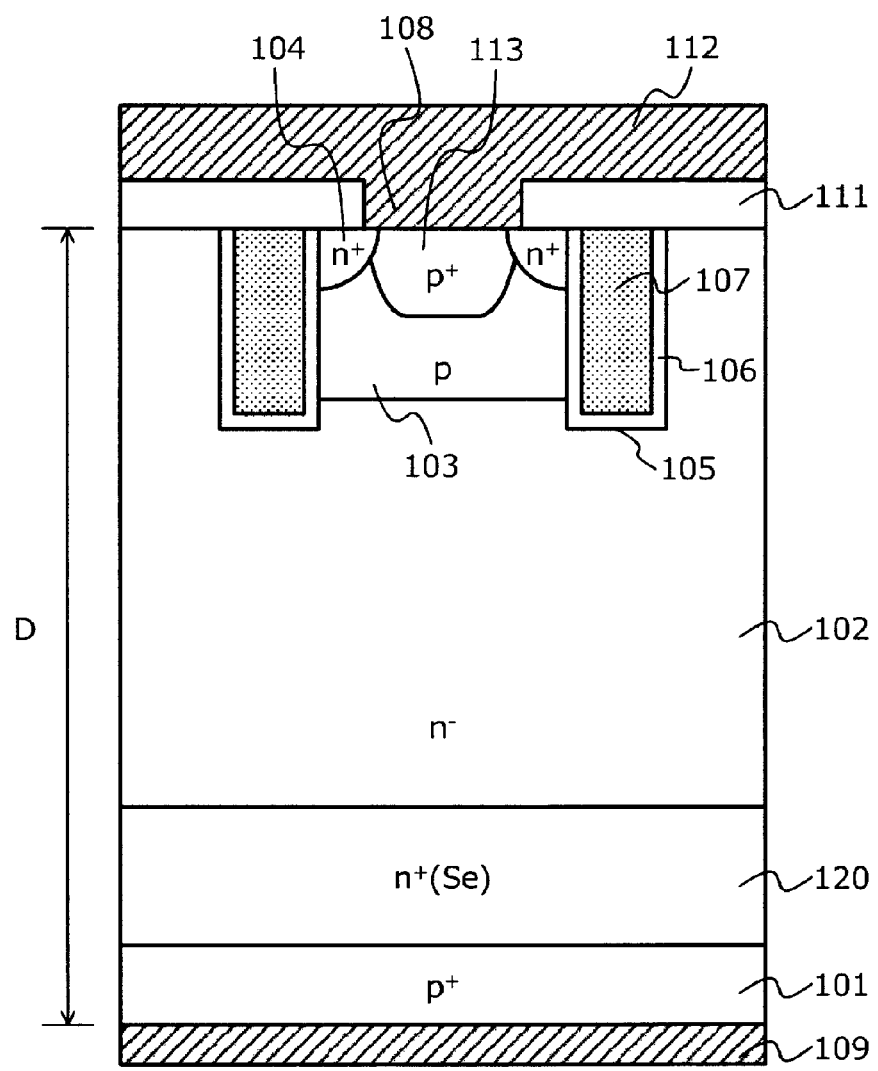
FIG. 27 is a cross-sectional view illustrating another structure of a conventional FS-IGBT.
Figure 28:
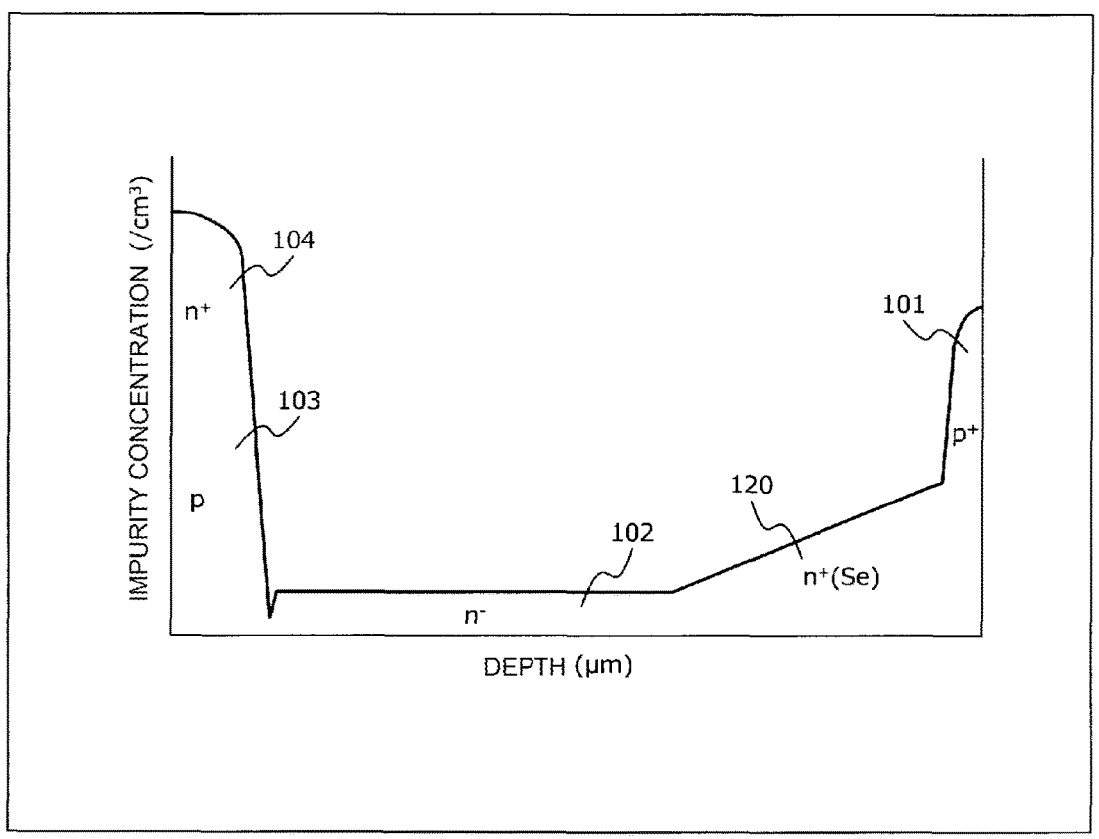
FIG. 28 is a characteristic diagram illustrating the impurity concentration distribution in the depth direction of the FS-IGBT depicted in FIG. 27.
Figure 29:
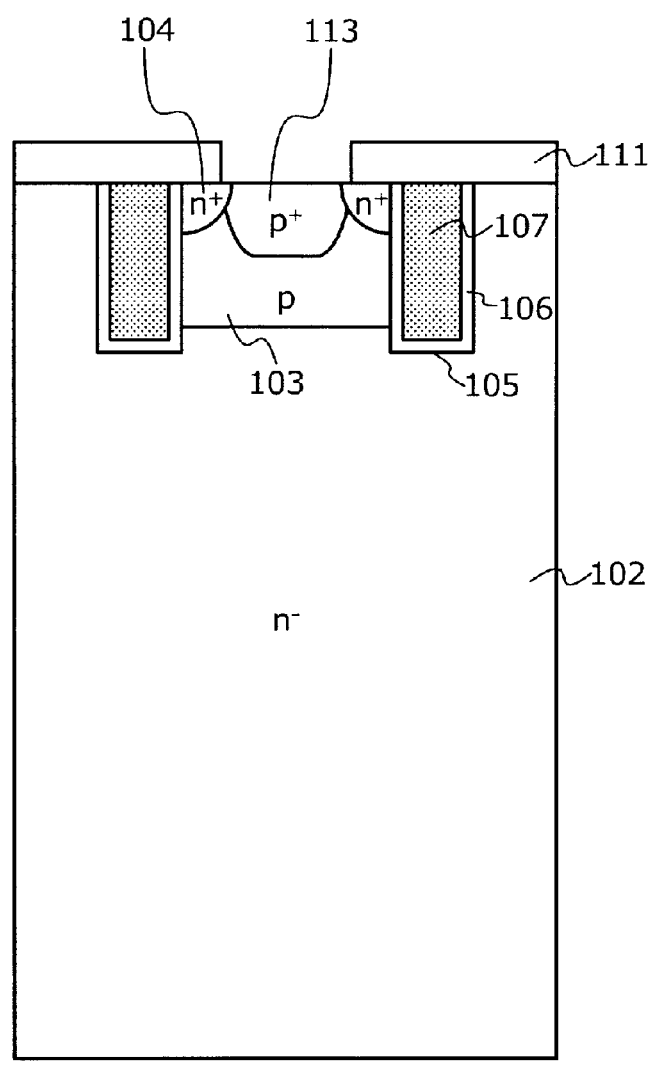
FIG. 29 is a cross-sectional view illustrating states in the process of manufacturing a conventional FS-IGBT.
Figure 30:
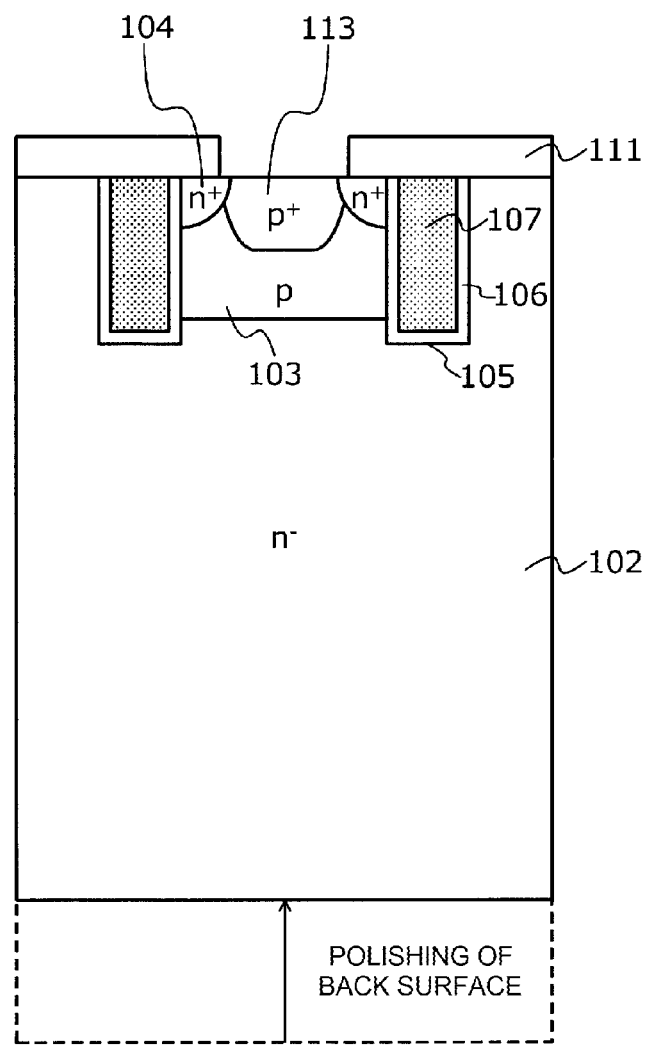
FIG. 30 is a cross-sectional view illustrating states in the process of manufacturing a conventional FS-IGBT.
Figure 31:
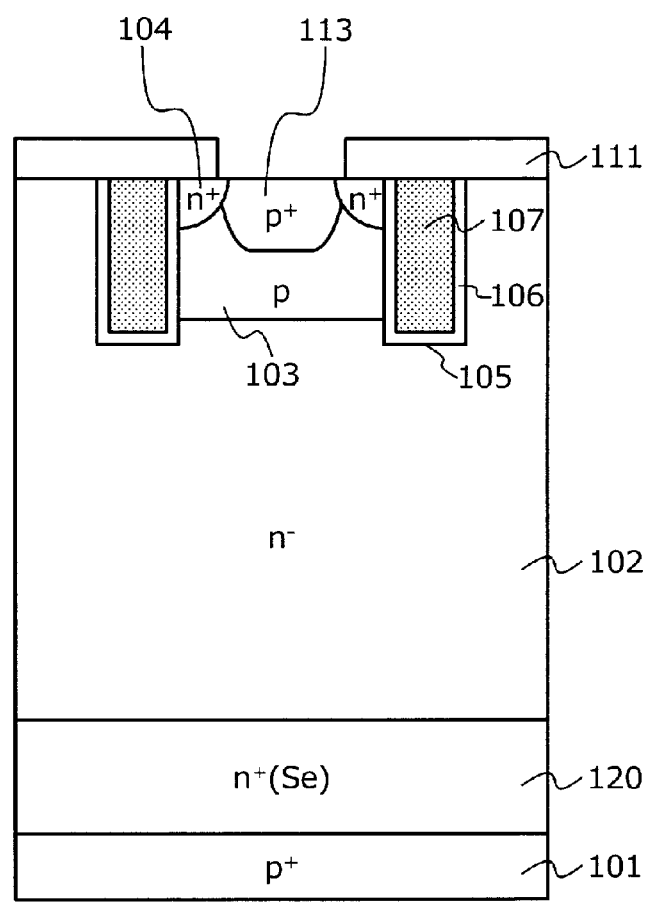
FIG. 31 is a cross-sectional view illustrating states in the process of manufacturing a conventional FS-IGBT.
Figure 32:
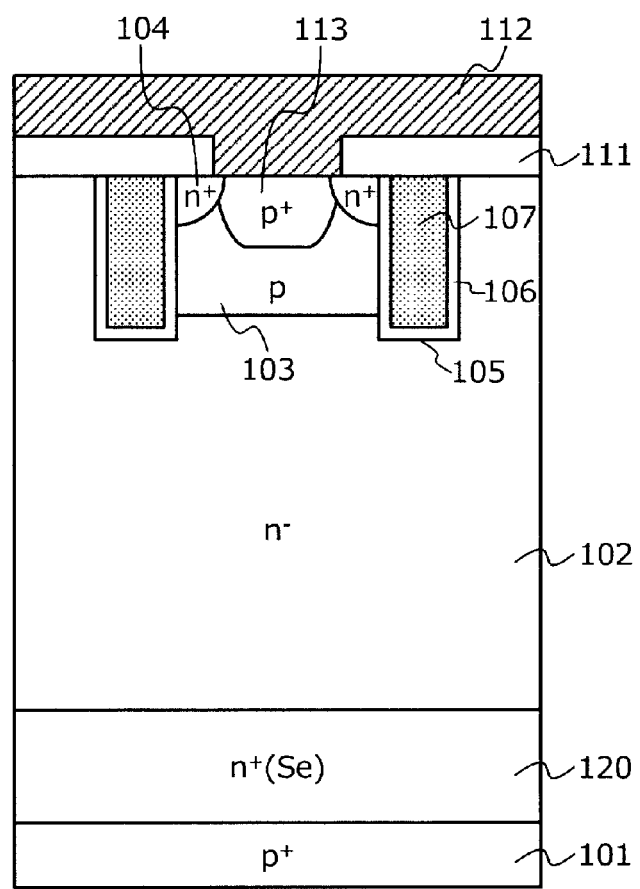
FIG. 32 is a cross-sectional view illustrating states in the process of manufacturing a conventional FS-IGBT.

The trade-off relationship between the ON voltage and switching losses (turn-off losses) of the semiconductor device in accordance with the present invention will be explained hereinbelow. FIG. 23 is a characteristic diagram illustrating the trade-off relationship between the ON voltage and switching losses of the semiconductor device according to Example 3. The trade-of relationship between the ON voltage and switching losses of the semiconductor device according to the above-described Embodiment 5 (referred to hereinbelow as "Example 3") is depicted in FIG. 23 with a ● symbol. For comparison, FIG. 23 also shows, with a ■ symbol, the trade-of relationship between the ON voltage and switching losses of the conventional semiconductor device in which the selenium-doped buffer layer 120 is provided such as to be in contact with the $p^+$-type collector layer 101 (see FIG. 27; referred to hereinbelow as "Conventional Example 3").

As depicted in FIG. 23, it was confirmed that in Example 3, both the ON voltage and the switching losses are reduced with respect to those in Conventional Example 3. Thus, in the present invention, oscillations of the voltage-current waveform at the time of turn-off can be greatly reduced with respect to those in the conventional configuration, thereby making it possible to reduce the silicon thickness. Therefore, it is clear that the trade-off relationship between the ON voltage and switching losses can be further improved with respect to that in the conventional configuration. It has also been confirmed that the effect same as that in Example 3 can be also obtained with the semiconductor devices according to Embodiments 6 to 9 (this effect is not depicted in the figure).

Embodiment 10

Figure 33:
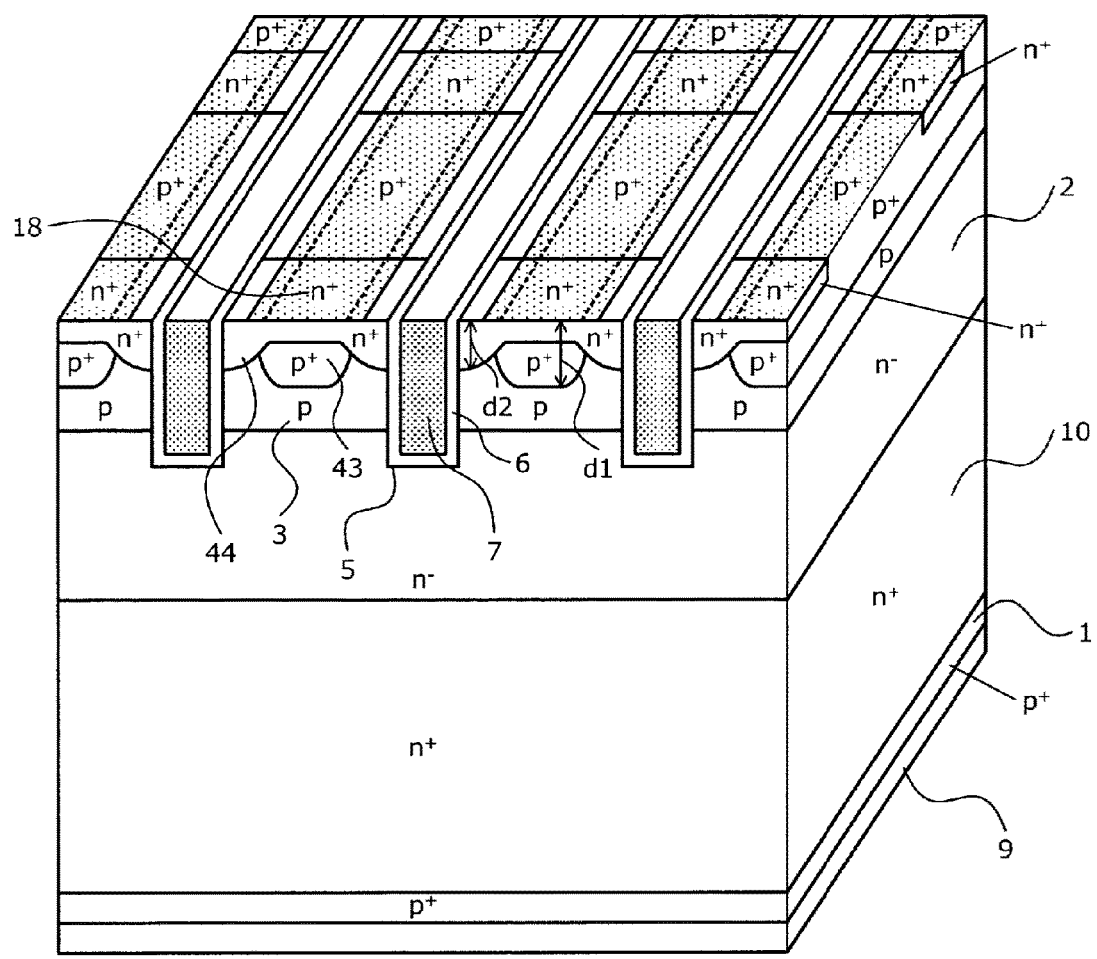
FIG. 33 is a perspective view illustrating the structure of the semiconductor device according to Embodiment 10.

The structure of the semiconductor device according to Embodiment 10 will be explained hereinbelow. FIG. 33 is a perspective view illustrating the structure of the semiconductor device according to Embodiment 10. There are the following two differences between the semiconductor device according to Embodiment 10 and the semiconductor device according to Embodiment 2. The first difference is that an $n^+$-type emitter region 44 is provided continuously in the short-side direction of the trenches 5 over the entire distance between the adjacent trenches 5. The second difference is that a $p^+$-type contact region 43 is provided to extend substantially linearly in the longitudinal direction of the trenches 5 directly below (collector side) each $n^+$-type emitter region 44. On the upper surface of the perspective view in FIG. 33, each hatched portion is a contact 18 of the $n^+$-type emitter region 44, the $p^+$-type contact region 43, and the p-type base region 3 with an emitter electrode (not depicted in the figure), and the unhatched regions are the regions covered with an interlayer insulating film. The portion surrounded by a dot line is the $p^+$-type contact region 43.

More specifically, as depicted in FIG. 33, in a portion where the $n^+$-type emitter region 44 is provided to form an emitter structure (cell) in the mesa region between the trenches 5, the $n^+$-type emitter region 44 is provided continuously in the short-side direction of the trenches 5 over the entire distance between the trenches 5 in the surface layer on the substrate front surface side of the p-type base region 3. Thus, only the $n^+$-type emitter region 44 is exposed at the substrate front surface. At a position deeper than the $n^+$-type emitter region 44 in the surface layer on the substrate front surface side of the p-type base region 3, the $p^+$-type contact region 43 is provided such as to be in contact with the surface on the lower side (collector side) of the $n^+$-type emitter region 44. The $p^+$-type contact region 43 is provided separately from the gate insulating film 6, which is provided on the side wall of the trenches 5, for example, close to the central portion of the mesa region. The thickness of the $n^+$-type emitter region 44 in a portion (close to the central portion) that is in contact with the $p^+$-type contact region 43 may be, for example, less than the thickness of the $n^+$-type emitter region 44 on the trench side.

Meanwhile, in the portion where the $n^+$-type emitter region 44 is not provided between the trenches 5 in the mesa region between the trenches 5, only the $p^+$-type contact region 43 is provided in the surface layer on the substrate front surface side of the p-type base region 3. Thus, in the portion where the $n^+$-type emitter region 44 is not provided between the trenches 5, the p-type base region 3 and the $p^+$-type contact region 43 (or only the $p^+$-type contact region 43) are exposed at the substrate front surface. Further, in the portion where the $n^+$-type emitter region 44 is not provided between the trenches 5, the $p^+$-type contact region 43 is provided such as to be linked with the $p^+$-type contact region 43 arranged directly below the $n^+$-type emitter region 44. Thus, in the contact 18 extending linearly in the longitudinal direction of the trenches 5, the $n^+$-type emitter regions 44 and the $p^+$-type contact regions 43 are connected to the emitter electrode (not depicted in the figure) alternately and repeatedly in the longitudinal direction of the trenches 5.

It is preferred that the trench pitch (arrangement distance in the short-side direction of the trenches 5) be, for example, 2.2 μm or more. This is because fluctuations of the threshold voltage Vth can be prevented. The depth d2 of the deepest portion of the $n^+$-type emitter region 44 (that is, the portion of the $n^+$-type emitter region 44 on the trench 5 side which is not in contact with the $p^+$-type contact region 43) from the substrate front surface is equal to the depth d1 of the $p^+$-type contact region 43 from the substrate front surface or less than the depth d1 of the $p^+$-type contact region 43 from the substrate front surface. More specifically, the depth d1 of the $p^+$-type contact region 43 from the substrate front surface is preferably, for example, about 0.5 μm or more. It is preferred that the difference between the depth d2 of the deepest portion of the $n^+$-type emitter region 44 from the substrate front surface and the depth d1 of the $p^+$-type contact region 43 from the substrate front surface be about 0.0 μm (inclusive) to 0.3 μm (inclusive). This is because the latch-up can be prevented from leading to a breakdown, and fluctuations of the threshold voltage Vth can be prevented.

A method for manufacturing the semiconductor device according to Embodiment 10 may be realized, for example, by the method for manufacturing the semiconductor device according to Embodiment 2 in which the $p^+$-type contact regions 43 are formed and then $n^+$-type emitter regions 44 are formed such as to be arranged at a predetermined interval in the longitudinal direction of the trenches 5 in the surface layer of the $p^+$-type contact regions 43. More specifically, the $p^+$-type contact regions 43 are formed in a stripe shape extending in the longitudinal direction of the trenches 5, in the same manner as in Embodiment 2. Alternatively, the $p^+$-type contact regions 43 may be formed by using the interlayer insulating film as a mask and ion implanting p-type impurities from the contact holes opened in the interlayer insulating film in order to form the contact 18 with the emitter electrode. Then, the $n^+$-type emitter regions 44 are formed using a mask opened such that the $p^+$-type contact regions 43 are exposed at a predetermined interval in the longitudinal direction of the trenches 5. Other features of the method for manufacturing the semiconductor device according to Embodiment 10 are the same as those of the method for manufacturing the semiconductor device according to Embodiment 2.

The effect that can be obtained with Embodiment 10, as described hereinabove, is the same as that of Embodiments 1 and 2. According to Embodiment 10, by providing the p$^+$-type contact region such that passes directly below the n$^+$-emitter region, it is possible to reduce the ratio of the volume of the p$^+$-type contact region to the volume of the portion where the n$^+$-type emitter region is provided to form an emitter structure. Therefore, although the trench pitch has been reduced to improve the relationship between the ON voltage and turn-off losses, the formation of the p$^+$-type contact region by penetration into the portion (portion where the channel is formed) of the p-type base region along the trench (referred to hereinbelow as "penetration of the p$^+$-type contact region into the channel") can be suppressed. Further, since the increase of impurity concentration in the portion where the channel is to be formed can be prevented, the increase in the threshold voltage can be suppressed. Therefore, the occurrence of latch-up can be prevented in the same manner as in Embodiment 2, and the increase in the threshold voltage can be suppressed.

Example 4

Figure 34:
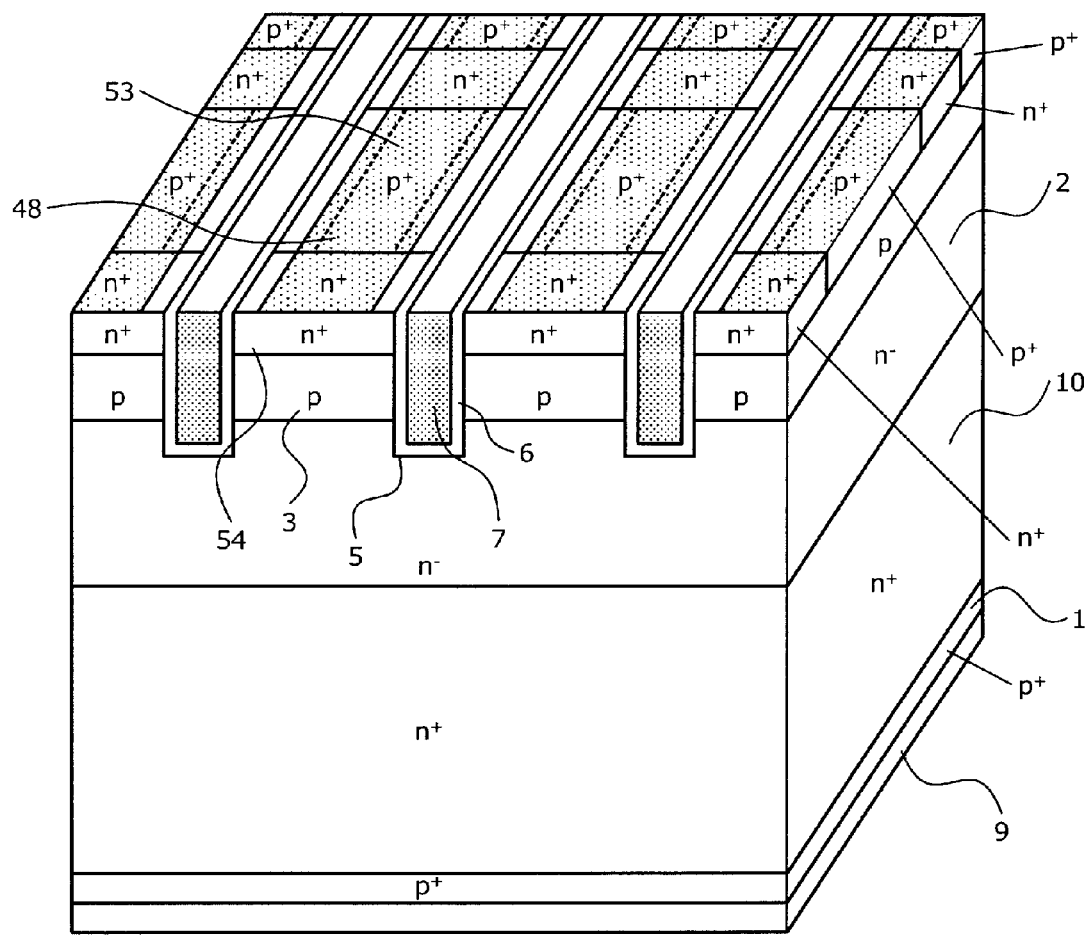
FIG. 34 is a perspective view illustrating the structure of the semiconductor device of a comparative example.
Figure 35:
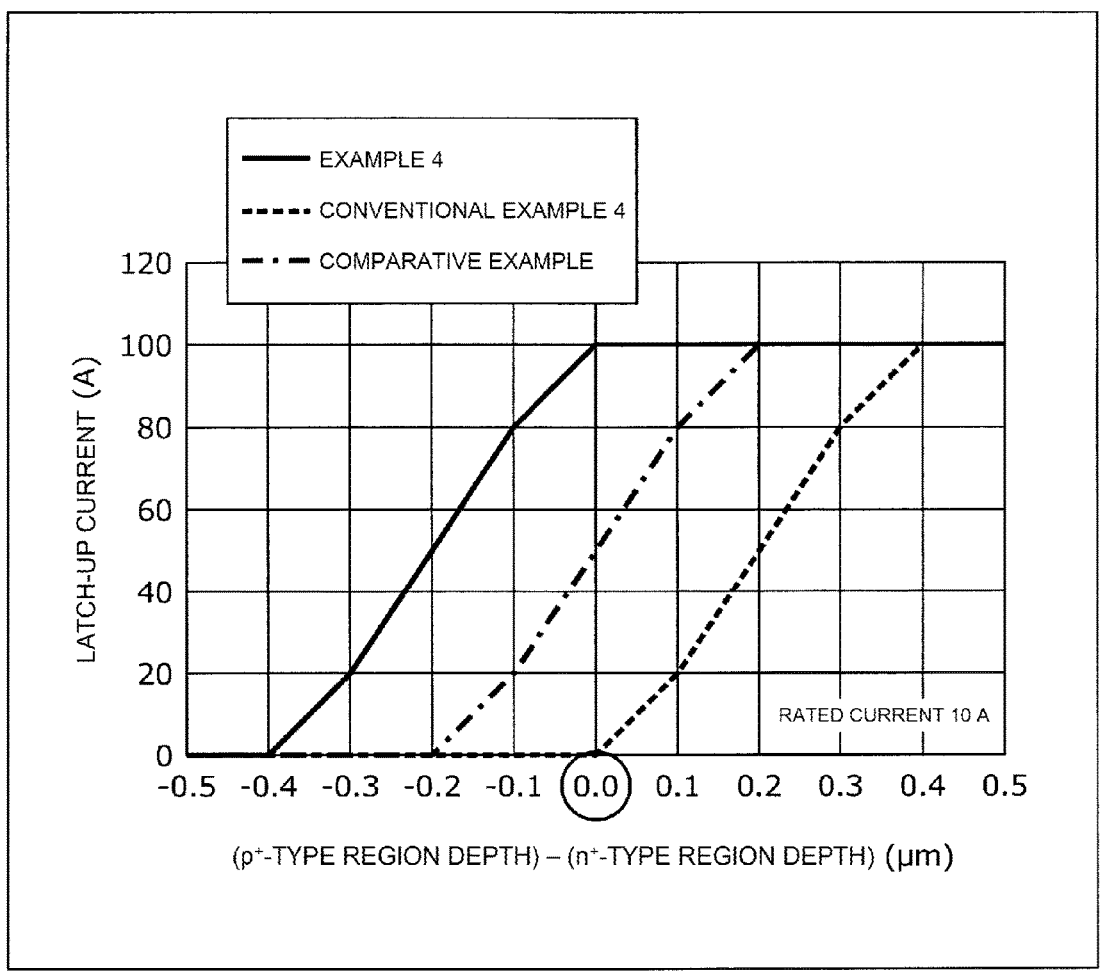
FIG. 35 is a characteristic diagram illustrating the relationship between a difference in depth between the $p^+$-type region and $n^+$-type region and a latch-up current in the semiconductor device according to Embodiment 4.

The relationship between the difference between the depth of the p$^+$-type contact region 43 from the substrate front surface (referred to hereinbelow as "p$^+$-type region depth") and the depth of the deepest portion of the n$^+$-type emitter region 44 from the substrate front surface (referred to hereinbelow as "n$^+$-type region depth") (=(p$^+$-type region depth)−(n$^+$-type region depth)) and a latch-up current will be explained hereinbelow. The latch-up current, as referred to herein, is a current value at which the latch-up occurs. FIG. 35 is a characteristic diagram illustrating the relationship between the difference between the p$^+$-type region depth and the n$^+$-type region depth and the latch-up current of the semiconductor device according to Example 4. FIG. 34 is a perspective view illustrating the structure of a semiconductor device of a comparative example. With respect to the semiconductor device according to the above-described Embodiment 10, the latch-up current was verified (referred to hereinbelow as Example 4) with respect to the case in which the difference between the p$^+$-type region depth and the n$^+$-type region depth was changed variously within a range from −0.5 μm to 0.5 μm. The results are depicted in FIG. 35.

For comparison, FIG. 35 also shows the latch-up current with respect to the case in which the difference between the p$^+$-type region depth and the n$^+$-type region depth was changed variously, under the same conditions as in Example 4, with respect to Conventional Example 4 and comparative example (FIG. 34). The Conventional Example 4 has the configuration of Conventional Example 1 (see FIG. 24) in which the p$^+$-type contact region is provided to extend linearly in the longitudinal direction of the trenches 105 between the n$^+$-type emitter regions 104 which are adjacent in the short-side direction of the trenches 105 in the same mesa region. In the structure of the comparative example, the threshold voltage Vth does not increase even when the trench pitch is reduced. More specifically, the comparative example differs from Example 4 in that a p$^+$-type contact region 53 is not provided directly below an n$^+$-type emitter region 54. In the comparative example, the p$^+$-type contact region 53 extending linearly in the longitudinal direction of the trenches 5 is separated into a plurality of regions by the n$^+$-type emitter regions 54 arranged at a predetermined interval in the longitudinal direction of the trenches 5. Thus, the p$^+$-type contact regions 53 are provided between the n$^+$-type emitter regions 54 adjacent in the longitudinal direction of the trenches 5. The reference numeral 48 stands for contact holes.

The results depicted in FIG. 35 have confirmed that in Conventional Example 4, when the difference between the p$^+$-type region depth and the n$^+$-type region depth was made 0.4 μm or less, the latch-up current decreased from the tenfold value of the rated current with the shift of the difference between the p$^+$-type region depth and the n$^+$-type region depth in the minus direction. The inventor has confirmed that this is because the width of the n$^+$-type emitter region 104 in the longitudinal direction (depthwise direction) of the trenches 105 is four times the width of the n$^+$-type emitter region of Example 4, or larger. In the comparative example, it was confirmed that when the difference between the p$^+$-type region depth and the n$^+$-type region depth was made 0.2 μm or less, the latch-up current decreased from the tenfold value of the rated current with the shift of the difference between the p$^+$-type region depth and the n$^+$-type region depth in the minus direction. This is because since the p$^+$-type contact region 53 is not provided directly below the n$^+$-type emitter region 54, the passage distance of the holes inside the high-resistance p-type base region 3, through which the holes injected from the collector side pass when flowing in the p$^+$-type contact region 53, is longer than that in Example 4 and the ON resistance component is large.

Meanwhile, in Example 4, it has been confirmed that the latch-up current can be made ten times the rated current (=10 A) or larger (that is, 100 A or larger) by making the difference between the p$^+$-type region depth and the n$^+$-type region depth about 0.0 μm (inclusive) to 0.5 μm (inclusive). Further, in Example 4, it has been confirmed that when the difference between the p$^+$-type region depth and the n$^+$-type region depth is less than about 0.4 μm, the latch-up current can be increased over that in Conventional Example 4 and comparative example with the equal difference between the p$^+$-type region depth and the n$^+$-type region depth. Thus, in Example 4, it has been confirmed that the degree of resistance to latch-up can be increased over that in Conventional Example 4 and comparative example. Further, it is well known that where the n$^+$-type region depth is increased over the p$^+$-type region depth (p$^+$-type region depth<n$^+$-type region depth), an npn transistor constituted by the n$^+$-type emitter region, p-type base region, and n$^-$-type drift layer is conductive and latch-up is facilitated. Therefore, by setting the difference between the p$^+$-type region depth and the n$^+$-type region to 0.0 μm or more, it is possible to suppress the decrease in breakdown resistance caused by the latch-up.

Example 5

Figure 36:
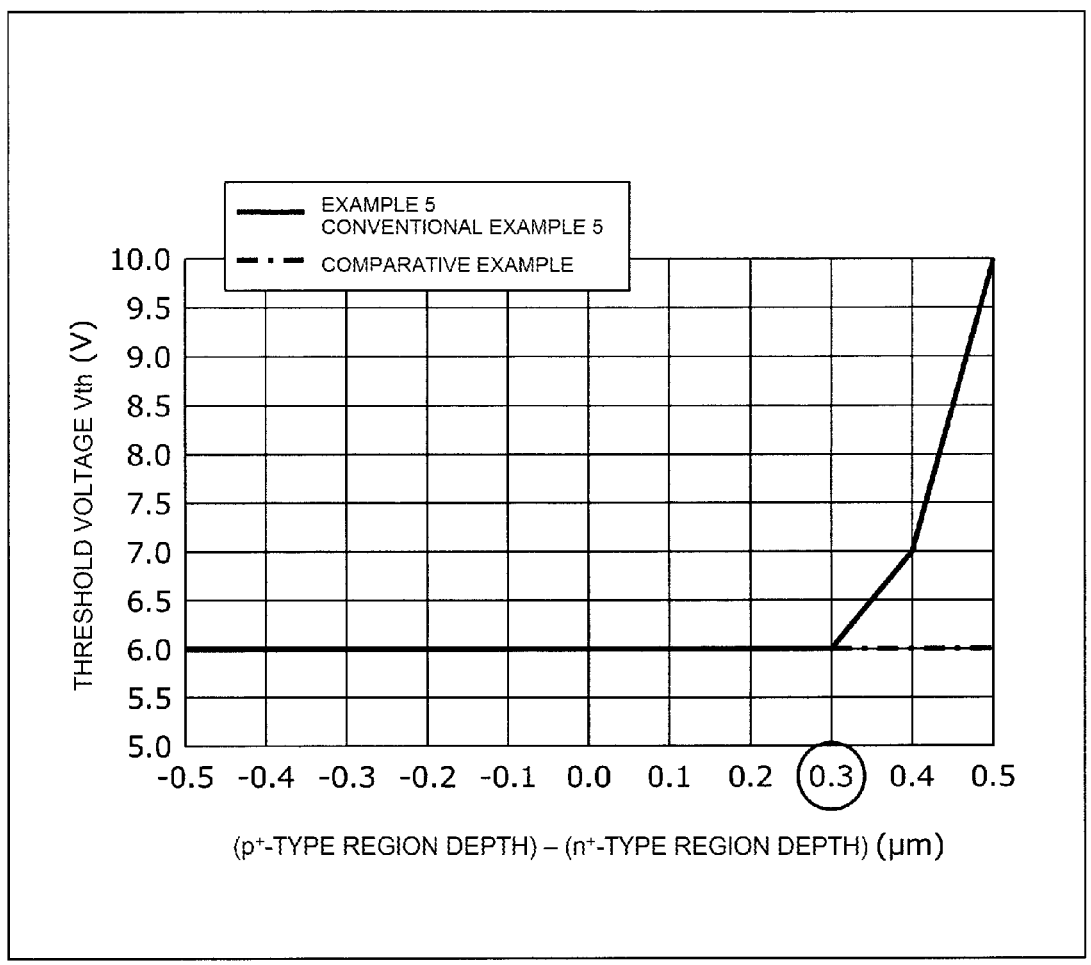
FIG. 36 is a characteristic diagram illustrating the relationship between a difference in depth between the $p^+$-type region and $n^+$-type region and a threshold voltage in the semiconductor device according to Embodiment 5.

The relationship between the difference between the p$^+$-type region depth and the n$^+$-type region depth and the threshold voltage Vth is explained hereinbelow. FIG. 36 is a characteristic diagram illustrating the relationship between the difference between the p$^+$-type region depth and the n$^+$-type region depth and the threshold voltage of the semiconductor device according to Example 5. With respect to the semiconductor device according to Embodiment 10, the threshold voltage Vth was verified (referred to hereinbelow as Example 5) with respect to the case in which the difference between the p$^+$-type region depth and the n$^+$-type region depth was changed variously within a range from −0.5 µm (inclusive) to 0.5 µm (inclusive). The results are depicted in FIG. 36. For comparison, FIG. 36 also shows the threshold voltage Vth with respect to the case in which the difference between the p$^+$-type region depth and the n$^+$-type region depth was changed variously, under the same conditions as in Example 4, with respect to Conventional Example 5 and the comparative example. The features of Conventional Example 5 are the same as those of Conventional Example 4.

The results depicted in FIG. 36 have confirmed that in Example 5, when the difference between the p$^+$-type region depth and the n$^+$-type region depth was made 0.3 µm or less, the threshold voltage Vth did not fluctuate. This is because by making the difference between the p$^+$-type region depth and the n$^+$-type region depth equal to 0.3 µm or less, it is possible to suppress the penetration of the p$^+$-type contact region 43 into the channel even when the trench pitch is reduced. Therefore, the increase in impurity concentration in the channel can be suppressed, and fluctuations of the threshold voltage Vth can be also suppressed. In Conventional Example 5, the difference between the p$^+$-type region depth and the n$^+$-type region depth is the same as in Example 5. Therefore, the relationship between the difference between the p$^+$-type region depth and the n$^+$-type region depth and the threshold voltage Vth is the same as in Example 5.

In the comparative example, it is clear that the threshold voltage Vth does not fluctuate regardless of the changes in the difference between the p$^+$-type region depth and the n$^+$-type region depth. This is because in the comparative example, the p$^+$-type contact region 53 is not provided directly below the n$^+$-type emitter region 54, that is, close to the channel, and therefore the p$^+$-type contact region 53 practically does not penetrate into the channel and the threshold voltage Vth does not rise despite the narrowed trench pitch. Therefore, the results depicted in FIGS. 35 and 36 indicate that even when the p$^+$-type contact region 43 is arranged directly below the n$^+$-type emitter region 44, as in Examples 4 and 5, by setting the difference between the p$^+$-type region depth and the n$^+$-type region depth to the abovementioned conditions, it is possible to obtain a latch-up resistance amount higher than that in the comparative example and also obtain a threshold voltage Vth characteristic the same as in the comparative example.

Example 6

Figure 37:
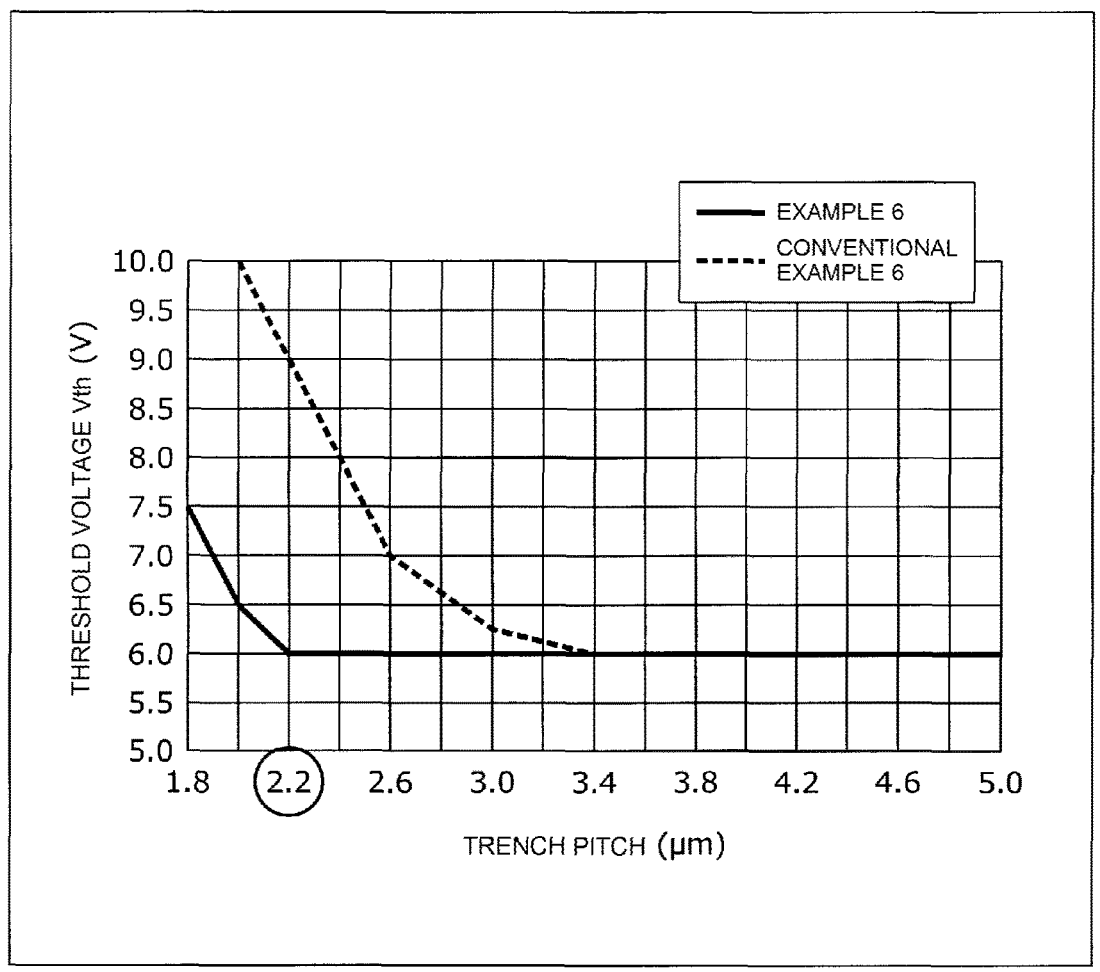
FIG. 37 is a characteristic diagram illustrating the relationship between a strength spacing and a threshold voltage Vth in the semiconductor device according to Embodiment 6.

The relationship between the trench pitch and the threshold voltage Vth is explained hereinbelow. FIG. 37 is a characteristic diagram illustrating the relationship between the trench pitch and the threshold voltage Vth of the semiconductor device according to Example 6. With respect to the semiconductor device according to Embodiment 10, the threshold voltage Vth was verified (referred to hereinbelow as Example 6) with respect to the case in which the trench pitch was changed variously within a range from 1.8 µm (inclusive) to 5.0 µm (inclusive). The results are depicted in FIG. 37. For comparison, FIG. 37 also shows the threshold voltage Vth obtained when the trench pitch was changed variously under the same conditions as in Example 4 with respect to Conventional Example 6. In Example 6 and Conventional Example 6, the difference between the p$^+$-type region depth and the n$^+$-type region depth was 0.3 µm. The features of Conventional Example 6, other than the difference between the p$^+$-type region depth and the n$^+$-type region depth, are the same as in Conventional Example 4.

The results depicted in FIG. 37 have confirmed that in Example 6, when the trench pitch was made less than 2.2 µm, the threshold voltage Vth increased, and when the trench pitch was 2.2 µm or more, the threshold voltage Vth did not fluctuate. Thus, it is clear that even in the case of a structure in which the difference between the p$^+$-type region depth and the n$^+$-type region depth is made 0.3 µm or less to suppress the penetration of the p$^+$-type contact region 43 into the channel (Example 5, see FIG. 36), when the trench pitch is less than 2.2 µm, the penetration of the p$^+$-type contact region 43 into the channel occurs and the impurity concentration in the channel increases. Therefore, it is preferred that the trench pitch be 2.2 µm or more.

Meanwhile, in Conventional Example 6, it has been confirmed that the threshold voltage Vth fluctuates when the trench pitch is 3.4 µm or less. Thus, in order to prevent the threshold voltage Vth from fluctuating, the trench pitch needs to be greater than 3.4 µm, and the trench pitch cannot be made narrower than in Example 6. This is because the reason why the threshold voltage Vth rises in Conventional Example 6 is different from that why the threshold voltage Vth rises in Example 6. In Conventional Example 6, the p$^+$-type contact region is provided in the central portion of the mesa region in the portion where the n$^+$-type emitter region 104 is provided to form an emitter structure. Therefore, the thickness of the p$^+$-type contact region in Conventional Example 6 is equal to or greater than 0.3 µm (equal to or greater than the difference between the p$^+$-type region depth and n$^+$-type region depth) and is larger than the thickness of the p$^+$-type contact region 43 in Example 6.

By contrast in Example 6, since the p$^+$-type contact region 43 is provided directly below the n$^+$-type emitter region 44, the thickness of the p$^+$-type contact region 43 is 0.3 µm (equal to the difference between the p$^+$-type region depth and n$^+$-type region depth). Therefore, in Conventional Example 6, the volume ratio of the p$^+$-type contact region to the portion forming the emitter structure is larger than the same volume ratio in Example 6, and the penetration of the p$^+$-type contact region into the channel occurs easier than in Example 6. Accordingly, it is clear that the trench pitch can be further narrowed by providing the p$^+$-type contact region 43 directly below the n$^+$-type emitter region 44, as in the present invention.

The present invention is not limited to the above-described embodiments and can be variously changed without departing from the essence of the present invention. For example, in Embodiments 5 to 9, an example is explained in which a proton-doped buffer layer is provided that has impurity concentration peaks of a plurality of stages obtained by multistage implantation of protons. However, it is also possible to provide a proton-doped buffer layer constituted by a single buffer layer having a single impurity concentration peak obtained on one-stage proton implantation. Further, in the embodiments, the first conductivity type is the n type and the second conductivity type is the p type, but the present invention is likewise valid when the first conductivity type is the p type and the second conductivity type is the n type.

As described hereinabove, the semiconductor device and the method for manufacturing a semiconductor device in accordance of the present invention are suitable for semiconductor devices with a rated voltage of 600 V or less which are used at vehicles.

What is claimed is:

1. A semiconductor device, comprising:
   a semiconductor substrate including a first semiconductor layer of a first conductivity type;

a plurality of trenches separated respectively by a plurality of mesa regions provided in a stripe shape extending in a direction parallel to one surface of the first semiconductor layer, the plurality of trenches being provided to a predetermined depth in a depth direction from the one surface of the first semiconductor layer;

first semiconductor regions of a second conductivity type that are provided over an entire surface layer on the one surface of the first semiconductor layer to a depth which is less than that of the plurality of trenches, in respective mesa regions of the plurality of mesa regions separated by respective trenches of the plurality of trenches in the surface layer on the one surface of the first semiconductor layer;

second semiconductor regions of the first conductivity type that are selectively provided inside the first semiconductor regions;

third semiconductor regions of the second conductivity type, provided linearly in a first direction in which the plurality of trenches extend in a stripe shape;

a first electrode provided inside each trench of the plurality of trenches, with a gate insulating film interposed respectively there between;

a second semiconductor layer of the first conductivity type that is provided on a surface layer on another surface of the first semiconductor layer and that has an impurity concentration which is higher than that of the first semiconductor layer;

a third semiconductor layer of the second conductivity type that is provided in contact with the second semiconductor layer at a position which is shallower than that of the second semiconductor layer in the surface layer on the other surface of the first semiconductor layer;

a second electrode that is in contact with the first semiconductor regions and the second semiconductor regions; and a third electrode that is in contact with the third semiconductor layer, wherein the second semiconductor layer has a thickness that is larger than that of a portion of the first semiconductor layer that is enclosed by each of the first semiconductor regions and the second semiconductor layer, and wherein
 the second semiconductor regions are provided between adjacent trenches at a predetermined interval in the first direction and have recessed portions facing the third semiconductor regions on a side of the third electrode, and
 the third semiconductor regions have a striped shape extending in the first direction and are at least partly within the recessed portions, and have a depth greater than a depth of the second semiconductor regions on sides of the recessed portions.

2. The semiconductor device according to claim 1, wherein portions of the first semiconductor regions that are enclosed between the second semiconductor regions adjacent respectively thereto in the first direction are covered with an insulating layer that covers the one surface of the first semiconductor layer.

3. The semiconductor device according to claim 1, wherein the third semiconductor regions of the second conductivity type are selectively provided inside the first semiconductors regions and have an impurity concentration which is higher than that of the first semiconductor regions.

4. The semiconductor device according to claim 1, wherein the first semiconductor region has a thickness (a), a portion of the first semiconductor layer which is enclosed by the first semiconductor region and the second semiconductor layer has a thickness (b), the second semiconductor layer has a thickness (c), and the third semiconductor layer has a thickness (d), and wherein a sum total of thicknesses (a)+(b)+(c)+(d) is 35 µm to 60 µm inclusive.

5. The semiconductor device according to claim 1, wherein the second semiconductor layer has a thickness ranging from 15 µm to 30 µm inclusive.

6. The semiconductor device according to claim 1, wherein the third semiconductor regions of the second conductivity type have an impurity concentration higher than that of the first semiconductor regions.

7. The semiconductor device according to claim 6, wherein the third semiconductor regions has a depth of 0.5 µm or more.

8. The semiconductor device according to claim 6, wherein the third semiconductor regions have a depth that is greater than that of the second semiconductor regions, and the depth of the third semiconductor regions and the depth of the second semiconductor regions have a difference ranging from 0.0 µm to 0.3 µm inclusive.

9. The semiconductor device according to claim 1, wherein sides of the second semiconductor regions are connected by connecting portions, and upper surfaces of the third semiconductor regions at least partly within the recessed portions are in contact with the connecting portions.

10. The semiconductor device according to claim 1, wherein lower surfaces of the recessed portions of the second semiconductor regions contact the third semiconductor regions at a substantially central portion, in a cross-sectional view, of each of the third semiconductor regions.

11. The semiconductor device according to claim 1, wherein each recessed portion of the recessed portions is formed by side portions and a center portion of a second semiconductor region of the second semiconductor regions, the center portion extending across an uppermost surface of a corresponding third semiconductor region of the third semiconductor regions, and each of the side portions having a depth greater than a depth of the center portion.

12. A semiconductor device, comprising:
 a semiconductor substrate including a first semiconductor layer of a first conductivity type;
 a plurality of trenches separated respectively by a plurality of mesas provided in a stripe shape extending in a direction parallel to one surface of the first semiconductor layer, the plurality of trenches provided to a predetermined depth in a depth direction from the one surface of the first semiconductor layer;
 first semiconductor regions of a second conductivity type provided over an entire surface layer on the one surface of the first semiconductor layer to a depth which is less than that of the trenches, in the plurality of mesa regions separated by respective trenches of the plurality of trenches in the surface layer on the one surface of the first semiconductor layer;
 second semiconductor regions of the first conductivity type selectively provided inside the first semiconductor regions;
 a first electrode provided inside each trench of the plurality of trenches, with a gate insulating film interposed there between;
 a second semiconductor layer of the first conductivity type provided on a surface layer on another surface of the first semiconductor layer and having an impurity concentration which is higher than that of the first semiconductor layer;

a third semiconductor layer of the second conductivity type provided in contact with the second semiconductor layer at a position which is shallower than that of the second semiconductor layer in the surface layer on the other surface of the first semiconductor layer;

a second electrode in contact with the first semiconductor regions and the second semiconductor regions; and a third electrode that is in contact with the third semiconductor layer, wherein the second semiconductor layer has:
- a first first-conductivity-type semiconductor layer disposed at a position apart from the third semiconductor layer that has an impurity concentration which is lower than that of the third semiconductor layer; and
- a second first-conductivity-type semiconductor layer disposed between the third semiconductor layer and the first first-conductivity-type semiconductor layer and having an impurity concentration which is lower than that of the third semiconductor layer and which higher than that of the first first-conductivity-type semiconductor layer, wherein
  the first first-conductivity-type semiconductor layer includes a plurality of stages greater than two, formed at respective different depths with respect to the third electrode, and
  between any two of the plurality of stages, the one closer to the second first-conductivity-type semiconductor layer has a peak impurity concentration that is higher than that of the other, and has a thickness that is no smaller than that of the other.

13. The semiconductor device according to claim 12, wherein the first first-conductivity-type semiconductor layer is doped with protons.

14. The semiconductor device according to claim 12, wherein the third semiconductor layer and the third electrode have an interface, and wherein the first first-conductivity-type semiconductor layer is disposed so as to include a region at a depth of at least 2.0 µm to 8.0 µm inclusive from the interface between the third semiconductor layer and the third electrode.

15. The semiconductor device according to claim 12, wherein the second first-conductivity-type semiconductor layer is doped with phosphorus.

16. The semiconductor device according to claim 12, wherein the third semiconductor layer and the third electrode have an interface, and wherein the second first-conductivity-type semiconductor layer is disposed within a depth range of 0.5 µm to 3.0 µm inclusive from the interface between the third semiconductor layer and the third electrode.

17. The semiconductor device according to claim 12, wherein the first semiconductor region has a thickness (a), a portion of the first semiconductor layer which is enclosed by the first semiconductor region and the second semiconductor layer has a thickness (b), the second semiconductor layer has a thickness (c), and the third semiconductor layer has a thickness (d), and wherein a sum total of thicknesses (a)+(b)+(c)+(d) is 60 µm or less.

18. The semiconductor device according to claim 12, wherein each of the plurality of stages is in contact with another of the plurality of stages.

* * * * *